US010979021B2

(12) United States Patent
Pfann et al.

(10) Patent No.: US 10,979,021 B2
(45) Date of Patent: Apr. 13, 2021

(54) SYSTEM AND METHOD FOR A RADIO FREQUENCY FILTER

(71) Applicant: Infineon Technologies AG, Neubiberg (DE)

(72) Inventors: Peter Pfann, Munich (DE); Stefan Helmut Schmalzl, Sauerlach (DE); Ruediger Bauder, Feldkirchen-Westerham (DE); Hans-Joerg Timme, Ottobrunn (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/210,582

(22) Filed: Dec. 5, 2018

(65) Prior Publication Data
US 2019/0181907 A1   Jun. 13, 2019

Related U.S. Application Data

(60) Provisional application No. 62/595,898, filed on Dec. 7, 2017, provisional application No. 62/641,664, filed on Mar. 12, 2018.

(30) Foreign Application Priority Data

Dec. 5, 2018   (EP) .................................... 18210409

(51) Int. Cl.
*H03H 9/54*   (2006.01)
*H03H 7/01*   (2006.01)
(Continued)

(52) U.S. Cl.
CPC .............. *H03H 9/547* (2013.01); *H03F 3/19* (2013.01); *H03F 3/21* (2013.01); *H03H 3/02* (2013.01);
(Continued)

(58) Field of Classification Search
CPC ..................................................... H03H 9/547
See application file for complete search history.

(56) References Cited

U.S. PATENT DOCUMENTS 2,271,870 A   2/1942   Mason
4,013,982 A   3/1977   Wood et al.
(Continued)

FOREIGN PATENT DOCUMENTS

EP   1381163 A1   1/2004
FR   2235532 A1   1/1975
(Continued)

OTHER PUBLICATIONS

Bauer, Thomas et al., "Saw Band Rejection Filters for Mobile Digital Television," IEEE International Ultrasonics Symposium Proceedings, Nov. 2-5, 2008, pp. 288-291. DOI: 10.1109/ULTSYM. 2008.0071.
(Continued)

*Primary Examiner* — Kevin M Cunningham
(74) *Attorney, Agent, or Firm* — Slater Matsil, LLP

(57) ABSTRACT

In accordance with an embodiment, a method of operating an RF system includes generating a first RF signal having a first frequency; filtering the generated first RF signal to form a first filtered transmitted signal; producing a first coupled signal and a first transmitted signal from the first filtered transmitted signal; transmitting the first transmitted signal; transmitting a second RF signal having a second frequency; bandpass filtering the first coupled signal to form a first tunable bandpass filtered signal; and measuring a parameter of the first tunable bandpass filtered signal.

22 Claims, 47 Drawing Sheets

(51) Int. Cl.
| | |
|---|---|
| *H03H 9/64* | (2006.01) |
| *H03H 9/52* | (2006.01) |
| *H03H 9/05* | (2006.01) |
| *H03H 9/60* | (2006.01) |
| *H03H 9/58* | (2006.01) |
| *H04B 1/00* | (2006.01) |
| *H03H 3/02* | (2006.01) |
| *H03H 11/12* | (2006.01) |
| *H04B 1/10* | (2006.01) |
| *H04B 1/40* | (2015.01) |
| *H03H 9/02* | (2006.01) |
| *H03H 9/17* | (2006.01) |
| *H03H 9/48* | (2006.01) |
| *H03H 9/00* | (2006.01) |
| *H03H 9/66* | (2006.01) |
| *H04B 1/04* | (2006.01) |
| *H04B 1/50* | (2006.01) |
| *H03H 7/12* | (2006.01) |
| *H03H 7/46* | (2006.01) |
| *H04B 1/525* | (2015.01) |
| *H03F 3/19* | (2006.01) |
| *H03F 3/21* | (2006.01) |
| *H03H 9/70* | (2006.01) |
| *H04B 1/18* | (2006.01) |
| *H03J 3/20* | (2006.01) |
| *H03H 9/205* | (2006.01) |
| *H01L 41/187* | (2006.01) |
| *H03J 1/00* | (2006.01) |

(52) U.S. Cl.
CPC ........ *H03H 7/0115* (2013.01); *H03H 7/0153* (2013.01); *H03H 7/0161* (2013.01); *H03H 7/12* (2013.01); *H03H 7/1741* (2013.01); *H03H 7/463* (2013.01); *H03H 9/0004* (2013.01); *H03H 9/02007* (2013.01); *H03H 9/02015* (2013.01); *H03H 9/02031* (2013.01); *H03H 9/0547* (2013.01); *H03H 9/175* (2013.01); *H03H 9/205* (2013.01); *H03H 9/48* (2013.01); *H03H 9/52* (2013.01); *H03H 9/54* (2013.01); *H03H 9/542* (2013.01); *H03H 9/584* (2013.01); *H03H 9/585* (2013.01); *H03H 9/60* (2013.01); *H03H 9/6479* (2013.01); *H03H 9/66* (2013.01); *H03H 9/70* (2013.01); *H03H 11/1291* (2013.01); *H03J 3/20* (2013.01); *H04B 1/006* (2013.01); *H04B 1/0057* (2013.01); *H04B 1/0475* (2013.01); *H04B 1/10* (2013.01); *H04B 1/1036* (2013.01); *H04B 1/18* (2013.01); *H04B 1/40* (2013.01); *H04B 1/50* (2013.01); *H04B 1/525* (2013.01); *H01L 41/187* (2013.01); *H03F 2200/222* (2013.01); *H03F 2200/294* (2013.01); *H03F 2200/451* (2013.01); *H03F 2203/21157* (2013.01); *H03H 9/587* (2013.01); *H03H 9/588* (2013.01); *H03H 9/589* (2013.01); *H03H 9/605* (2013.01); *H03H 2007/013* (2013.01); *H03H 2009/02204* (2013.01); *H03H 2210/025* (2013.01); *H03H 2210/026* (2013.01); *H03J 1/0008* (2013.01)

(56) References Cited

U.S. PATENT DOCUMENTS

| | | | |
|---|---|---|---|
| 5,128,625 A | 7/1992 | Yatsuzuka et al. | |
| 5,729,829 A | 3/1998 | Talwar et al. | |
| 5,774,193 A * | 6/1998 | Vaughan | H04N 11/30 348/723 |
| 5,864,261 A | 1/1999 | Weber et al. | |
| 6,072,996 A | 6/2000 | Smith | |
| 6,472,959 B1 | 10/2002 | Beaudin et al. | |
| 7,535,324 B2 | 5/2009 | Fattinger et al. | |
| 7,825,745 B1 | 11/2010 | Gavin et al. | |
| 8,018,303 B2 | 9/2011 | Handtmann et al. | |
| 8,682,260 B1 | 3/2014 | Granger-Jones et al. | |
| 8,841,819 B2 | 9/2014 | Nishihara et al. | |
| 9,461,618 B2 | 10/2016 | Pang et al. | |
| 9,787,334 B2 | 10/2017 | Obiya et al. | |
| 2001/0017504 A1 | 8/2001 | Aigner et al. | |
| 2002/0163404 A1* | 11/2002 | Sonoda | H01P 1/203 18 333/202 |
| 2002/0164961 A1* | 11/2002 | Atkinson | H03D 7/166 455/86 |
| 2002/0183016 A1* | 12/2002 | Kemmochi | H01P 1/15 455/83 |
| 2003/0127946 A1 | 7/2003 | Yamada et al. | |
| 2004/0012570 A1 | 1/2004 | Cross et al. | |
| 2004/0051601 A1 | 3/2004 | Frank | |
| 2004/0127178 A1 | 7/2004 | Kuffner | |
| 2004/0204814 A1* | 10/2004 | Honda | G01L 23/225 701/111 |
| 2005/0012570 A1 | 1/2005 | Korden et al. | |
| 2005/0069065 A1* | 3/2005 | Oh | H04B 17/309 375/350 |
| 2005/0099244 A1 | 5/2005 | Nakamura et al. | |
| 2005/0148312 A1* | 7/2005 | Toncich | H03H 7/1791 455/339 |
| 2005/0245213 A1 | 11/2005 | Hirano et al. | |
| 2006/0176126 A1 | 8/2006 | Wang et al. | |
| 2006/0229030 A1 | 10/2006 | Simon et al. | |
| 2007/0024395 A1 | 2/2007 | Takako | |
| 2007/0176710 A1 | 8/2007 | Jamneala et al. | |
| 2008/0028585 A1 | 2/2008 | Barber et al. | |
| 2008/0048802 A1 | 2/2008 | Aigner et al. | |
| 2008/0129428 A1 | 6/2008 | Yamamoto | |
| 2008/0152049 A1 | 6/2008 | Sandner et al. | |
| 2008/0169884 A1 | 7/2008 | Matsumoto et al. | |
| 2009/0128260 A1 | 5/2009 | Block et al. | |
| 2009/0265903 A1 | 10/2009 | Handtmann et al. | |
| 2009/0273416 A1 | 11/2009 | Nakatsuka et al. | |
| 2010/0118921 A1 | 5/2010 | Abdelmonem et al. | |
| 2011/0277286 A1 | 11/2011 | Zhang | |
| 2012/0007696 A1 | 1/2012 | Pang et al. | |
| 2012/0086522 A1 | 4/2012 | Mao et al. | |
| 2012/0235877 A1 | 9/2012 | Beaudin et al. | |
| 2012/0286900 A1 | 11/2012 | Kadota et al. | |
| 2013/0077540 A1* | 3/2013 | Black | H04B 1/109 370/277 |
| 2013/0122831 A1 | 5/2013 | Desclos et al. | |
| 2013/0176912 A1 | 7/2013 | Khlat | |
| 2014/0003300 A1 | 1/2014 | Weissman et al. | |
| 2014/0038531 A1 | 2/2014 | Hayafuji et al. | |
| 2014/0145799 A1 | 5/2014 | Jian et al. | |
| 2014/0162712 A1 | 6/2014 | Feld et al. | |
| 2014/0313947 A1 | 10/2014 | Ali-Ahmad | |
| 2015/0163747 A1* | 6/2015 | Chen | H04B 1/109 455/78 |
| 2015/0171819 A1 | 6/2015 | Hasan et al. | |
| 2015/0214985 A1 | 7/2015 | Lee et al. | |
| 2015/0236748 A1 | 8/2015 | Nobbe | |
| 2016/0112072 A1 | 4/2016 | Bauder et al. | |
| 2016/0204763 A1 | 7/2016 | Tani | |
| 2016/0365841 A1 | 12/2016 | Dickerson | |
| 2017/0026031 A1 | 1/2017 | Levesque | |
| 2017/0054485 A1 | 2/2017 | Hwang et al. | |
| 2017/0264268 A1 | 9/2017 | Schmidhammer | |
| 2017/0301992 A1 | 10/2017 | Khlat et al. | |
| 2017/0310302 A1 | 10/2017 | Bauder et al. | |
| 2018/0062674 A1 | 3/2018 | Boghrat et al. | |

(56) References Cited

U.S. PATENT DOCUMENTS

| | | | |
|---|---|---|---|
| 2018/0205367 A1 | 7/2018 | Sovero et al. | |
| 2019/0372190 A1 | 12/2019 | Kord et al. | |

FOREIGN PATENT DOCUMENTS

| | | | |
|---|---|---|---|
| GB | 2431062 A | 4/2007 | |
| GB | 2457607 B | 11/2009 | |
| JP | S5252348 A | 4/1977 | |
| JP | H02199994 A | 8/1990 | |
| JP | 2009290365 A | 12/2009 | |
| WO | 9877000 A1 | 4/1998 | |
| WO | 0103314 A1 | 1/2001 | |
| WO | 2007149954 A1 | 12/2007 | |
| WO | 2015183548 A1 | 12/2015 | |
| WO | 2017204833 A1 | 11/2017 | |

OTHER PUBLICATIONS

Gopani, S., et al,. "SAW waveguide-coupled resonator notch filter," IEEE International Ultrasonic Symposium, Dec. 4-7, 1990, pp. 1-5. DOI: 10.1109/ULTSYM.1990.171317.

Handtmann, "Stacked Crystal Resonator: A Highly Linear BAW Device," IEEE International Ultrasonics Symposium, Sep. 20-23, 2009, pp. 889-892.

Hashimoto, Ken-ya et al., "Moving Tunable Filters Forward. A Heterointegration Research Project for Tunable Filters Combining MEMS and RF SAWVBAW Technologies," IEEE Microwave, vol. 16, Issue 7, Aug. 2015, pp. 89-97. DOI: 10.1109/MMM.2015.2431237.

Huang, Yulin et al., "Design Consideration of SAW/BAW Band Reject Filters Embedded in Impedance Converter," IEEE Transactions on Ultrasonics, Ferroelectrics, and Frequency Control, vol. 64, Issue 9, Sep. 2017, pp. 1368-1374. DOI: 10.1109/TUFFC.2017.2713395.

Mourot, Loic et al., "Stopband filters built in the BAW technology," Application Notes, IEEE Microwave, vol. 9, Issue 6, Oct. 2008, pp. 104-116. DOI: 10.1109/MMM.2008.927635.

Obiya, H., et al., "A New Tunable RF Front-End Circuit for Advanced 4G Handsets," IEEE MTT-S Int. Microwave Symp. Digest, Session WEP-54, Jun. 2014, 3 pages.

Ogami, T., et al., "A New Tunable Filter Using Love Wave Resonators for Reconfigurable RF," 2014 IEEE MTT-S Int. Microwave Symp. Digest, session TU3A-2, Jun. 2014, 3 pages.

Psychogiou, Dimitra et al., "High-Q Bandstop Filters Exploiting Acoustic-Wave-Lumped-Element Resonators (AWLRs)," IEEE Trans. Circuits Syst. II: Express Briefs, vol. 63, No. 1, Jan. 2016, pp. 79-83. DOI: 101109/TCSII.2015.2505078.

Rais-Zadeh, Mina et al., "Reconfigurable Radios: A Possible Solution to Reduce Entry Costs in Wireless Phones," Proc. IEEE, vol. 103, Issue 3, Mar. 2015, pp. 438-451. DOI: 10.1109/JPROC.2015.2396903.

Reinhardt, Alexandre et al., "Tunable composite piezoelectric resonators: a possible 'Holy Grail' of RF filters?," IEEE/MTT-S International Microwave Symposium, Jun. 17-22, 2012, 3 pages.

Ruby, Rich "A Snapshot in Time. The Future in Filters for Cell Phones," IEEE Microwave, vol. 16, Issue 7, Aug. 2015, pp. 46-59. DOI: 10.1109/MMM.1015.2429513.

Ruppel, Clemens "Acoustic Wave Filter Technology—A Review," IEEE Trans. Ultrason., Ferroelect., Freq. Contr, Apr. 4, 2017, pp. 1390-1400, DOI: 10.1109/TUFFC.2017.2690905.

Ud Din, Imad et al., "Two Tunable Frequency Duplexer Architectures for Cellular Transceivers," IEEE Transactions on Circuits and Systems I: Regular Papers, vol. 64, Issue 11, Nov. 2017, pp. 2988-2999.

Van Liempd, Barend et al., "A +70 dBm IIP3 Electrical-Balance Duplexer for Highly-Intergated Tubable Front-Ends," IEEE Transactions on Microwave Theory and Techniques, vol. 64, Issue 12, Dec. 2016, pp. 4274-4286.

Wada, T., et al., "A Miniaturized Broadband Lumped Element Circulator for Reconfigurable Front-end System," 2014 IEEE MTT-S Int. Microwave Symp. Digest, session WEP-28, Jun. 1-6, 2014, 3 pages.

Warder, Phil, "Golden Age for Filter Design. Innovative and Proven Approaches for Acoustic Filter, Duplexer, and Multiplexer Design," IEEE Microwave, vol. 16, Issue 7, Aug. 2015, pp. 60-72. DOI: 10.1109/MMM.2015.2431236.

Frederick, Amanda A., et al., "Frequency tuning of film bulk acoustic resonators," Proceedings of SPIE Smart Structures and Materials + Nondestructive Evaluation and Health Monitoring, San Diego, CA, US, Mar. 31, 2006, 10 pages.

Zhou, Chong et al., "Design of GSM/DCS Dual-Band Bulk Acoustic Wave Coupled Resonator Filter with Unified Input", IEEE Symposium on Piezoelectricity, Acoustic Waves and Device Applications (SPAWDA), Shenzhen, China, Dec. 9-11, 2011, 4 pages.

El Hassan, M., et al., "Techniques for Tuning BAW-SMR Resonators for the 4th Generation of Mobile Communications," INTECH Open Science Open Minds, Chapter 18, http://dx.doi.org/10.5772/55131, Aug. 28, 2013, 22 pages.

Garrison, J.L., et al., "Bell System Technical Journal," American Telephone and Telegraph Co., New York, U.S., vol. 53, No. 10, pages, Dec. 1974, pp. 2203-2248.

Lakin, K.M., "Thin Film Resonator Technology," IEEE International Frequency Control Symposium and PDA Exhibition Jointly with the 17th European Frequency and Time Forum, New York, May 4, 2003, pp. 765-778.

Carpentier, J.F., et al., "A Tunable Bandpass BAW-Filter Architecture and Its Application to WCDMA Filter", IEEE Radio Frequency Integrated Circuits Symposium, Jun. 15, 107, 2008, pp. 221-224.

Chen, Jay et al., "In-line process monitoring of advanced packaging process using focused beam ellipsometry", Chip Scale Review, May-Jun. 2015, pp. 34-38.

Lau, John H. "Evolution and Outlook of TSV and 3D IC/Si Integration", 12th IEEE Electronics Packaging Technology Conference, Dec. 8-10, 2010, pp. 560-570.

Nishihara, Tokihiro et al., "BAS/SAW/IPD hybrid type duplexer with Rx balanced output for WCDMA Band I", IEEE MTT-S International Microwave Symposium Digest, Jun. 15-20, 2008, pp. 831-834.

Siemens AG "Integrate IC Chips and Passives Components with TSV for SiP", Ip.com, Prior Art Database, Technical Disclosure, IP.Com No. IPCOM000174770D, Oct. 13, 2008, 2 pages.

Shirakawa, A. A., et al., "Bulk Acoustic Wave Coupled Resonator Filters Synthesis Methodology", IEEE European Microwave Conference, Oct. 4-6, 2005, 4 pages.

Shirakawa, Alexandre A., et al., "A Mixed Ladder-Lattice Bulk Acoustic Wave Duplexer for W-CDMA Handsets", IEEE International Conference on Electronics, Circuits and Systems, Dec. 11-14, 2007, 4 pages.

Sun, X., et al., "3D stack packaging solution for BAW devices—3D packaging demonstrator and RF performance", EPCOS AG, IEEE Proceedings of the European Solid-State Device Research Conference, Sep. 12-16, 2011, 4 pages.

Volatier, A., et al., "Design, elaboration and characterization of Coupled Resonator Filters for WCDMA applications", IEEE Ultrasonics Symposium, Oct. 2-6, 2006, 4 pages.

* cited by examiner

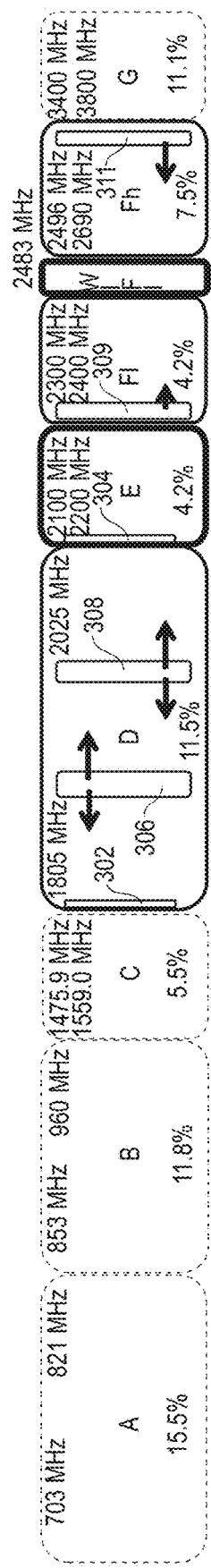
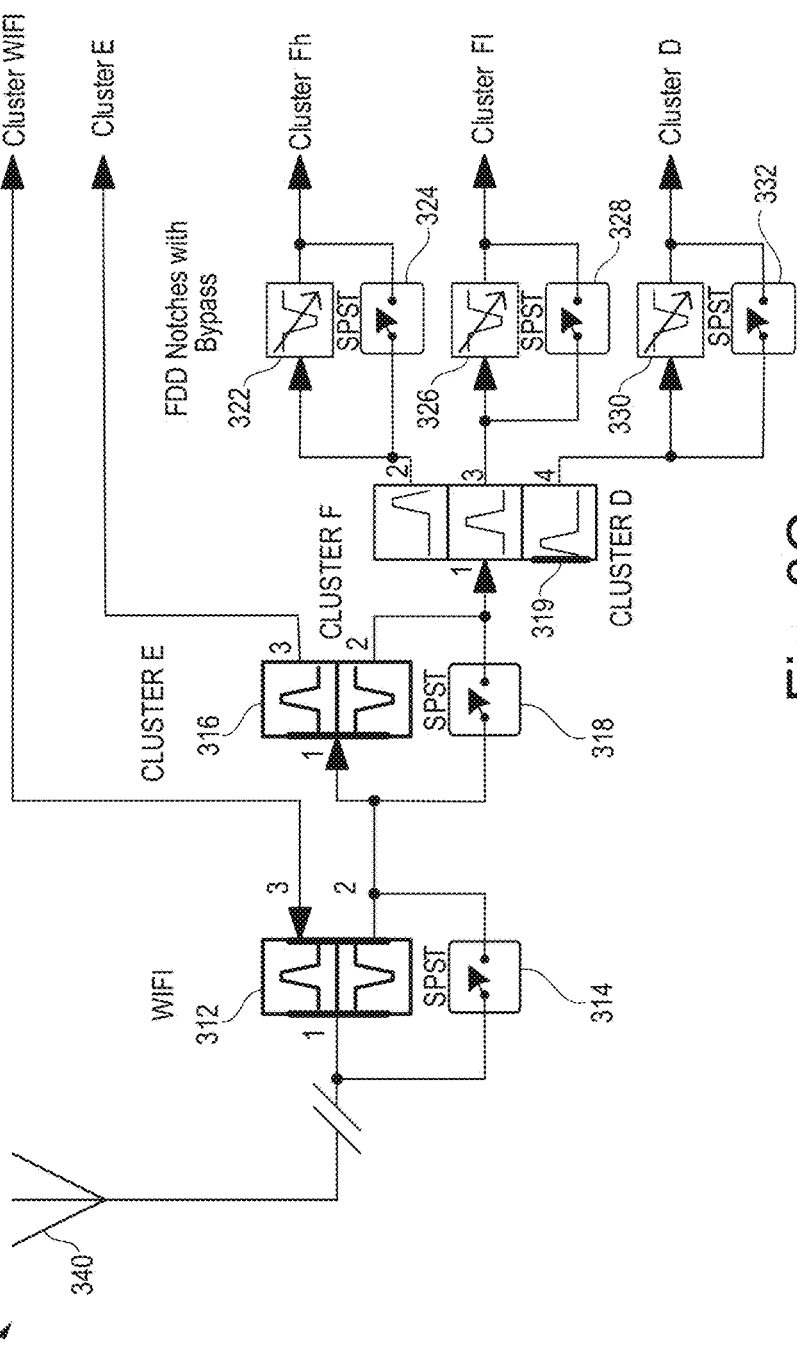
Fig. 3A
Fig. 3C

| Band | Type | UL | | DL | |
|---|---|---|---|---|---|
| 3 | FDD | 1710 | 1785 | 1805 | 1880 |
| 9 | FDD | 1749.9 | 1784.9 | 1844.9 | 1879.9 |
| 35 | TDD | 1850 | 1910 | 1850 | 1910 |
| 39 | TDD | 1880 | 1920 | 1880 | 1920 |
| 33 | TDD | 1900 | 1920 | 1900 | 1920 |
| 37 | TDD | 1910 | 1930 | 1910 | 1930 |
| 36 | TDD | 1930 | 1990 | 1930 | 1990 |
| 2 | FDD | 1850 | 1910 | 1930 | 1990 |
| 25 | FDD | 1850 | 1915 | 1930 | 1995 |
| 70 | FDD | 1695 | 1710 | 1995 | 2020 |
| 34 | TDD | 2010 | 2025 | 2010 | 2025 |
| 4 | FDD | 1710 | 1755 | 2110 | 2155 |
| 10 | FDD | 1710 | 1770 | 2110 | 2170 |
| 66 | FDD | 1710 | 1780 | 2110 | 2200 |
| 1 | FDD | 1920 | 1980 | 2110 | 2170 |
| 65 | FDD | 1920 | 2010 | 2110 | 2200 |
| 23 | FDD | 2000 | 2020 | 2180 | 2200 |
| 40 | TDD | 2300 | 2400 | 2300 | 2400 |
| 30 | FDD | 2305 | 2315 | 2350 | 2360 |
| WiFi | TDD | 2400 | 2483 | 2400 | 2483 |
| 41 | TDD | 2496 | 2690 | 2496 | 2690 |
| 38 | TDD | 2570 | 2620 | 2570 | 2620 |
| 69 | FDD | 2570 | 2620 | 2570 | 2620 |
| 7 | FDD | 2500 | 2570 | 2620 | 2690 |

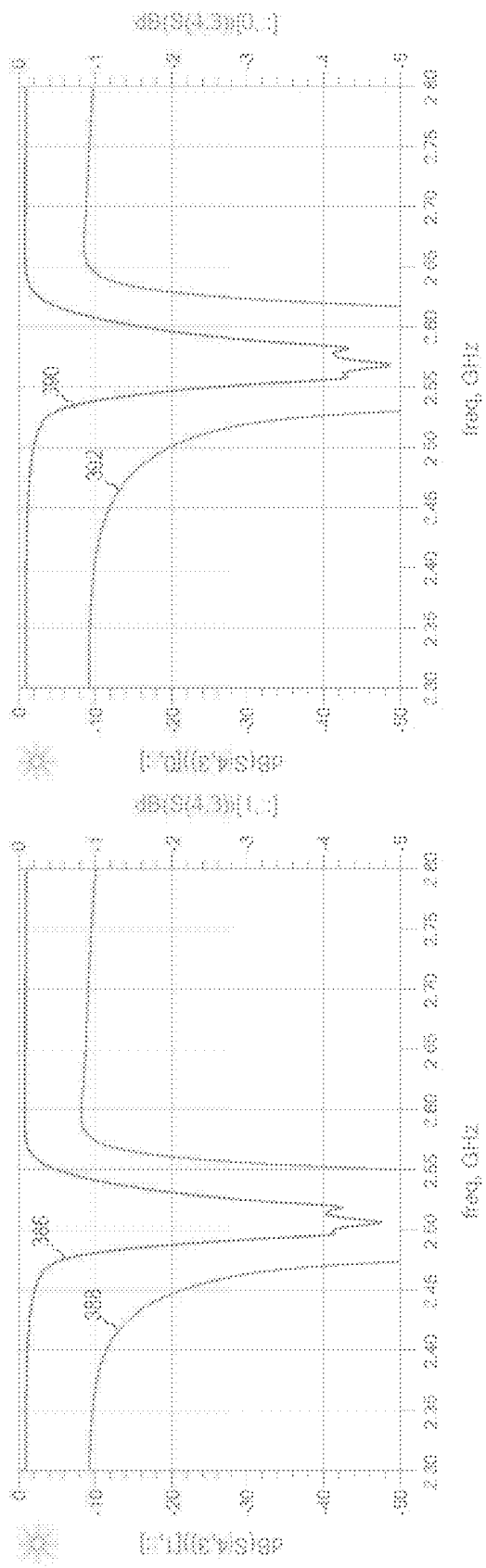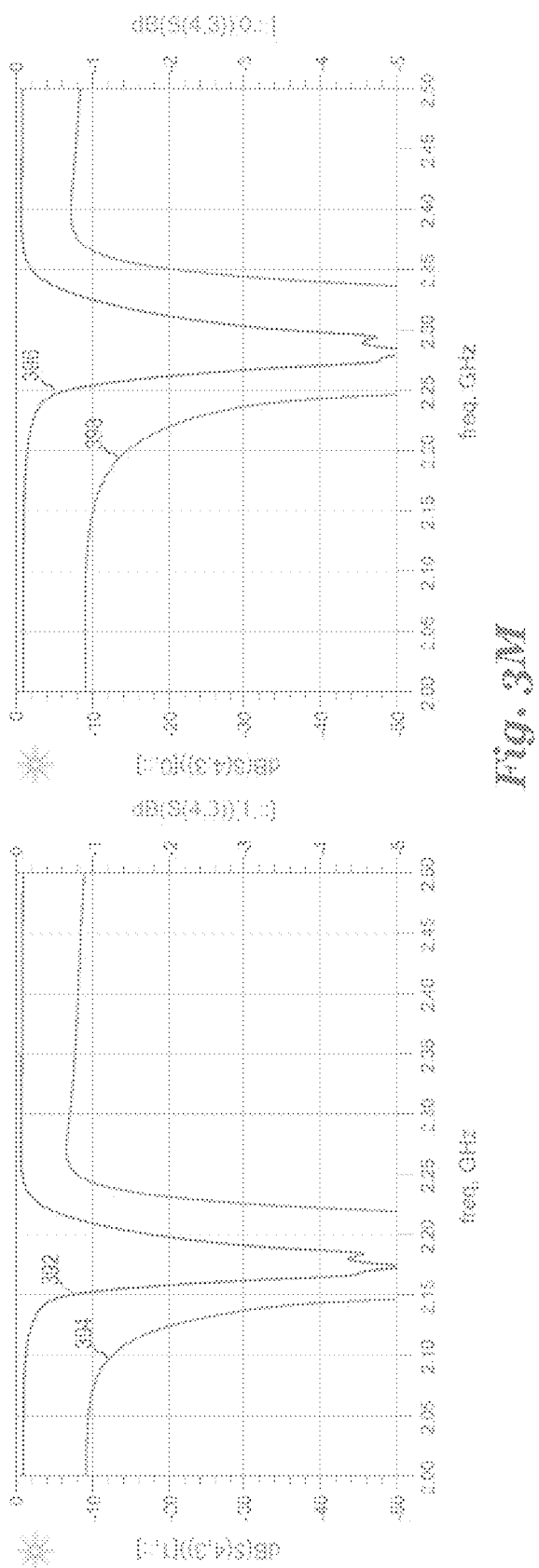
Fig. 3L
Fig. 3M 1.1 ....Bandstop Filter Fixed 1.2 ... Bandstop Filter Tuned 1.2.1 ... Bandstop Filter Tuned 1

2 ½ order variant of filter of Figure 10C

Slope control at high or low frequency edge

Slope control at high and low frequency edge

Bandpass Filter Fixed . Tuned zero

SYSTEM AND METHOD FOR A RADIO FREQUENCY FILTER

This application claims the benefit of U.S. Provisional Application No. 62/595,898, filed on Dec. 7, 2017, and the benefit of U.S. Provisional Application No. 62/641,664, filed on Mar. 12, 2018, and claims priority to European Application No. 18210409.1, filed Dec. 5, 2018 that also claims priority to U.S. Provisional Applications 62/595,898 and 62/641,664, which applications are hereby incorporated herein by reference in their entireties.

CROSS-REFERENCE TO RELATED APPLICATIONS

This application relates to the following co-pending and commonly assigned patent applications: U.S. patent application Ser. No. 16/210,610, filed on Dec. 5, 2018; U.S. patent application Ser. No. 16/210,703, filed on Dec. 5, 2018; U.S. patent application Ser. No. 16/210,732, filed on Dec. 5, 2018, U.S. patent application Ser. No. 16/210,555, filed on Dec. 5, 2018, U.S. patent application Ser. No. 16/210,756, filed on Dec. 5, 2018, U.S. patent application Ser. No. 16/210,788, filed on Dec. 5, 2018, U.S. patent application Ser. No. 16/210,812, filed on Dec. 5, 2018, U.S. patent application Ser. No. 16/210,637, filed on Dec. 5, 2018, U.S. patent application Ser. No. 16/210,670, filed on Dec. 5, 2018, which applications are incorporated herein by reference in their entireties.

TECHNICAL FIELD

The present invention relates generally to a system and method, and, in particular embodiments, to a system and method for a radio frequency filter.

BACKGROUND

In many RF Systems, such as portable wireless devices, more than one receive frequency or transmit frequency may be simultaneously active in a single radio device. When the respective frequency bands are far away from each other and/or when the frequency bands are processed with different gains, different frequency channels are separated in the frequency domain and processed in separate signal paths. Such frequency bands may include frequency bands devoted to different bands of a same telecommunication transmission standard, different bands devoted to different telecommunications standards (such as LTE and GSM), as well as multiple bands devoted to different service types (such as cellular communication, WiFi and GPS). Many systems today require flexible frequency planning and simultaneous processing of more than two channels, which makes a fixed frequency de-multiplexer filter design (with n frequency bands) challenging to design.

The growing complexity in RF front ends (e.g. due to the growing number of supported bands) results in higher insertion loss, reduced reference sensitivity and significantly increased area with respect to physically implementing the front end. For example, the implementation of an RF front end that operates over multiple frequency bands may include multiple fixed filters that are switched in and out of the RF signal path depending on the particular operation mode of the radio or on a particular carrier aggregation use case. In such systems, a greater number of switched filters are used to support a greater number of carrier aggregation use cases.

SUMMARY

In accordance with an embodiment, a method of operating an RF system includes generating a first RF signal having a first frequency using a first transmitter in a first RF signal path; filtering the generated first RF signal using an RF filter of a first selectable filter bank to form a first filtered transmitted signal; producing a first coupled signal and a first transmitted signal from the first filtered transmitted signal using a directional coupler; transmitting the first transmitted signal; transmitting a second RF signal having a second frequency using a second transmitter in a second RF signal path, where the second RF signal path is coupled to the first RF signal path, and the second frequency is different from the first frequency; bandpass filtering, using a first tunable bandpass filter, the first coupled signal to form a first tunable bandpass filtered signal; and measuring a parameter of the first tunable bandpass filtered signal.

In accordance with another embodiment, an RF system includes a first RF transceiver circuit comprising a first RF transmitter configured to produce a first RF signal at a first frequency; a second RF transceiver circuit comprising a second RF transmitter configured to produce a second RF signal at a second frequency different from the first frequency; a first selectable filter bank having a first port coupled to an output of the first RF transmitter; a directional coupler having a first port coupled to a second port of the first selectable filter bank; a tunable bandpass filter having an input coupled to a coupled port of the directional coupler, wherein the tunable bandpass filter comprises a passband that passes the first frequency and a stopband that rejects the second frequency; and a feedback receiver having an output coupled to an output of the tunable bandpass filter, where the feedback receiver is configured to measure a parameter of a signal at the output of the tunable bandpass filter.

In accordance with another embodiment, a method of operating an RF system includes generating a first RF signal having a first frequency using a first transmitter in a first RF signal path; filtering the generated first RF signal using an RF filter of a first selectable filter bank to form a first filtered transmitted signal; producing a first coupled signal and a first transmitted signal from the first filtered transmitted signal using a directional coupler; transmitting the first transmitted signal; transmitting a second RF signal having a second frequency using a second transmitter in a second RF signal path, wherein the second RF signal path is coupled to the first RF signal path, and the second frequency is different from the first frequency; band stop filtering, using a first tunable band stop filter, the first coupled signal to form a first tunable band stop filtered signal; and measuring a parameter of the first tunable band stop filtered signal.

In accordance with a further embodiment, an RF system includes a first RF transceiver circuit comprising a first RF transmitter configured to produce a first RF signal at a first frequency; a second RF transceiver circuit comprising a second RF transmitter configured to produce a second RF signal at a second frequency different from the first frequency; a first selectable filter bank having a first port coupled to an output of the first RF transmitter; a directional coupler having a first port coupled to a second port of the first selectable filter bank; a tunable band stop filter having an input coupled to a coupled port of the directional coupler, wherein the tunable band stop filter comprises a stopband that rejects the second frequency; and a feedback receiver having an output coupled to an output of the tunable band stop filter, the feedback receiver being configured to measure a parameter of a signal at the output of the tunable bandpass filter.

BRIEF DESCRIPTION OF THE DRAWINGS

For a more complete understanding of the present invention, and the advantages thereof, reference is now made to the following descriptions taken in conjunction with the accompanying drawings, in which:

FIG. 3A illustrates an embodiment frequency cluster plan; FIG. 3B illustrates a table of frequency channels supported by the embodiment frequency cluster plan of FIG. 3A; FIG. 3C illustrates an embodiment RF front-end circuit that implements a portion of the embodiment frequency cluster plan shown in FIG. 3A; and FIGS. 3D-3N illustrate forward transmission diagrams that show the performance of various portions of the RF front-end circuit of FIG. 3B;

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a system and method for RF filtering at a front-end of a wireless communications system. Embodiments of the invention may also be applied to other RF-based systems including, but not limited to radar systems, high frequency wireline communications systems.

Current solutions apply arrays of dedicated Carrier Aggregation (CA) RF Filter Arrays that include two or more multiplexed RF filters, which are switched in to support the specific Carrier Aggregation use cases. Thus, bands that support different CA cases may experience redundancy in several CA RF Filter arrays. This design methodology increases the number of RF switches in the system, increases filter content and area in a product and complicates the design effort for new products with different CA combinations. Such a design methodology may result in redundant filter circuits when the same frequency band is supported by CA combinations. In addition, system losses may increase as more CA cases are supported. These increased system losses may lead to degradation in reference sensitivity in some systems.

Figure 1:
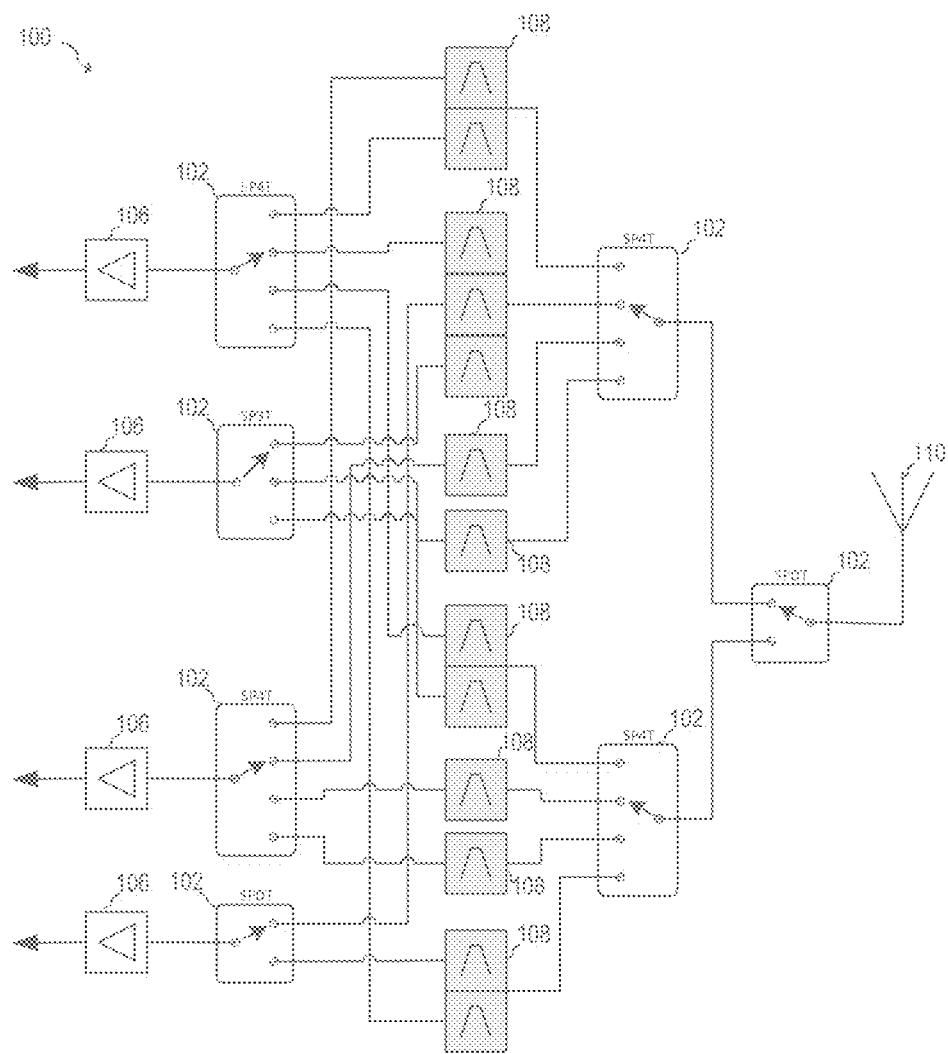
FIG. 1 illustrates a schematic of an exemplary RF front end circuit.

FIG. 1 illustrates an example of a conventional RF front end 100 that utilizes RF filters and dedicated RF band filters. As shown, RF front end 100 includes antenna 110 that is coupled to multiple RF filters 108 via multiple switching circuits 102. The output of filters 108 are coupled to LNAs 106 via additional switching circuits 102. RF filters 108 may include for example fixed bandpass filters, diplexers, triplexers or other types of RF filters. The selection of the number and type of filters 108 that are used in a particular system are based on the particular characteristics of the RF system as well as the RF environment in which the particular RF system operates. In some situations, the particular RF system may be subject to some frequencies in which high amplitude RF signals are present, for example, in the case of a transmitter that is present within the RF system that may be transmitting at the same time that the RF front end is receiving. In such cases, the frequency plan of RF front-end 100 and the selection of filters 108 would take into account the presence of the high amplitude transmitting signal and the filter characteristics of filters 108 would be designed to sufficiently reject the high amplitude transmitting signal. As can be seen, as more combinations of different RF environments are supported by RF front-end 100, more RF switches 102 and RF filters 108 are used to support these combinations. As a result, the size and complexity of RF system 100 may increase according to the number of Carrier Aggregation use cases that are supported.

In embodiments of the present invention, an RF front end utilizes wide band RF filters that group various Carrier Aggregation combinations into frequency clusters. In some embodiments, the cluster structure is selected such that a single band operates in each particular cluster. However, a single band in one cluster may operate simultaneously with other single bands in other clusters. These clusters are separated from each other via wideband cluster filters, such that interference from one cluster does not jeopardize the RF performance of any band in another cluster.

In some embodiments, transmit activity that occurs within the same cluster as a receive channel may act as a strong interferer, such as in in the case of frequency division duplex (FDD). In such embodiments, RF band stop filters may be used to suppress the transmit signal. However, in embodiments in which transmission does not occur at the same time as reception, such as in time division duplex (TDD) systems, such band stop filters may be bypassed or omitted to achieve lower insertion loss.

Figure 2A:
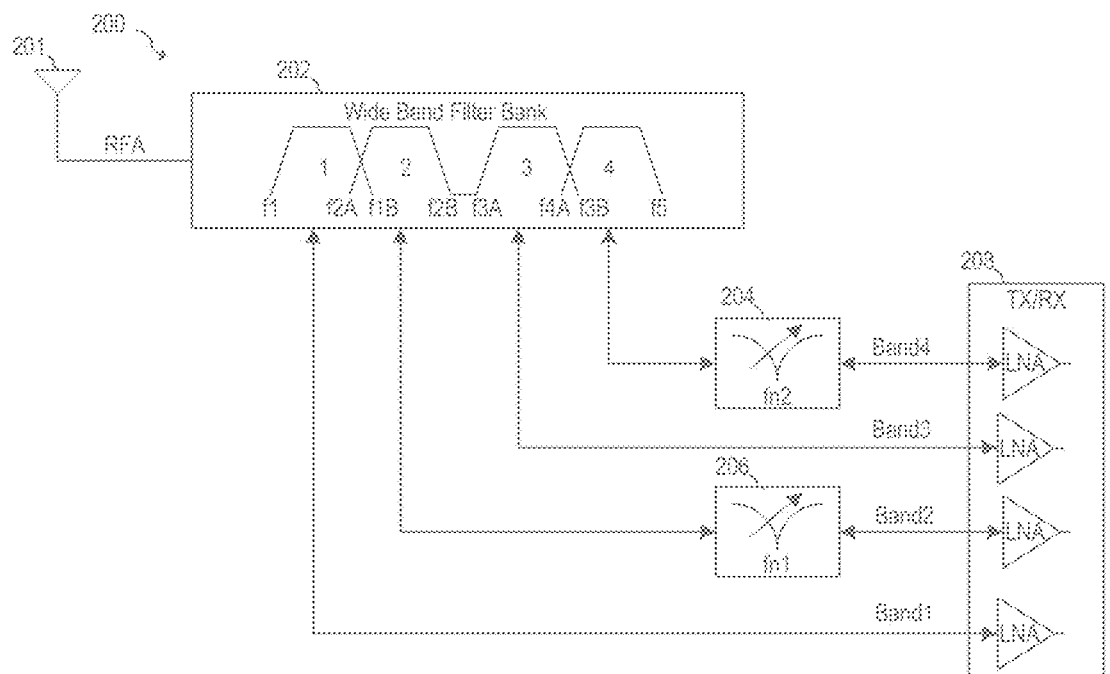
FIGS. 2A to 2D illustrate block diagrams of embodiment RF front end circuits.

FIG. 2A illustrates an RF system 200 according to an embodiment of the present invention. As shown, RF system 200 includes an antenna 201 coupled to wideband filter bank 202. In various embodiments, wideband filter bank 202 contains a plurality of wideband filter functions. In the illustrated embodiment four bands are shown. The first band has a frequency range of f1A to f1B, the second band has a frequency range of f2A to f2B, the third band has a frequency range of f3A to f3B, and the fourth band has a frequency range of f4A to f4B. Each of these frequency bands represents a frequency cluster that includes multiple transmission and/or reception frequencies. It should be understood that while wideband filter bank 202 is shown having four frequency clusters, in alternative embodiments of the present invention any number of frequency clusters may be supported. In the illustrated example, a stop band is shown between the second and third frequency bands. However, in alternative embodiments, all of the frequency bands may be directly adjacent to each other, all of the frequency bands may have stop bands between them, or the frequency bands may be distributed with any combination being directly adjacent to each other or having stop bands between them. For example, each frequency band may have its own dedicated lower corner frequency $f_{low}$ and its own dedicated upper corner frequency $f_{high}$.

As shown, wideband filter bank 202 is coupled to RF transceiver 208. RF transceiver 208 may include circuitry that supports the transmission and/or reception of radio frequency signals. Such circuitry may include, for example low noise amplifiers (LNAs) that are used to amplify RF signals received by antenna 201. As shown, tunable band reject filter 204 is coupled between the fourth cluster of wideband filter bank 202 and fourth input of RF transceiver 208. Tunable band reject filter 204 may be used, for example, to filter out strong interferer such as signals that are transmitted by RF system 200. Similarly, tunable band reject filter 206 is coupled between the second cluster of wideband filter bank 202 and second input of RF transceiver 208. While only two band reject filters 204 and 206 supporting two frequency clusters are depicted in FIG. 2A, it should be understood that any number of frequency channels may include one or more tunable band reject filters depending on the particular system and its specifications. In some embodiments fixed frequency band reject filters may be used in place of tunable band reject filters. Fixed frequency band reject filters may be used, for example, in systems in which the transmission frequency is fixed.

Figure 2B:
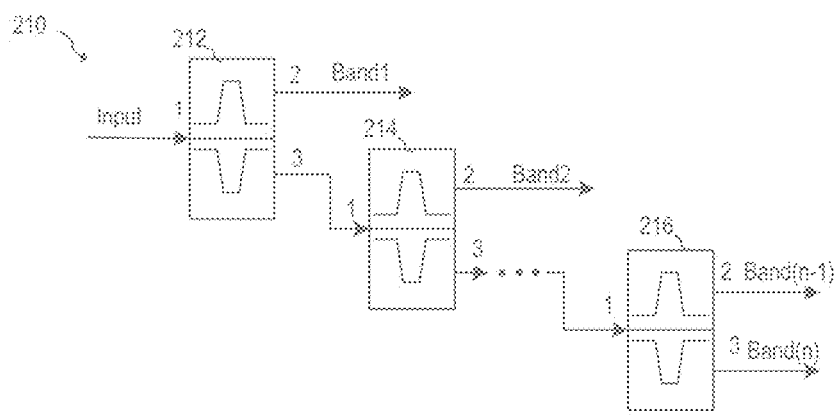
Figures 2C, 2D:
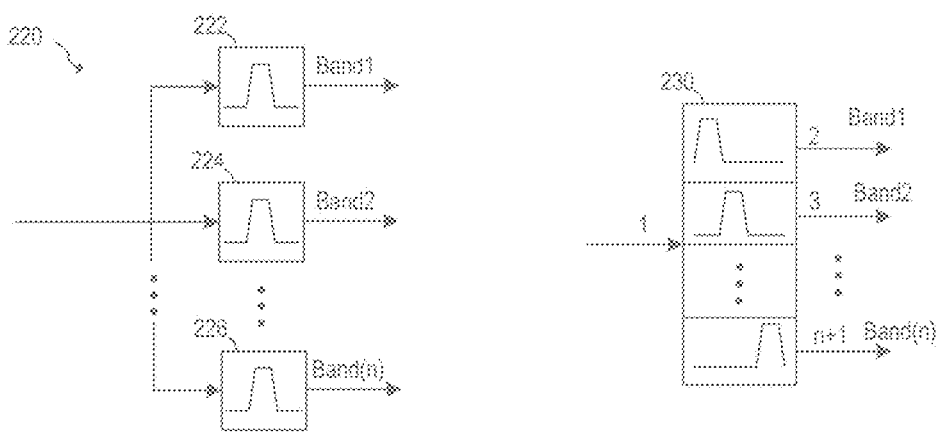

FIGS. 2B-2D illustrate example filter implementations that may be used to implement wideband filter bank 202 shown in FIG. 2A. FIG. 2B illustrates filter bank 210 that is implemented using a cascade of extractors 212, 214 and 216. As shown, extractors 212, 214 and 216 have a bandpass response between ports 1 and 2, and a band stop response between ports 1 and 3. During operation, extractor 212 produces the filtered output of the first band (Band1) using its bandpass function, and passes the remaining frequency bands (except for the first band) using its band reject function. Similarly, extractor 214 produces the filtered output of the second band (Band2) using its bandpass function, and passes the remaining frequency bands (except for the second band) using its band reject function. Extractor 216 produces the filtered output of the next to last band (Band (n−1)) using its bandpass function, and passes the last remaining frequency band Band(n) using its band reject function. Any number of extractors can be cascaded together. Extractor 216 may be implemented using filter circuits known in the art including structures as SAW filters, BAW filters, FBAR filters, loosely coupled resonators, LC filters, LC resonators, tunable LC filters, microstrip filters or other filter structures. In some embodiments, extractors 212, 214 and 216 may be implemented using isolated filter core structures disclosed in U.S. patent application Ser. No. 14/874,256, which application is incorporated herein by reference in its entirety. It should be understood that while extractors 212, 214 and 216 are shown using bandpass filter functions, other filter functions could be used such as lowpass, highpass and bandstop filter functions.

In some embodiments, wide band filter bank 202 may be implemented using parallel bandpass filters as shown in FIG. 2C, which illustrates filter bank 220 that includes parallel bandpass filters 222, 224 and 226. Wide band filter bank 202 may also be implemented using multi-port filter such multi-port filter 230 shown in FIG. 2D. As shown multi-port filter 230 is an n-plexer that is configured to pass a different band between port 1 and each of the remaining ports 1 through n+1 Such an n-plexer may be used to enable an embodiment system to receive n frequency bands or n frequency clusters. For example, multi-port filter 230 passes the first band between ports 1 and 2, the second band between ports 1 and 3, and the nth band between ports 1 and n+1. In various embodiments, multi-port filter 230 may be implemented using various n-plexer circuitry known in the art including SAW filters, BAW filters, FBAR filters, loosely coupled resonators, LC filters, LC resonators, tunable LC filters, microstrip filters or other filter structures. In some embodiments, multi-port filter 230 may be implemented using isolated filter core structures described, for example, with respect to FIGS. 2A-2D and 3A-3D in U.S. patent application Ser. No. 14/874,256, which application is incorporated herein.

It should be further understood that wide band filter bank 202 may also be implemented using a combination of cascaded diplexer, parallel bandpass filters and/or multi-port filters to achieve the desired filter clusters. In some embodiments, wide band filter bank 202 may also be adapted to include narrowband filter functions in addition to the wideband cluster filters.

Figures 3B, 3D:
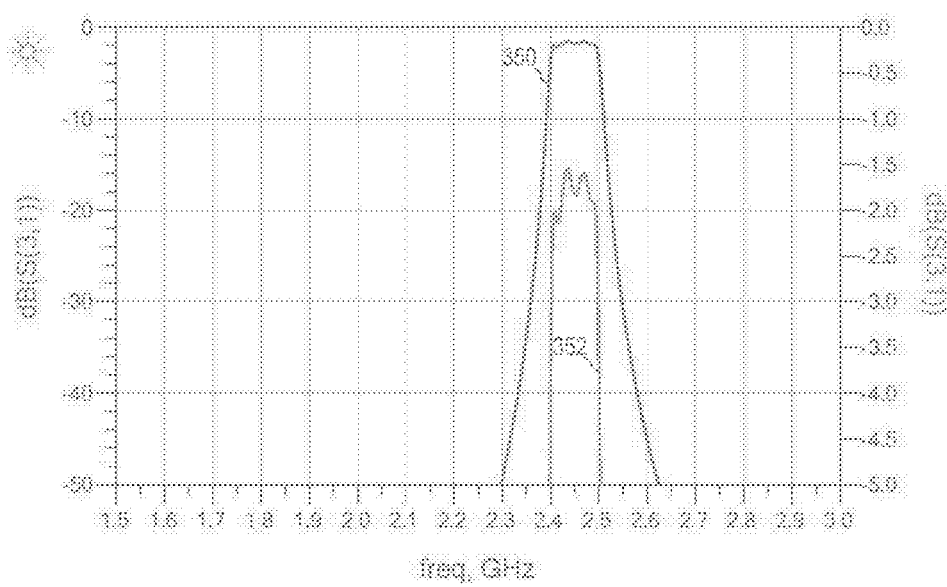
Figure 3E:
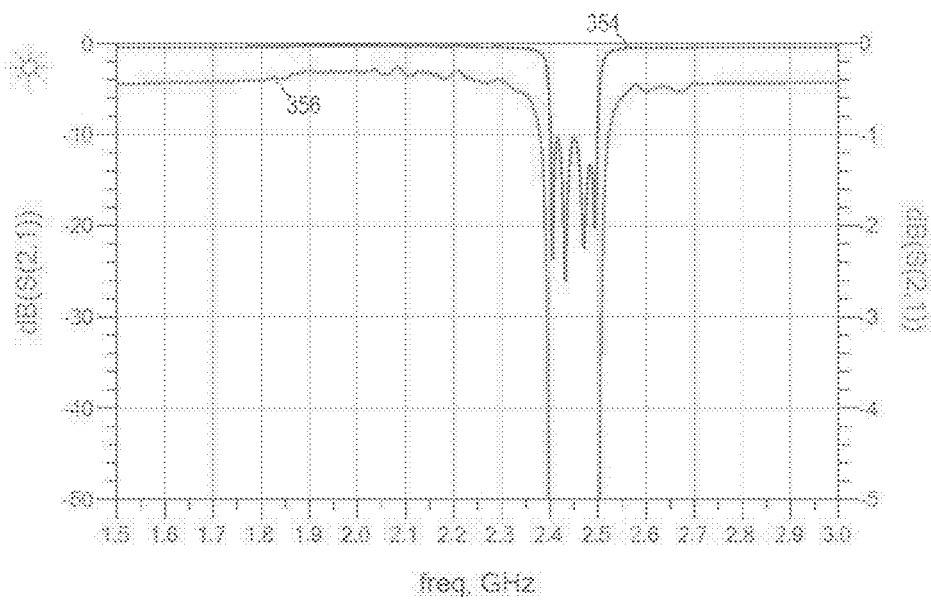
Figure 3F:
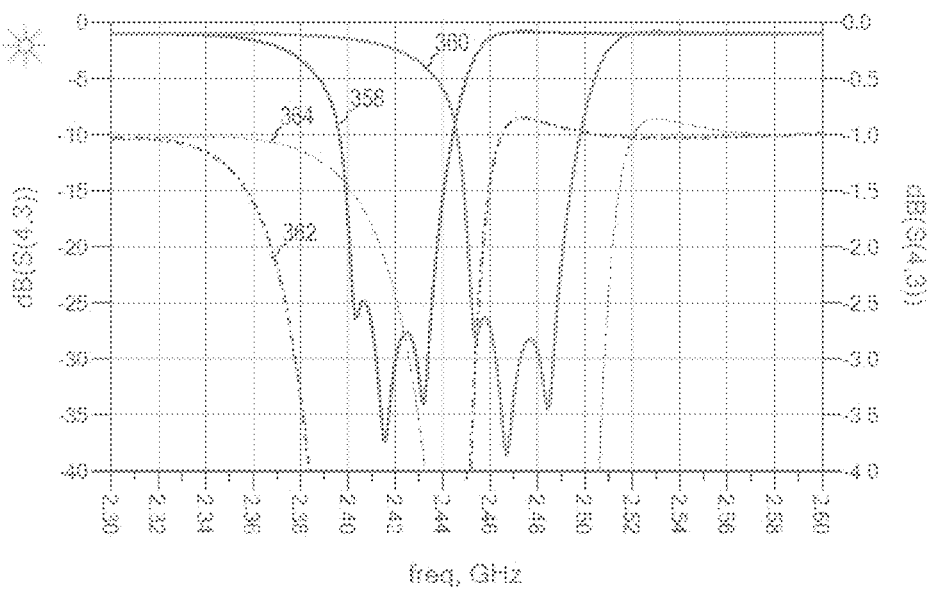
Figure 3G:
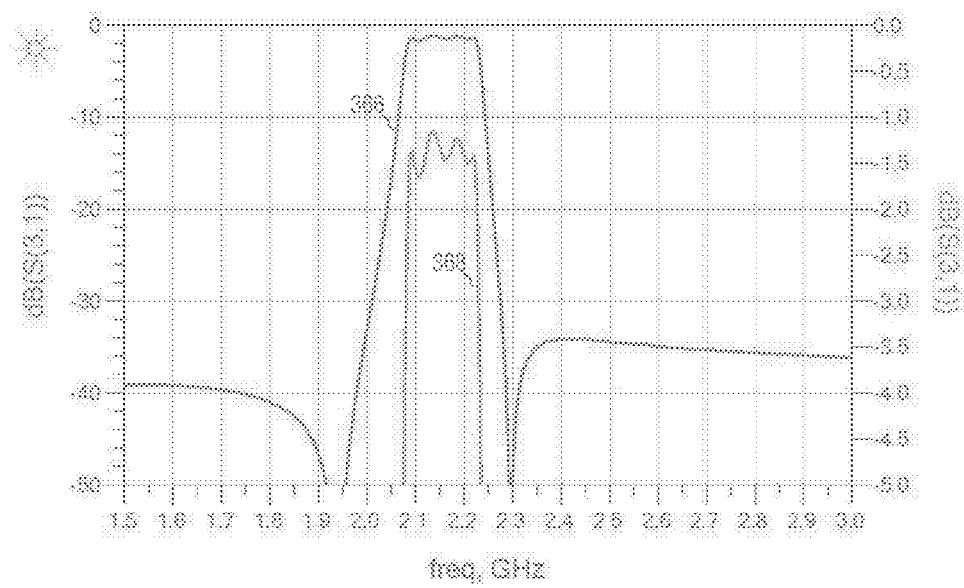
Figure 3H:
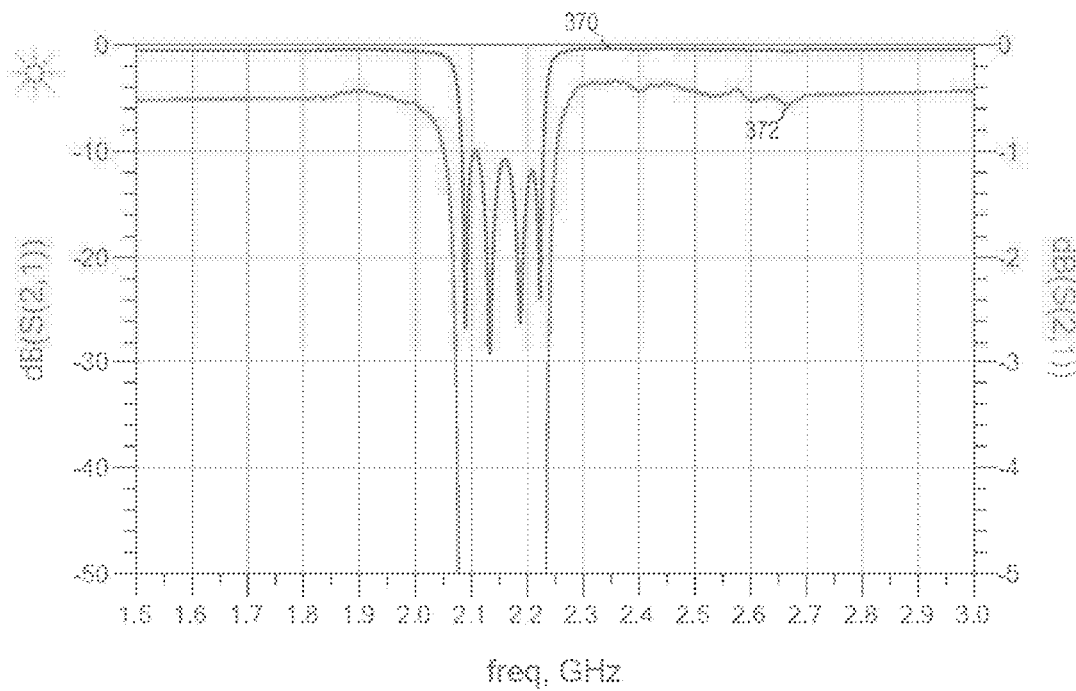
Figure 3I:
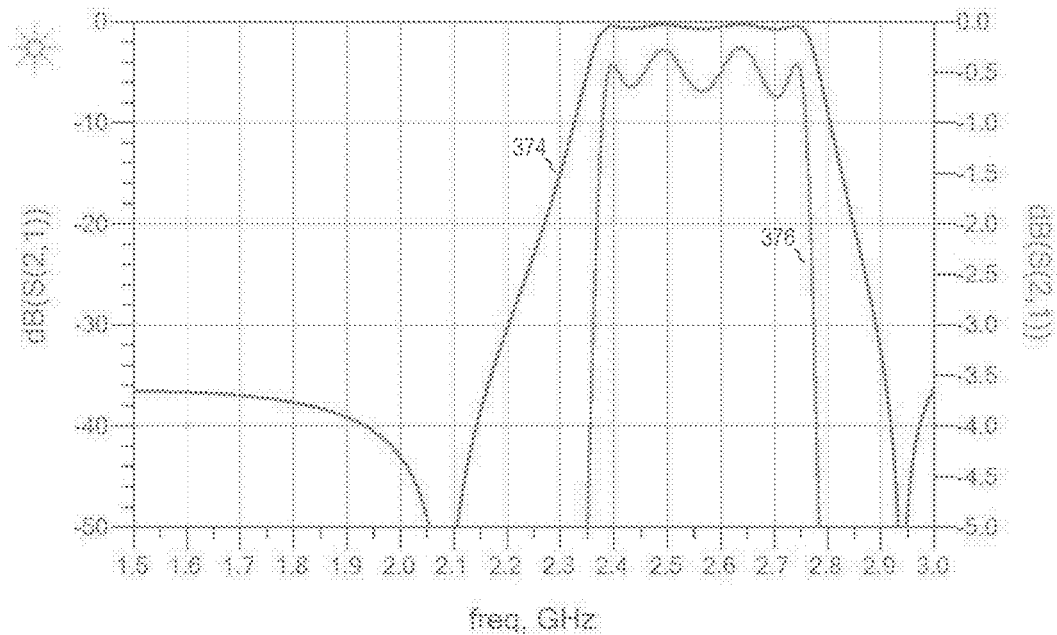
Figure 3J:
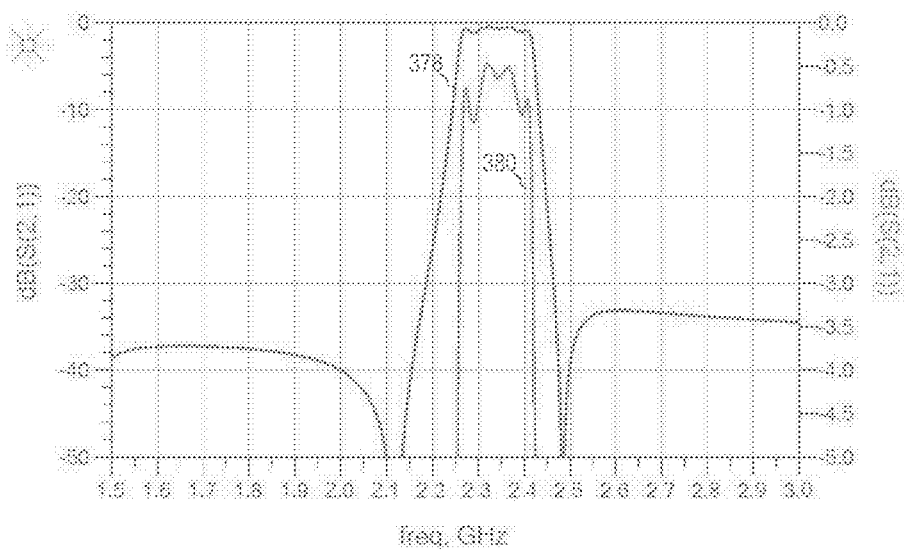
Figure 3K:
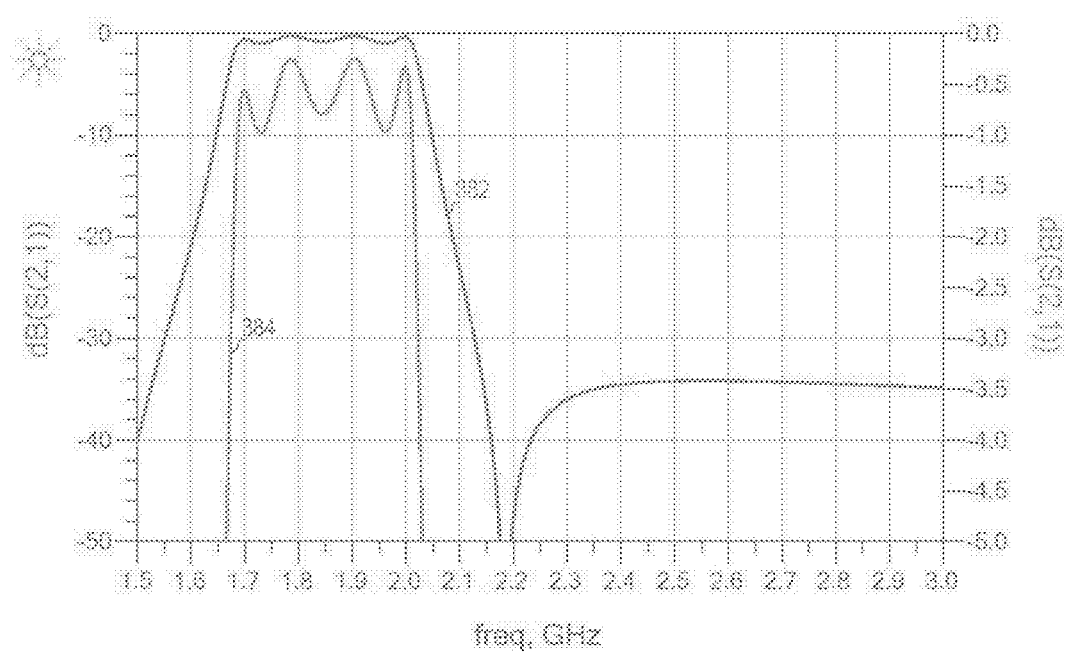
Figure 3N:
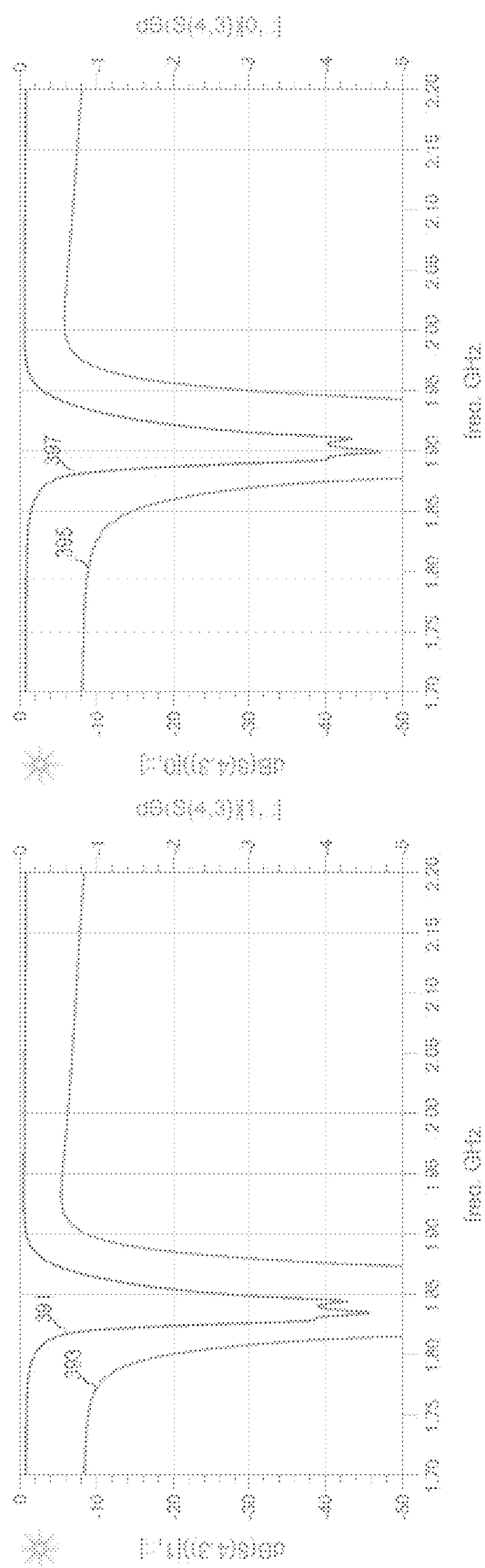

FIGS. 3A to 3N illustrate a specific example implementation of a RF front-end filter system that could be used in a portable cellular device. In some embodiments, the RF front-end filter system described in FIGS. 3A to 3N may be used to implement RF system 200 shown in FIG. 2A. It should be understood that the embodiment of FIGS. 3A to 3N is just one example of many possible ways to implement an RF front-end filter system according to embodiments of the present invention.

FIG. 3A illustrates a block diagram of an embodiment frequency cluster plan. As shown the frequency cluster plan includes cluster A that has a frequency range from 703 MHz to 821 MHz; cluster B that has a frequency range from 853 MHz to 960 MHz; cluster C that has a frequency range from 1475.9 MHz and 1559.0 MHz; cluster D that has a frequency range from 1805 MHz to 2025 MHz; cluster E that has a frequency range from 2100 MHz to 2200 MHz; cluster Fl that has a frequency range from 2300 MHz to 2400 MHz; a Wi-Fi cluster that has a frequency range from 2400 MHz to 2483 MHz; cluster Fh that has a frequency range from 2496 MHz to 2690 MHz; and cluster G that has a frequency range from 3400 MHz to 3800 MHz. Because frequency cluster D is located very close to frequency cluster C, the low end of the filter used to implement frequency cluster D has a steep frequency rolloff as indicated by rectangle 302. Similarly, because frequency cluster E is located very close to frequency cluster D, the low end of the filter used to implement frequency cluster E has a steep rolloff as indicated by rectangle 304. In some embodiments, the cluster filter used to implement the Wi-Fi band also has a steep roll off because of the narrow frequency of the Wi-Fi band. This steep roll off is due to the small frequency guard spectrum between the Wi-Fi band and the cellular bands.

In the illustrated embodiment, clusters D, Fl, and Fh represent frequency bands in which there is transmit activity. Accordingly, band stop filters are used to reject the interferers within these bands. In some embodiments, these band stop filters may be cascaded after the filter used to filter the particular cluster. These band stop filters are represented by blocks 306 and 308 within cluster D, block 309 within cluster Fl, and block 311 within cluster Fh. Alternatively, cluster D may include a single band stop filter. In some embodiments, a variable frequency band stop filter, such as a tunable notch filter, may be used in order to increase system flexibility. Alternatively, fixed frequency notch filters may be used when appropriate.

FIG. 3B illustrates a table of example frequency bands that may be supported by the frequency plan shown in FIG. 3A. As shown in FIG. 3B the entries in the table of example frequency bands include a band number, a transmission type, an uplink frequency (UL) range that represents the frequencies being transmitted by the system, and a downlink frequency (DL) range that represents the frequencies being received by the system. Example transmission types include, for example, frequency division duplex (FDD) and time division duplex (TDD). It should be understood that in alternative embodiments, different frequency bands as well as different transmission/reception types may be supported. For example, in some embodiments, some clusters may support only signal reception or signal transmission.

FIG. 3C illustrates RF front-end 310 that can be used to implement clusters D, E, Fl, Wi-Fi and Fh of FIG. 3A. RF front-end 310 includes a cascade of RF filters 312, 316 and 319 that are used to filter out the various clusters. More specifically, RF filter 312 is a three-port filter that has a bandpass response between port 1 and port 3, and a band stop response between port 1 and port 2. Accordingly, RF filter 312 passes the Wi-Fi band between antenna 340 and the cluster Wi-Fi output of RF front end 310, and rejects the Wi-Fi band between antenna 340 and the remaining cluster filters 316 and 319. In other words, RF filter 312 removes or attenuates the Wi-Fi band from the signal received by antenna 340 prior to filtering by RF filter 316. RF filter 312 may be implemented using a three-port extractor cluster filter. This filter may be implemented using various diplexer circuits as discussed above. In some embodiments, RF filter 312 may be bypassed with 314 when the Wi-Fi system is deactivated or not in use. Bypassing RF filter 312 may improve the noise performance of RF front-end 310 by reducing the attenuation of the filter.

RF filter 316 is used to separate out the frequencies of cluster E from clusters D, Fl and Fh. As shown, RF filter 316 is also a three port filter that has a bandpass response between port 1 and port 3, and a band stop response between port 1 and port 2. Accordingly, RF filter 316 passes the Cluster E band between antenna 340 and the Cluster output of RF front end 310, and rejects the Cluster E band between antenna 340 and the remaining cluster filter 319. RF filter 316 may be bypassed when RF front-end 310 is not receiving or transmitting RF signals within the frequency band of cluster E. RF filter 316 may be implemented using a three-port extractor cluster filter and may be implemented using various diplexer circuits as discussed above.

In some embodiments, RF filters 312 and 316 may be implemented as highly selective filters. Triplexer-based implementations of RF filters 312 and 316 may provide high selectivity in such cases. Alternatively, a hybrid extractor, such as that described with respect to FIG. 4B of U.S. patent application Ser. No. 14/874,256, may be used to implement RF filter 312 and/or 316. In such cases, the high side and/or the low side filter slope may be enhanced by using tuned or switched filter slope.

In embodiments in which WiFi filtering is not utilized, the low side tunable/switchable filter slope of RF filter 312 can be implemented as a steeper high side filter slope in the filtering of cluster Fl, and the high side tunable/switchable filter slope of RF filter 312 can be implemented as a steeper low side filter slope in the filtering of cluster Fh. For example, RF filter 312 may be implemented using a tunable slope enhancer with bypass for improved selectivity on low side of the WiFi band at 2400 MHz and/or on the high side of the WiFi band at 2483 MHz; and RF filter 316 may be implemented using a tunable slope enhancer on the low side of the band to provide improved selectivity on bands 23 and 65.

RF filter 319 separates the remaining frequencies of clusters D, Fl and Fh. As shown, RF filter 319 is implemented as a four port filter having various bandpass responses corresponding to the frequency of clusters D, Fl and Fh. In some embodiments, RF filter 319 is implemented using triplexer filter structures known in the art. Alternatively, RF filter 319 may be implemented using an extractor cluster filter to filter out cluster Fl followed by a diplexer to filter cluster D and cluster Fh. In some embodiments, RF filter 319 may be implemented using a tunable slope enhancer with bypass for improved selectivity on the UL channel of bands 3 and 9.

In various embodiments, the frequencies of frequency bands D, Fl and Fh are further filtered using band stop filters 330, 326, and 322 in order to attenuate strong interferers or signals being transmitted by the system itself within its respective frequency cluster. Band stop filters 330, 326, and 322 may be implemented using band reject filter structures and/or tunable band stop filter structures known in the art. In some embodiments, band stop filters 330, 326, and 322 may be implemented using frequency tunable BAW resonators disclosed in U.S. Provisional Application Nos. 62/595,898 and 62/641,664, as well as co-pending U.S. patent application Ser. Nos. 16/210,703, 16/210,732, 16/210,756, 16/210,788 and 16/210,812 which applications are incorporated herein by reference in their entirety.

In some embodiments, band reject filters 330, 326 and 322 may be bypassed with switches 332, 328 and 324, respectively. Switches 314, 318, 324, 328 and 332 may be implemented using RF switch structures known in the art. Tunable band stop filter 322 with bypass switch 324 may provide improved selectivity for the UL channel of band 7; tunable band stop filter 326 with bypass switch 328 may provide improved selectivity for the on band 30; and tunable band stop filter 330 with bypass switch 332 may provide improved selectivity for the UL channels of bands 2, 25, 1 and 25 (for CA cluster 1).

FIG. 3D illustrates a graph of the passband response of RF filter 312 between ports 1 and 3. Curve 350 illustrates the passband response in dB according to the ordinate axis on the left of the graph, and curve 352 illustrates a magnified view of the passband response in dB according to the ordinate axis on the right of the graph.

FIG. 3E illustrates a graph of the passband response of RF filter 312 between ports 1 and 2. Curve 354 illustrates the passband response in dB according to the ordinate axis on the left of the graph, and curve 356 illustrates a magnified view of the passband response in dB according to the ordinate axis on the right of the graph.

In embodiments that do not support WiFi, the system of FIG. 3C can be modified by replacing RF filter 312 with a two-port tunable band stop filter that is coupled between antenna 340 and port 1 of RF filter 316. This two-port tunable band stop filter is used, for example, to attenuate RF signals transmitted by nearby WiFi devices. FIG. 3F illustrates a graph of the passband response of such a two-port tunable band stop filter. Curve 358 illustrates the passband response in dB at a first setting (center frequency of 2.47 GHz) according to the ordinate axis on the left of the graph, and curve 362 illustrates a magnified view of the passband response in dB at the first setting (center frequency of 2.47 GHz) according to the ordinate axis on the right of the graph. Curve 360 illustrates the passband response in dB at a second setting (center frequency of 2.42 GHz) according to the ordinate axis on the left of the graph, and curve 364 illustrates a magnified view of the passband response in dB at the second setting (center frequency of 2.42 GHz) according to the ordinate axis on the right of the graph.

FIG. 3G illustrates a graph of the passband response of RF filter 316 between ports 1 and 3. Curve 366 illustrates the passband response in dB according to the ordinate axis on the left of the graph, and curve 368 illustrates a magnified view of the passband response in dB according to the ordinate axis on the right of the graph.

FIG. 3H illustrates a graph of the passband response of RF filter 316 between ports 1 and 2. Curve 370 illustrates the passband response in dB according to the ordinate axis on the left of the graph, and curve 372 illustrates a magnified view of the passband response in dB according to the ordinate axis on the right of the graph.

FIG. 3I illustrates a graph of the passband response of RF filter 319 between ports 1 and 2, which are used to extract cluster Fh. Curve 374 illustrates the passband response in dB according to the ordinate axis on the left of the graph, and curve 376 illustrates a magnified view of the passband response in dB according to the ordinate axis on the right of the graph.

FIG. 3J illustrates a graph of the passband response of RF filter 319 between ports 1 and 3, which are used to extract cluster Fl. Curve 378 illustrates the passband response in dB according to the ordinate axis on the left of the graph, and curve 380 illustrates a magnified view of the passband response in dB according to the ordinate axis on the right of the graph.

FIG. 3K illustrates a graph of the passband response of RF filter 319 between ports 1 and 4, which are used to extract cluster D. Curve 382 illustrates the passband response in dB according to the ordinate axis on the left of the graph, and curve 384 illustrates a magnified view of the passband response in dB according to the ordinate axis on the right of the graph.

FIG. 3L illustrates graphs of passband responses of tunable band reject filter 322 that is used to reject interferers from cluster Fh. Curve 386 illustrates the passband response in dB at a first setting (center frequency of 2.51 GHz) according to the ordinate axis on the left of the graph, and curve 388 illustrates a magnified view of the passband response in dB at the first setting (center frequency of 2.51 GHz) according to the ordinate axis on the right of the graph. Curve 390 illustrates the passband response in dB at a second setting (center frequency of 2.57 GHz) according to the ordinate axis on the left of the graph, and curve 392 illustrates a magnified view of the passband response in dB at the second setting (center frequency of 2.57 GHz) according to the ordinate axis on the right of the graph.

FIG. 3M illustrates graphs of passband responses of tunable band reject filter 326 that is used to reject interferers from cluster Fl. Curve 392 illustrates the passband response in dB at a first setting (center frequency of 2.18 GHz) according to the ordinate axis on the left of the graph, and curve 394 illustrates a magnified view of the passband response in dB at the first setting (center frequency of 2.51 GHz) according to the ordinate axis on the right of the graph. Curve 396 illustrates the passband response in dB at a second setting (center frequency of 2.29 GHz) according to the ordinate axis on the left of the graph, and curve 398 illustrates a magnified view of the passband response in dB at the second setting (center frequency of 2.29 GHz) according to the ordinate axis on the right of the graph.

FIG. 3N illustrates graphs of passband responses of tunable band reject filter 330 that is used to reject interferers from cluster D. Curve 391 illustrates the passband response in dB at a first setting (center frequency of 1.84 GHz) according to the ordinate axis on the left of the graph, and curve 393 illustrates a magnified view of the passband response in dB at the first setting (center frequency of 184 GHz) according to the ordinate axis on the right of the graph. Curve 397 illustrates the passband response in dB at a second setting (center frequency of 1.91 GHz) according to the ordinate axis on the left of the graph, and curve 397 illustrates a magnified view of the passband response in dB at the second setting (center frequency of 1.91 GHz) according to the ordinate axis on the right of the graph.

Figure 4A:
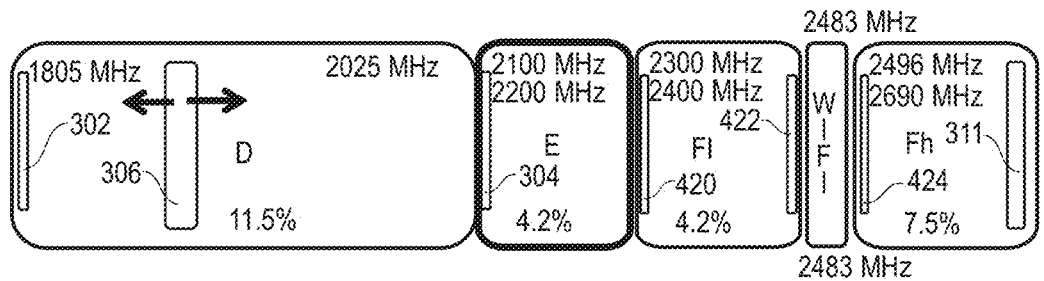
FIG. 4A illustrates an alternative frequency cluster plan.
Figure 4B:
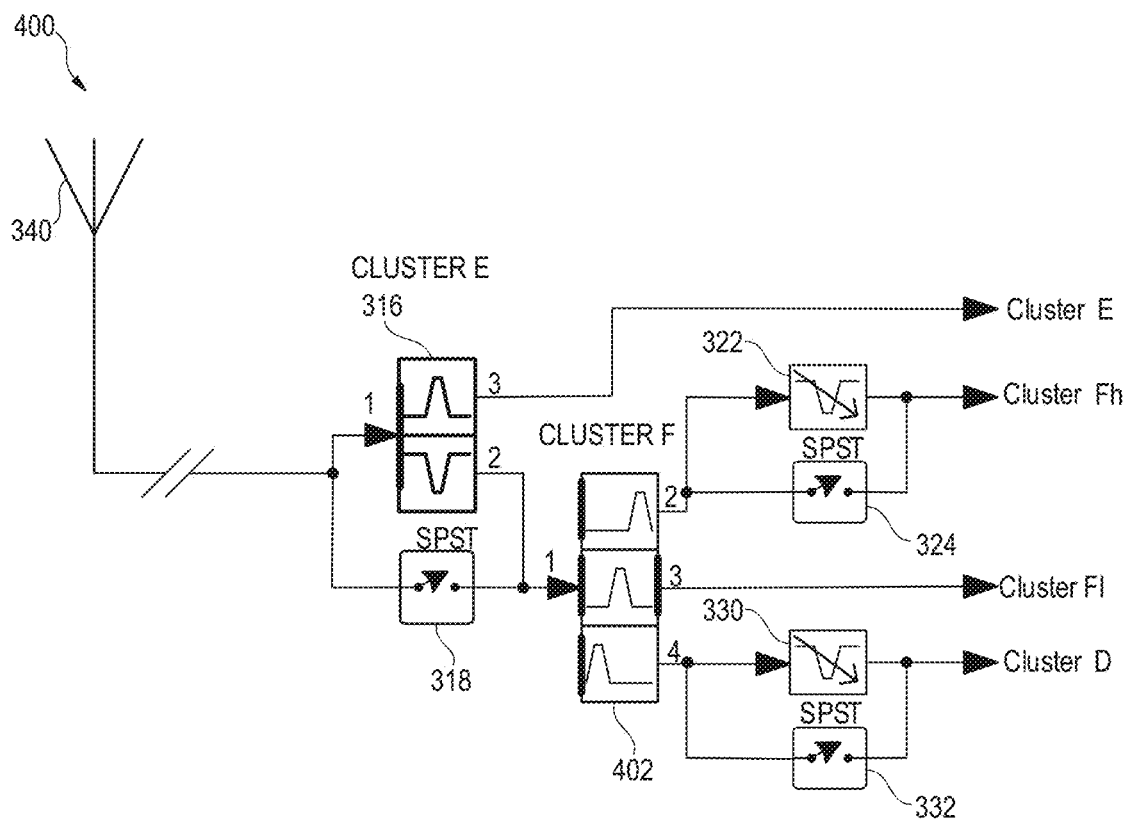
FIG. 4B illustrates a further embodiment RF front-end circuit that implements the alternative frequency cluster plan of FIG. 4A.

FIGS. 4A-4E illustrate further frequency plans and RF-end circuits according to alternative embodiments of the present invention. The embodiment of FIGS. 4A and 4B is similar to the embodiment of FIGS. 3A-3N with the exception that RF filter 312 used to extract the WiFi band is eliminated and WiFi selectivity is added to the filtering of clusters Fh and Fl. In some embodiments, the RF front-end filter system described in FIGS. 4A to 4E may be used to implement RF system 200 shown in FIG. 2A.

As shown in FIG. 4A, the frequency cluster plan includes cluster D that has a frequency range from 1805 MHz to 2025 MHz; cluster E that has a frequency range from 2100 MHz to 2200 MHz; cluster Fl that has a frequency range from 2300 MHz to 2400 MHz; and cluster Fh that has a frequency range from 2496 MHz to 2690 MHz. Because frequency cluster D is located very close to other channels in frequency cluster C (not shown), the low end of the filter used to implement frequency cluster D has a steep frequency rolloff as indicated by rectangle 302. Similarly, because frequency cluster E is located very close to frequency cluster E, the low end of the filter used to implement frequency cluster E has a steep rolloff as indicated by rectangle 304; and because frequency cluster Fl is located very close to frequency cluster E, the low end of the filter used to implement frequency cluster Fl has a steep rolloff as indicated by rectangle 420.

Because a WiFi extraction filter is not used in the embodiment of FIGS. 4A and 4B, the high end of the filter used to implement frequency cluster Fl has a steep rolloff as indicated by rectangle 422; and the low end of the filter used to implement frequency cluster Fh has a steep rolloff as indicated by rectangle 424 in order to provide rejection of WiFi signals in the WiFi band.

In the illustrated embodiment, clusters D, Fl, and Fh represent frequency bands in which there is transmit activity. Accordingly, band stop filters are used to reject the interferers within these bands. In some embodiments, these band stop filters are cascaded after the filter used to filter the particular cluster. These band stop filters are represented by block 306 within cluster D and block 311 within cluster Fh.

FIG. 4B illustrates RF front-end 400 that can be used to implement the frequency plan of FIG. 4A. RF front-end 400 includes a cascade of RF filters 316 and 402 that are used to filter out the various clusters. As described above with respect to FIG. 3C, RF filter 316 is used to separate out the frequencies of cluster E from clusters D, Fl and Fh. As shown, RF filter 316 is a three port filter that has a bandpass response between port 1 and port 3, and a band stop response between port 1 and port 2. Accordingly, RF filter 316 passes the Cluster E band between antenna 340 and the Cluster E output of RF front end 400, and rejects the Cluster E band between antenna 340 and the remaining cluster filter 402. RF filter 316 may be bypassed with switch 318 when RF front-end 400 is not receiving or transmitting RF signals within the frequency band of cluster E. In various embodiments, RF filter 316 is implemented using a tunable slope enhancer on the low end with bypass for improved selectivity of bands 23 and 65.

RF filter 402 separates the remaining frequencies of clusters D, Fl and Fh. As shown, RF filter 402 is implemented as a four port filter having various bandpass responses corresponding to the frequencies of clusters D, Fl and Fh. In some embodiments, RF filter 402 is implemented using triplexer filter structures known in the art. Alternatively, RF filter 402 may be implemented using an extractor cluster filter to filter out cluster Fl followed by a diplexer to filter cluster D and cluster Fh.

In some embodiments, the rolloff of the various bands of RF filter 402 is enhanced using tunable slope enhancers. For example, the low side of the high frequency band of RF filter 402 used to extract cluster Fh may be implemented using a tunable slope enhancer for improved selectivity at the high end of the WiFi band at 2483 MHz; the low side of the middle frequency band of RF filter 402 used to extract cluster Fl may be implemented using a tunable slope enhancer for improved selectivity on band 30; the high side of the middle frequency band of RF filter 402 used to extract cluster Fl may be implemented using a tunable slope enhancer for improved selectivity at the low end of the WiFi band at 2400 MHz; and the low side of the low frequency band of RF filter 402 used to extract cluster D may be implemented using a tunable slope enhancer for improved selectivity on the UL channels of bands 3 and 9.

In various embodiments, the frequencies of frequency bands D and Fh are further filtered using band stop filters 330 and 322 and bypass switches 332 and 324 as described above with respect to the embodiment of FIG. 3C. However, in the embodiment of FIG. 4B, a tunable band stop filter is not applied to cluster Fl.

Figure 4C:
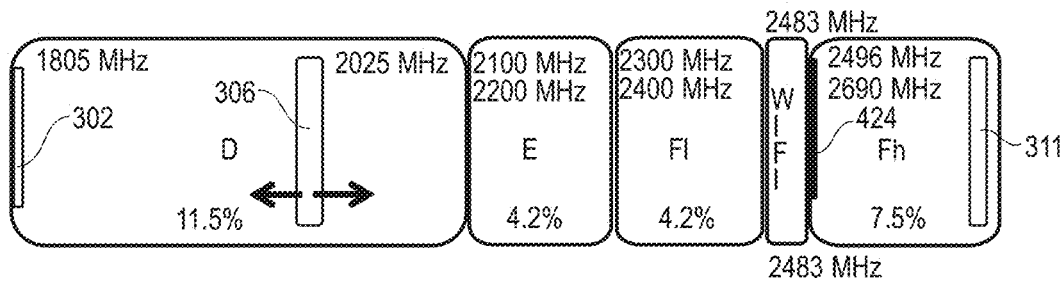
FIG. 4C illustrates a further alternative frequency cluster plan.

FIG. 4C illustrates a frequency plan according to a further embodiment. The frequency plan of FIG. 4C is similar to the frequency plan of FIG. 4A, with the exception that steep rolloff portions 304, 420 and 422 are omitted at the low end of band E, low end of band Fl and the high end of band Fl, respectively.

Figure 4D:
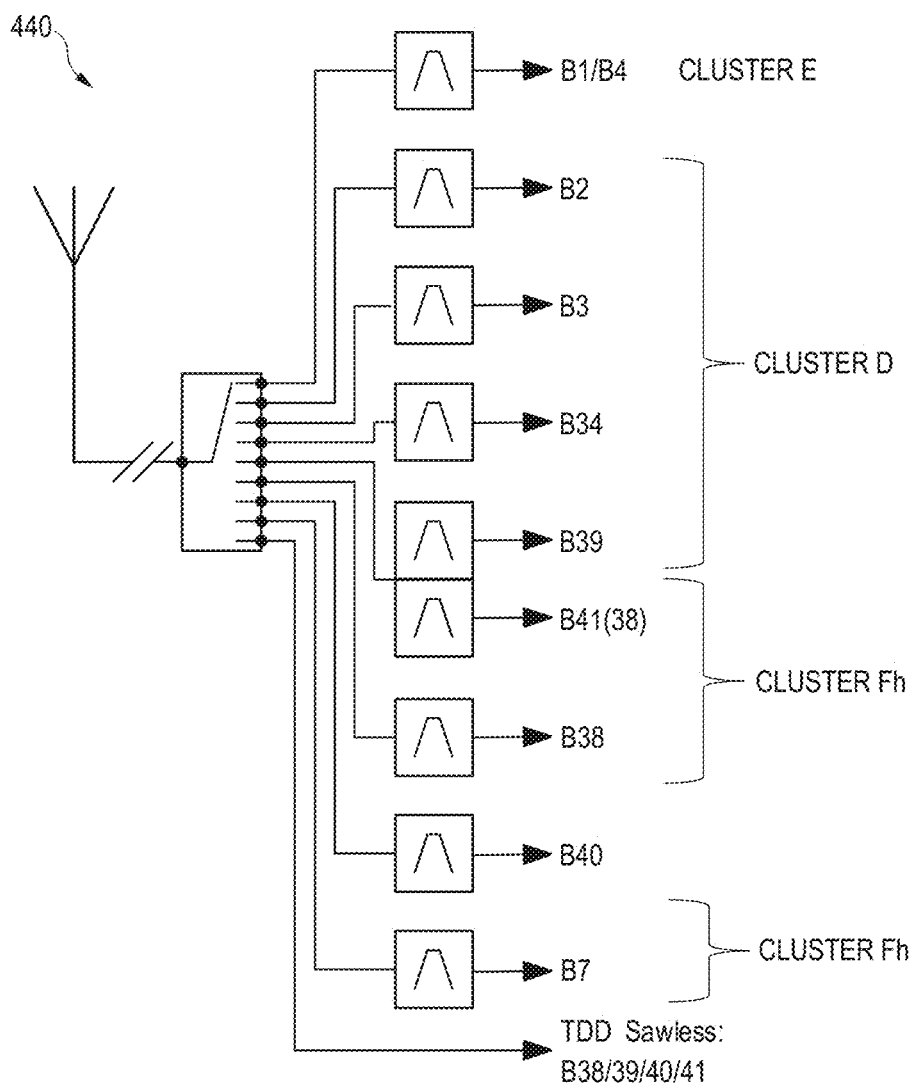
FIG. 4D illustrates a conventional implementation of the frequency cluster plan of FIG. 4C.

FIG. 4D illustrates a conventional RF front-end 440 that can be used to implement the frequency plan of FIG. 4C. As shown, conventional RF front-end 440 includes separate selectable filters that are each individually devoted to a single channel 2, 3, 34, 38, 40 and 7; a duplexer devoted to channels 39, 41 and 38; and a filter devoted to channels 1 and 4. As can be seen, there is redundancy in filters used for channel 38.

Figure 4E:
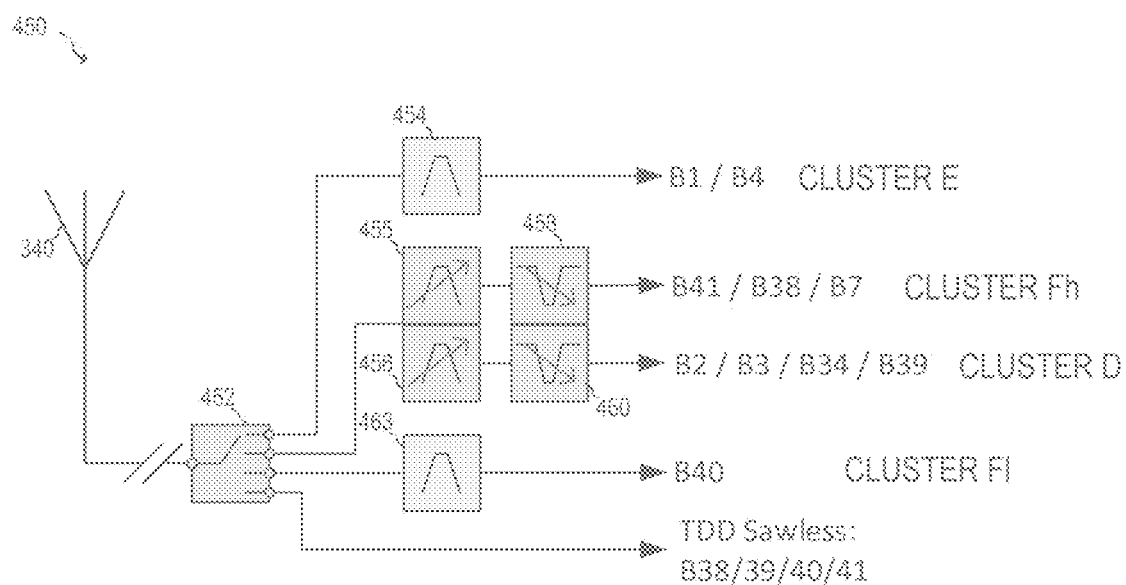
FIG. 4E illustrates an embodiment RF front-end circuit that implements the alternative frequency cluster plan of FIG. 4C.

FIG. 4E illustrates embodiment RF front-end 450 that can be used to implement the frequency plan of FIG. 4C using a smaller antenna switch and a lower component count than the conventional implementation of FIG. 4D. RF front-end 450 includes an antenna switch 452 that selectively couples antenna 340 to fixed bandpass filters 454 and 463, to tunable bandpass filters 455 and 456 and to a signal path that does not include an acoustic filter. Bandpass filter 454 is used to select bands 1 and 4 (see FIG. 3B) in cluster E, and bandpass filter 463 is used to select band 40 in cluster Fl. The combination of tunable bandpass filter 455 and tunable band reject filter 458 is used to select cluster Fh including bands 41, 38 and 7; and the combination of tunable bandpass filter 456 and tunable band reject filter 460 is used to select cluster D including bands 2, 3, 34 and 39. The signal path designated as "TDD Sawless" remains unfiltered by acoustic filters and is used to support TDD operation on bands 38, 39, 40 and 41.

Figure 10A:
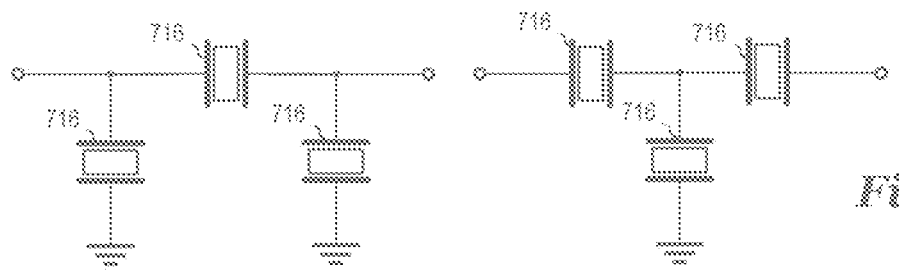
Figure 10B:
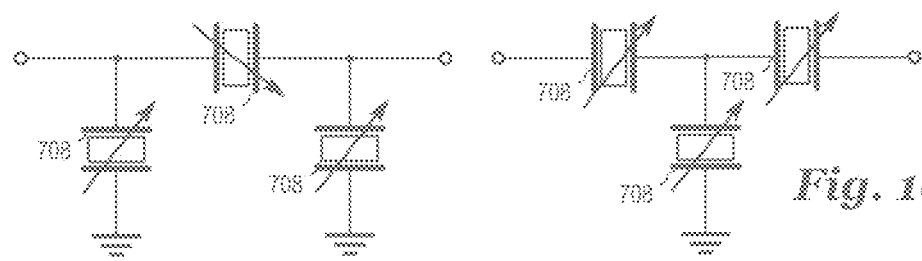
Figure 10C:
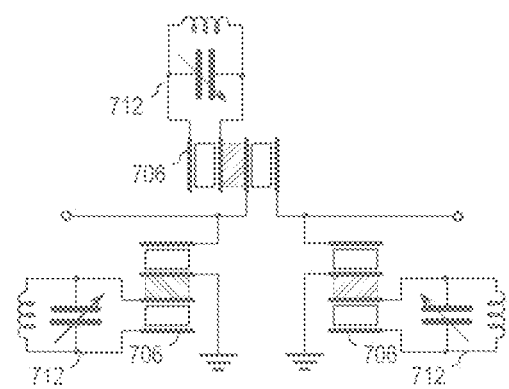
Figure 10D:
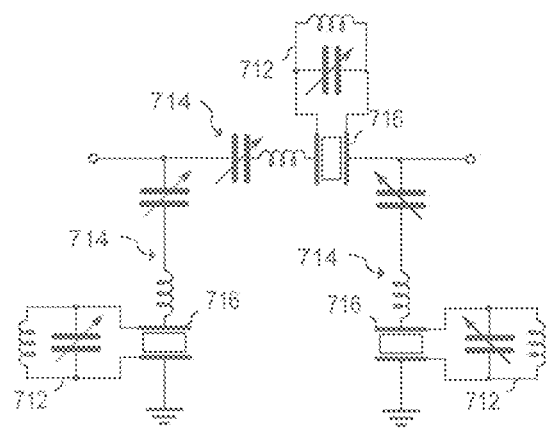
Figure 10E:
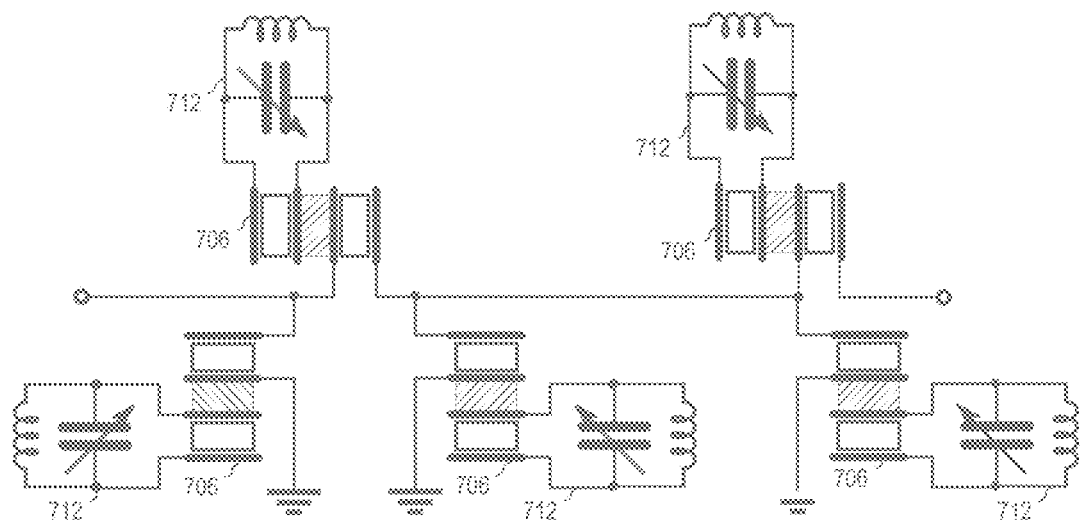
Figure 10F:
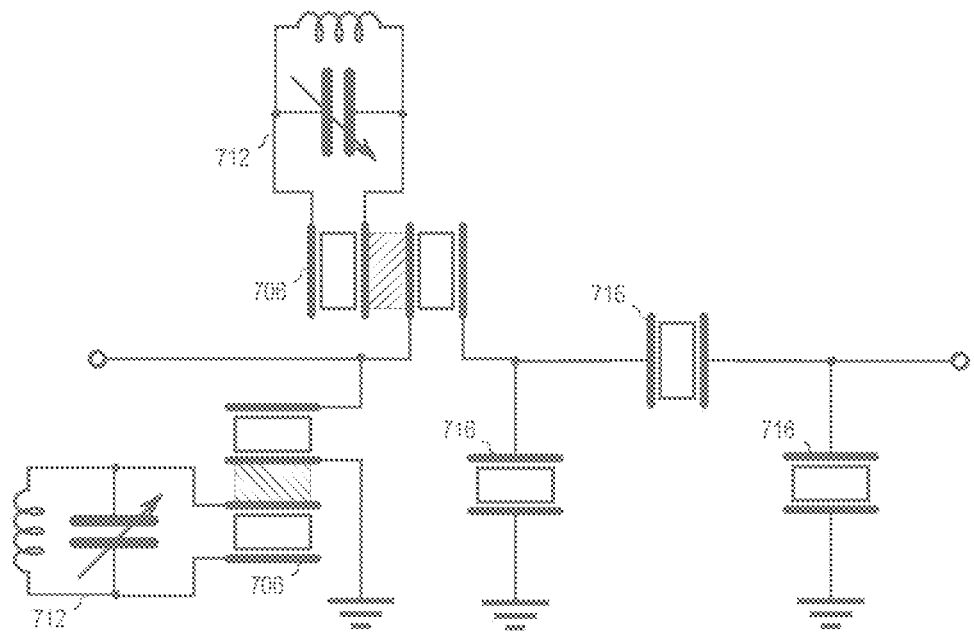
Figure 10G:
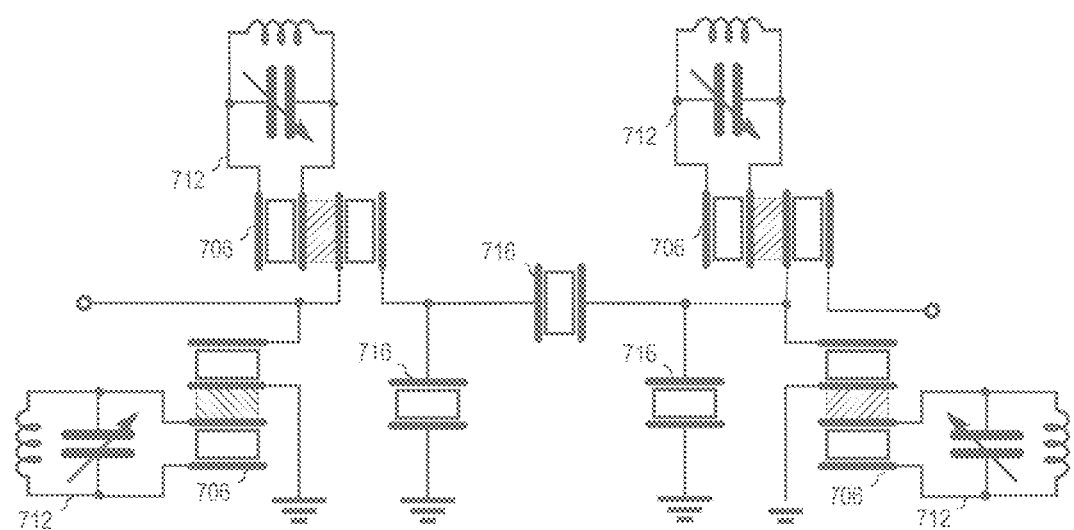

Bandpass filters 454 and 463, tunable bandpass filters 455 and 456, and tunable band stop filters 458 and 460 may be implemented, for example, using bandpass, tunable bandpass and tunable band stop filter structures known in the art and/or using tunable bandpass and band stop filter structures disclosed herein. For example, filters 458, 460, as well as filters 322 and 330 described above could be implemented using the filter structures shown in FIGS. 7D, 7E, 7F, 8D, 8E, 10B, 10C and 10D herein. Filters 455 and 456 may implemented, for example, using the filter structures shown in FIGS. 10E, 12C, 12D, 12E and 13C herein. The portions of filter 402 coupled between ports 1 and 4, and coupled between ports 1 and 2 having controllable slopes adjacent to the low end of the passband can be implemented, for example, using the tunable slope filter shown in FIG. 10F. The portion of filter 402 coupled between ports 1 and 3 having controllable slopes adjacent to both the low end and the high end of the passband can be implemented, for example, using the tunable slope filter shown in FIG. 10G.

Advantages of embodiments of the present invention ability to implement a multi-band RF-front end using wide band filters. Such embodiments provide area, board space and component count savings compared to systems that use switchable narrow band filters. An additional advantage is increase design flexibility and the ability to target a same design to different frequency plans.

Notch Filter Embodiments

Figure 5A:
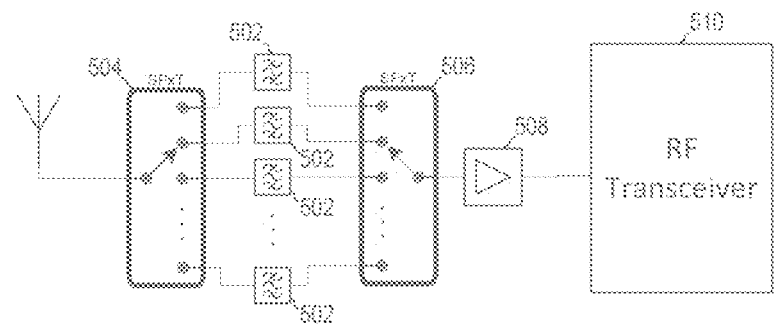
FIGS. 5A and 5B illustrate block diagrams of exemplary RF systems.
Figure 5B:
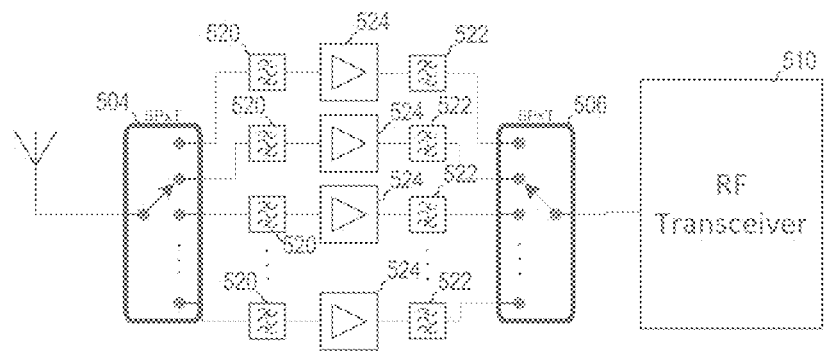

FIGS. 5A and 5B illustrate further conventional front end architectures. FIG. 5A illustrates a conventional RF front-end that includes parallel high-selectivity bandpass filters 502 that are selectable via switches 504 and 506. These high-selectivity bandpass filters 502 provide a band filtered signal to LNA 508 and RF transceiver 510. In the illustrated example, the noise figure of the system is degraded by the insertion loss of switches 504 and 506 and filters 502.

FIG. 5B illustrates another conventional RF front-end circuit that includes selectable circuit branches that each includes a lower selectivity bandpass pre-filter 520, an LNA 524 and a bandpass post-filter 522. Each of these circuit branches are selectable via switches 504 and 506. In the example of FIG. 5B, the noise figure of the system is degraded by the insertion loss of switches 504 and filter 520. Because the filter selectivity is split between bandpass pre-filter 520 and bandpass post-filter 522, the insertion loss of filter 520 can be made to be less than the insertion loss of bandpass filter 502 shown in FIG. 5A. Accordingly, the noise performance of the system of FIG. 5B can be improved with respect to the system of FIG. 5A. However, the number of filter components and LNA components is higher in the implementation of FIG. 5B.

In embodiments of the present invention, a lower selectivity bandpass filter which may have an adjustable center frequency and a tunable band reject filter is cascaded with an LNA. Because the tunable band reject filter is used to attenuate strong interferers, the lower selectivity bandpass filter may include a filter having relaxed stop band attenuation requirements, including the portion of the stopband that includes the interferer (such as the transmit frequency in the case of FDD systems). The ability to use a lower selectivity bandpass filter allows for the use of lower order filter structures that are less complex and have a smaller number of filter/resonator stages. These lower order filter structures also have less passband insertion loss, which leads to better noise performance. In one specific example, a lower selectivity bandpass filter may be implemented, for example, with a ladder-type filter of the order 2.5 instead of a higher order filter such as a 4.5 order filter. For example, in some embodiments, the order of the filter is $3^{rd}$ order or lower. Alternatively, other filter orders may be used.

In some embodiments, the lower selectivity bandpass filter may be configured to pass a plurality of RF bands, and the tunable band reject filter may be configured to reject bands that contain interferers such as transmit signals that are transmitted by the system in an FDD mode of operation. In such embodiments, the size, number and complexity of the filter components may be reduced with respect to systems that use parallel high-selectivity bandpass filters while maintaining good noise performance. In some embodiments, the number of RF switching components may be reduced, or RF switching components may be eliminated entirely depending on the particular embodiment.

In some embodiments, band selection filter requirements are relaxed by suppressing a strong known but variable interferer (e.g. the own TX signal in FDD systems) with a tunable notch filter and by distributing the overall filter functionality in a component in front of a Low Noise Amplifier (LNA) and a component behind the LNA. Splitting the filter into two sections allows reducing the selectivity requirements of band selection filter component. This again allows better in-band loss and thus better overall system noise performance. While the component before the LNA has direct impact on the system noise figure, the insertion loss behind the LNA has less of an effect on the system noise figure. Using a tunable band reject filter, such as a notch filter, eliminates the need for individual filters for each band and additional LNAs and/or switches in some embodiments.

The reduced selectivity requirements for the first filter also enable the use of tunable bandpass filters in non-carrier-aggregation ("narrowband") applications in which tunable bandpass filters usually have less selectivity than fixed band filters. If the interference scenario is such that one dominating interferer with a known frequency (e.g. the own TX in FDD systems) is much stronger than all other close-in interferes, the bandpass and band stop filters are reversed, such that the band reject filter is coupled to the input of the LNA and the bandpass filter is coupled to the output of the LNA.

Figure 6A:
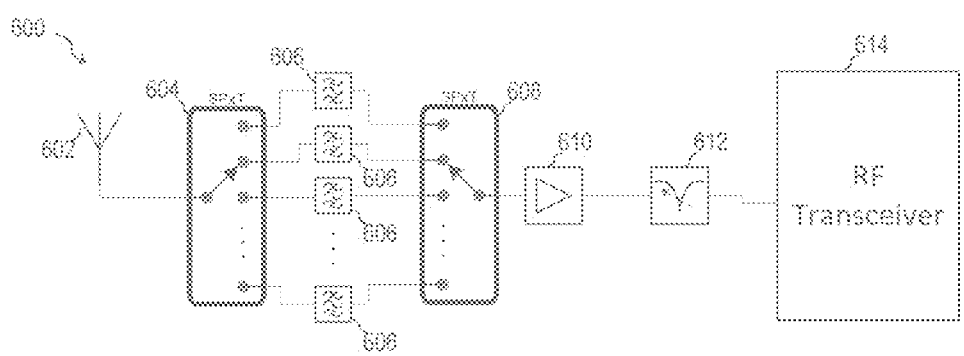
FIGS. 6A to 6G illustrate block diagrams of embodiment RF systems.

FIGS. 6A to 6G illustrate example embodiments that utilize an adjustable lower selectivity bandpass filter and a tunable band reject filter in combination with an LNA. FIG. 6A illustrates an embodiment RF front-end 600 that includes bandpass filters 606 that are selectable via RF switches 604 and 608. As shown, RF switch 604 is coupled to antenna 602. In alternative embodiments, RF switch 604 may be coupled to a different type of RF source such as a conductive line or a waveguide. In various embodiments, each bandpass filter 606 has a different center frequency and is configured to pass a plurality of RF bands present at the input. In one example embodiment, bandpass filters 606 are implemented using filter structures known in the art, such as SAW filters, BAW filters, FBAR filters, loosely coupled resonators, LC filters, LC resonators, tunable LC filters, microstrip filters or other filter structures with low insertion loss at the cost of limited stop band attenuation (e.g. low filter order). As shown, RF switch 608 is coupled to LNA 610 followed by tunable band reject filter 612 and RF transceiver 614. In various embodiments tunable band reject filter 612 may be implemented using tunable band reject filter structures known in the art, such as tunable notch filters, and/or may be implemented using tunable acoustic filter structures disclosed in U.S. Provisional Application Nos. 62/595,898 and 62/641,664, as well as co-pending U.S. patent application Ser. Nos. 16/210,703, 16/210,732, 16/210,756, 16/210,788 and 16/210,812. RF front-end 600 may be used, for example, in systems that have a strong interferer, potentially many out-of-band interferers, and/or interferers of unknown frequencies.

Figure 6B:
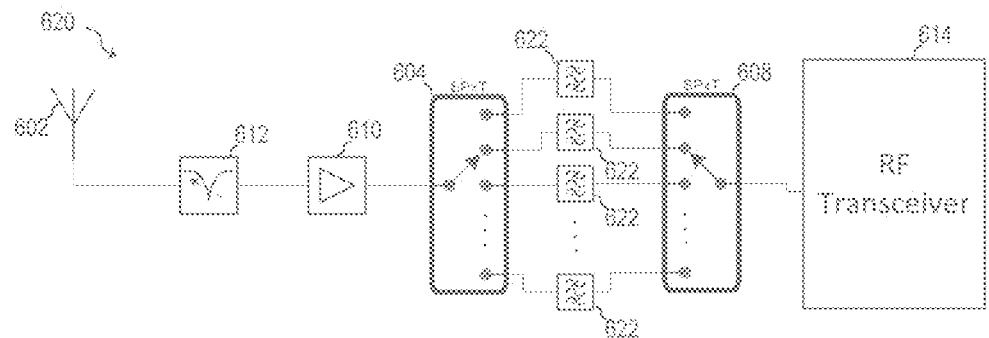

FIG. 6B illustrates an embodiment RF front-end 620 in which LNA 610 is preceded by adjustable band reject/notch filter 612 and followed by a selectable bandpass filter that includes bandpass filters 622 selectable via RF switches 604 and 608. During operation adjustable band reject/notch filter 612 removes an interfering frequency, and bandpass filters 622 provide further filtering at the output of LNA 610. RF front-end 620 may be used, for example, in systems that have one dominating interferer with a known frequency and a limitation bandwidth and/or weaker interferers at frequencies that are relatively far from the received bands. One example of such a system is a system that transmits at a predetermined frequency at the same time that it is receiving at other frequencies, such as in FDD systems. RF front-end 620 is also suitable for systems having a relatively large receive bandwidth and/or systems having non-contiguous spectrum blocks, as is the case with non-contiguous carrier aggregation systems.

Figure 6C:
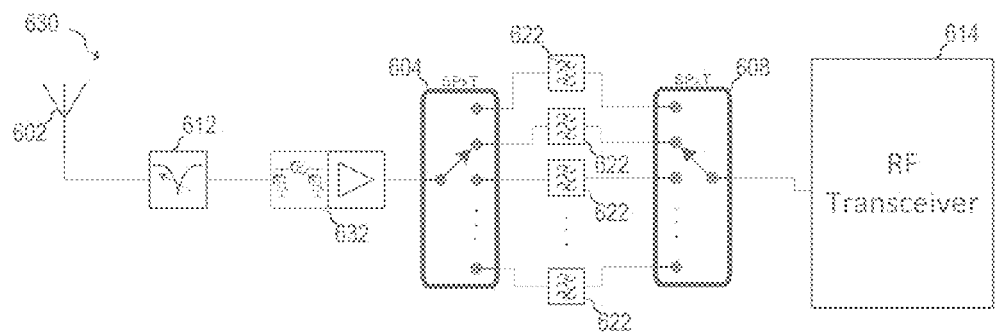

FIG. 6C illustrates an embodiment RF front-end 630 that is similar to RF front-end 620 illustrated in FIG. 6B, with the exception that LNA 632 is implemented as a bandpass LNA (BP-LNA) with integrated tunable/switchable BP behavior (e.g. matching) for improved in-Band-performance/far-off selectivity. LNA 632 may be implemented, for example, by using an LNA with a tunable or switchable input matching and/or output matching and/or frequency selective gain through frequency selective internal feedback (e.g. resonators). For example, FIG. 6H illustrates a BP-LNA that includes LNA 610 with a tunable series input impedance/matching network 652; FIG. 6I illustrates a BP-LNA that includes LNA 610 with a tunable series output impedance/matching network 654; FIG. 6J illustrates a BP-LNA that includes LNA 610 with a tunable shunt input impedance/matching network 656; and FIG. 6K illustrates a BP-LNA that includes LNA 610 with a tunable shunt input impedance/matching network 658. Tunable impedance/matching networks 652, 654, 656 and 658 may be implemented using tunable matching networks known in the art, such as LC and/or resonator circuits having at least one tunable, selectable and/or switchable reactive circuit element.

Figure 6D:
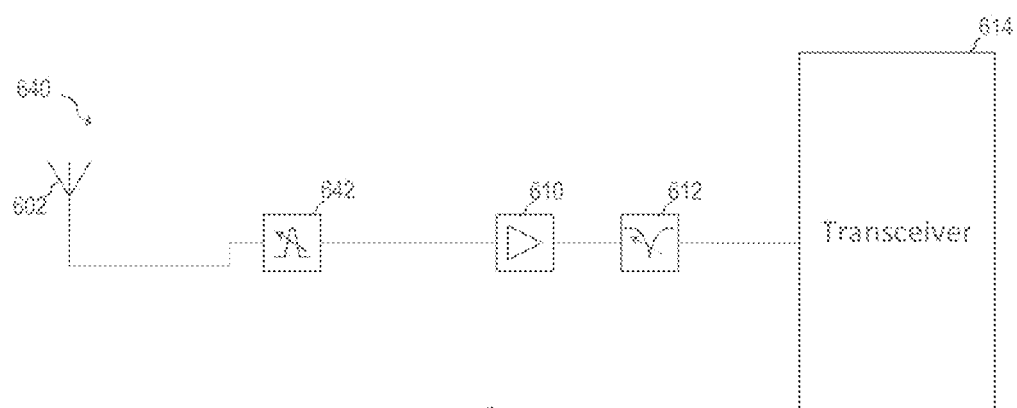
Figure 6E:
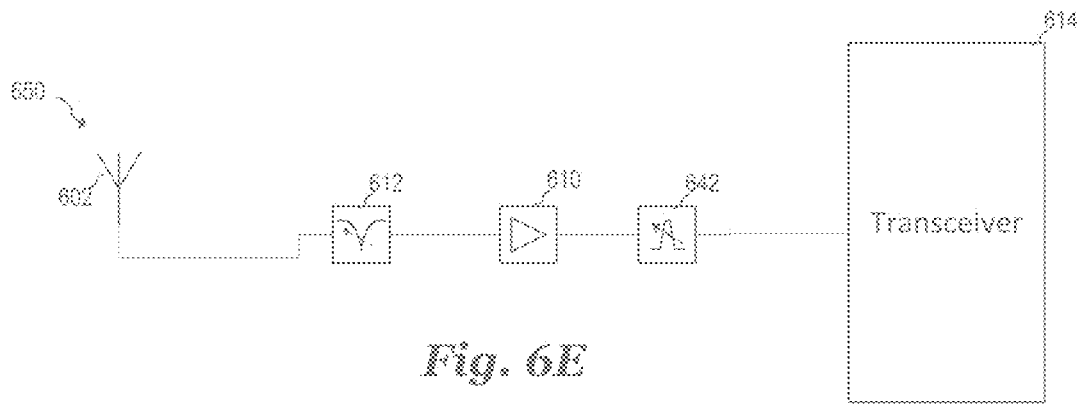
Figure 6F:
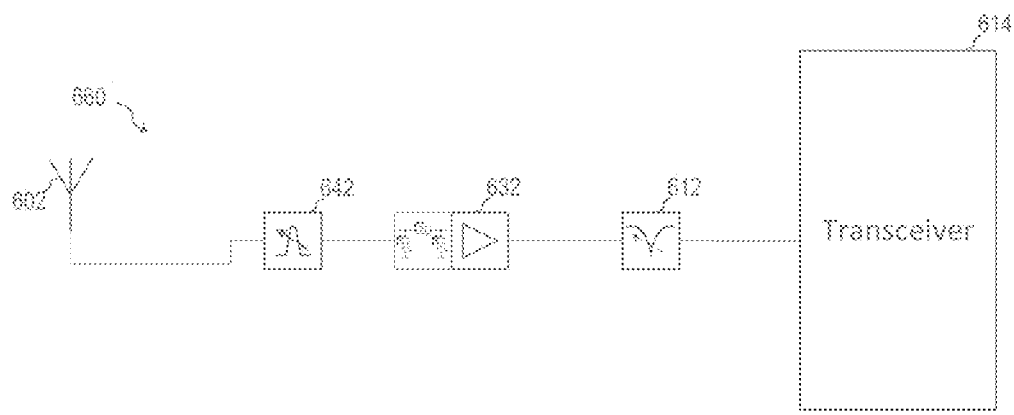
Figure 6G:
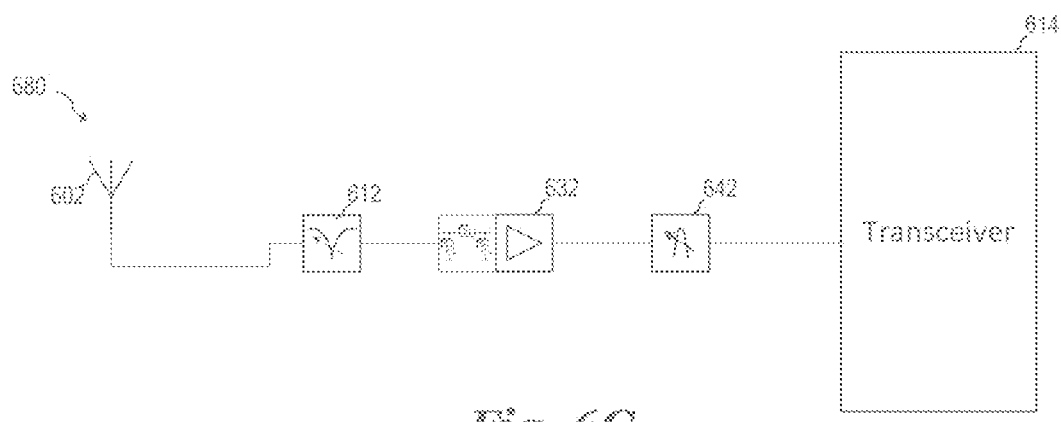
Figure 6H:
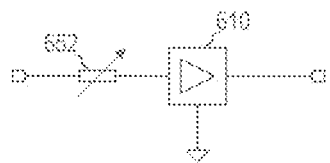
FIGS. 6H-6L illustrate schematics of bandpass LNAs that can be used to implement the embodiment RF systems of FIGS. 6C, 6F and 6G.
Figure 6I:
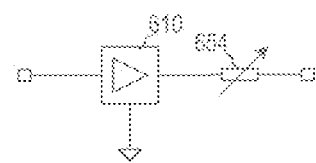
Figure 6J:
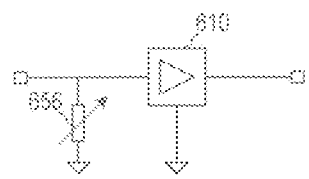
Figure 6K:
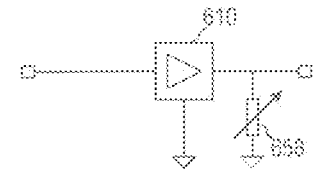
Figure 6L:
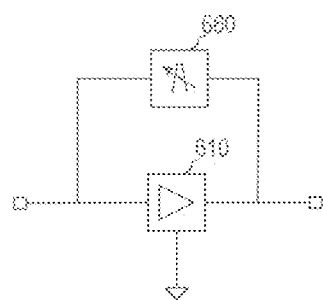

FIG. 6L illustrates a BP-LNA that includes LNA 610 with a tunable bandpass filter 660 coupled between the output of LNA 610 and the input of LNA 610. Tunable bandpass filter 660 may be implemented using tunable bandpass filter structures known in the art including LC and/or resonator circuits having at least one tunable, selectable and/or switchable reactive circuit element or using tunable bandpass filter structures known in the art. In alternative embodiments, a BP-LNA may be implemented using a combination input matching networks, output matching networks and tunable filters shown in FIGS. 6H-6K.

FIG. 6D illustrates an embodiment RF front-end 640 that includes tunable bandpass filter 642 followed by LNA 610. Tunable band reject/notch filter 612 is coupled to the output to LNA 610 and may be used to reject strong interferers. In various embodiments, tunable bandpass filter 642 is implemented using tunable bandpass filter structures known in the art or may be implemented using tunable acoustic filter structures disclosed in U.S. Provisional Application Nos. 62/595,898 and 62/641,664, as well as co-pending U.S. patent application Ser. Nos. 16/210,703, 16/210,732, 16/210,756, 16/210,788 and 16/210,812. In some embodiments, tunable bandpass filter 642 is a continuously tunable bandpass filter. RF front-end 640 is suitable for systems having a relatively low receive bandwidth, including, but not limited to single carrier LTE, UMTS, narrow-BW LTE, multiband internet of things (TOT), and multiband wearables/watches. RF front-end 640 is also suitable for systems having one dominating interferer with a known frequency and a limited bandwidth, such as an FDD system that transmits at frequencies close to a receive frequency. In some embodiments, band reject/notch filter 612 coupled to the output to LNA 610 may be omitted.

FIG. 6E illustrates an embodiment RF front-end 650 that includes tunable band reject/notch filter 612 followed by LNA 610. Tunable band reject/notch filter 612 may be used, for example, to suppress dominating interferers with good in-band insertion loss. Tunable bandpass filter 642 is coupled to the output to LNA 610. System 650 is suitable for systems having a relatively low receive bandwidth, including, but not limited to single carrier LTE, UMTS, narrow-BW LTE, multiband internet of things (IOT), and multiband wearables/watches. RF front-end 650 is also suitable for systems having one dominating interferer with a known frequency and a limited bandwidth, such as an FDD system that transmits at frequencies close to a receive frequency. In some embodiments, tunable bandpass filter 642 coupled to the output of LNA 610 may be omitted.

FIG. 6F illustrates an embodiment RF front-end 660 that includes tunable bandpass filter 642 followed by tunable BP-LNA 632. Tunable band reject filter 612 is coupled to the output of tunable BP-LNA 632 and may be used to reject strong interferers. RF front-end 660 is similar to RF front-end 640 shown in FIG. 6D with the exception that LNA 610 is replaced by BP-LNA 632, which provides better far-off selectivity in some embodiments. In some embodiments, tunable band reject/notch filter 612 coupled to the output of tunable BP-LNA 632 may be omitted.

FIG. 6G illustrates an embodiment RF front-end 680 that includes tunable band reject filter 612 followed by tunable BP-LNA 632. Tunable bandpass filter 642 is coupled to the output of tunable BP-LNA 632. RF front-end 680 is similar to RF front-end 650 shown in FIG. 6E with the exception that LNA 610 is replaced by tunable BP-LNA 632, which provides enhanced far-off selectivity in some embodiments. In some embodiments, tunable bandpass filter 642 coupled to the output of tunable BP-LNA 632 may be omitted.

The filters depicted in the embodiments herein can be implemented, for example, using filter structures shown in FIGS. 7A-7N, 8A-8E, 9A-9C, 10A-10D, 11A-11C and 12A-12E and 13A-13E discussed below. These filters may be implemented using capacitors 702, inductors 704, capacitors 705, acoustically coupled resonators 706 having two coupled resonators, tunable resonators 708, acoustically coupled resonator structure 710 having a plurality of series resonators acoustically coupled to each other, parallel resonant tuning circuits 712 having a tunable capacitor coupled in parallel with an inductor, series parallel resonant tuning circuits 714 having a tunable capacitor coupled in series with an inductor, resonators 716, and tunable capacitors 718. In some embodiments, these filters may be implemented using the physical acoustic filter structures and tunable acoustic filter structures disclosed in U.S. Provisional Application Nos. 62/595,898 and 62/641,664, as well as co-pending U.S. patent application Ser. Nos. 16/210,703, 16/210,732, 16/210,756, 16/210,788 and 16/210,812.

Figure 7A:
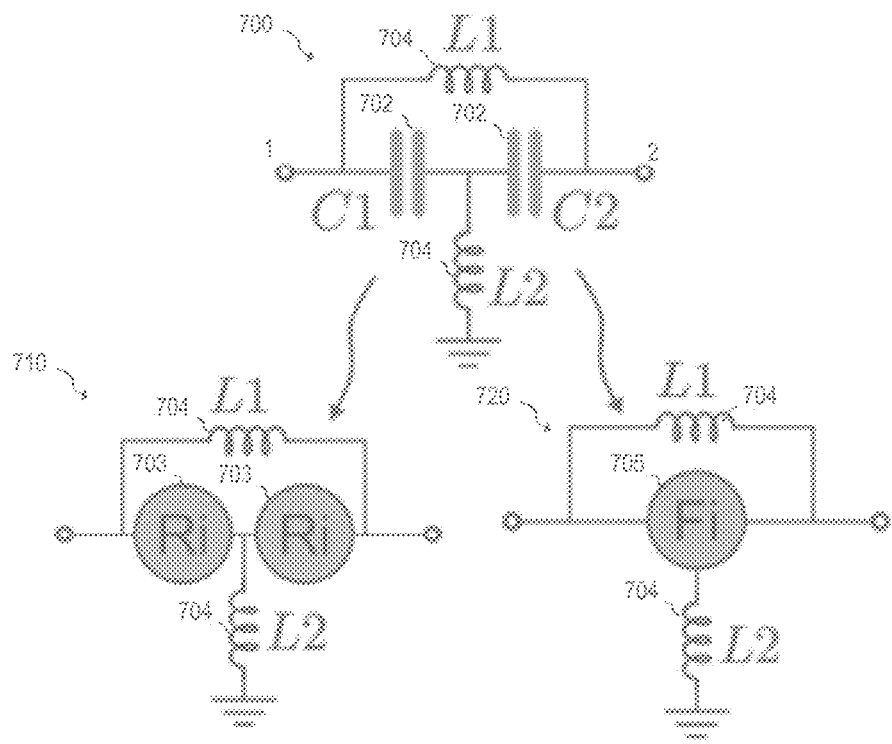
FIGS. 7A-7N, 8A-8E, 9A-9C, 10A-10G, 11A-11C and 12A-E and 13A-13E illustrate various filter structures that can be used to implement the various filters utilized in embodiments of the present invention.
Figure 7B:
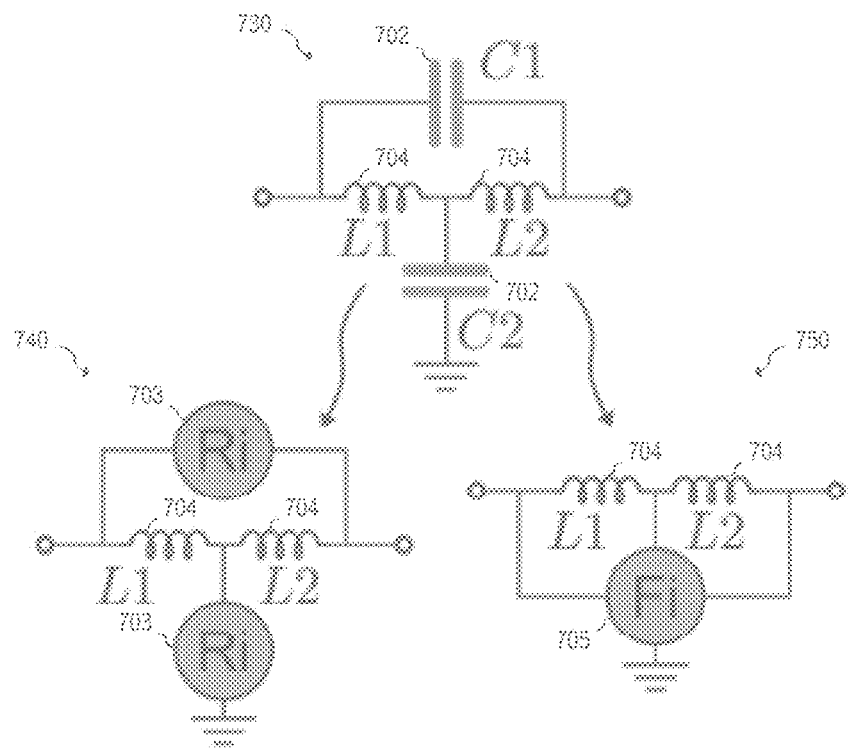
Figure 7C:
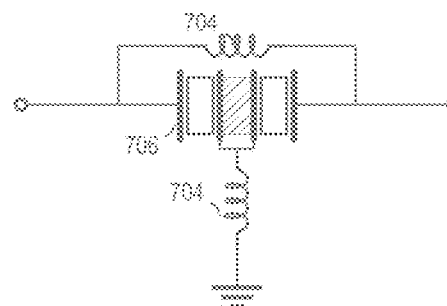
Figure 7D:
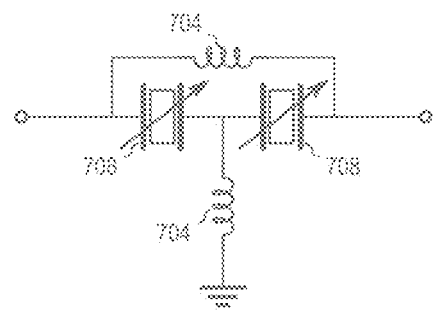
Figure 7E:
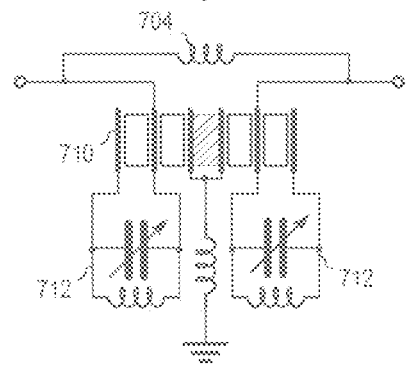
Figure 7F:
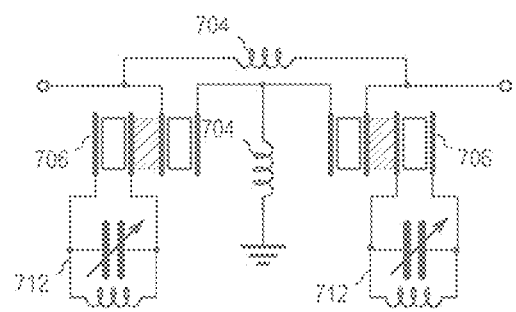
Figure 7G:
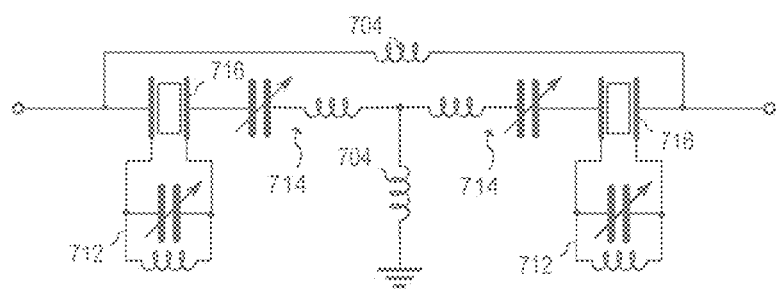
Figure 7H:
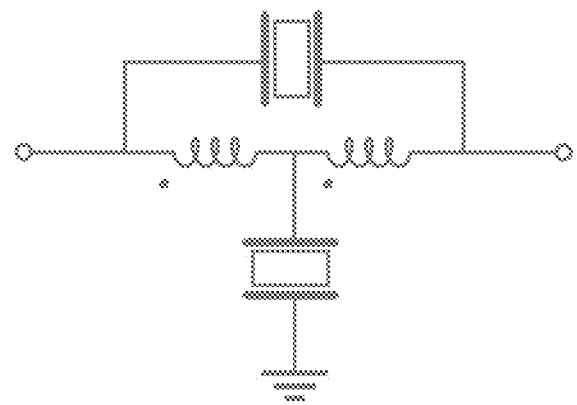
Figure 7I:
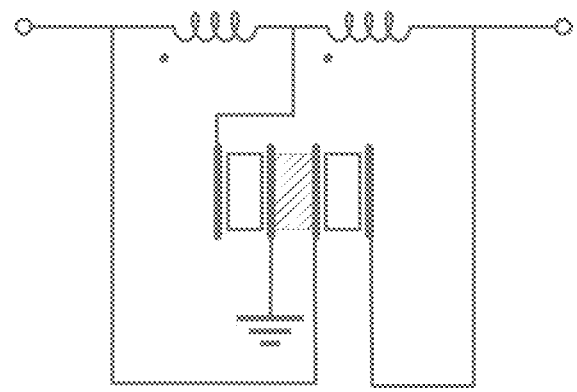
Figure 7J:
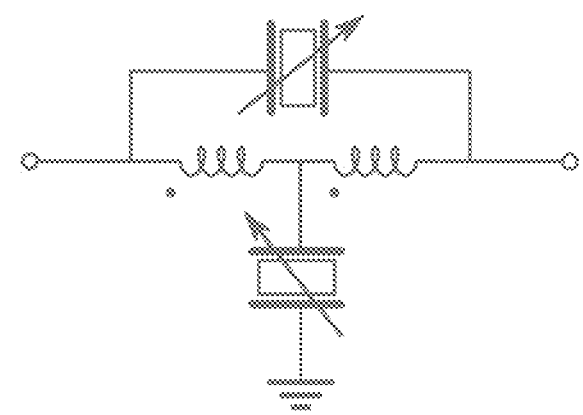
Figure 7K:
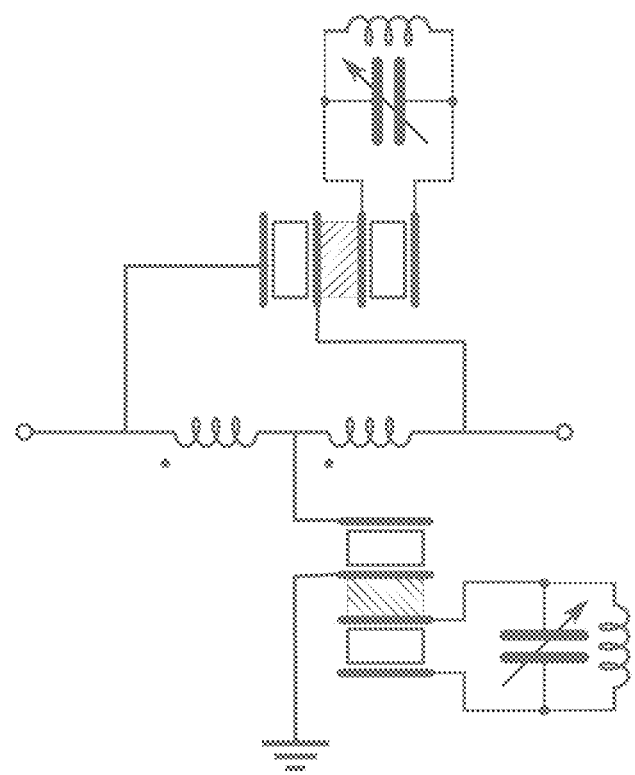
Figure 7L:
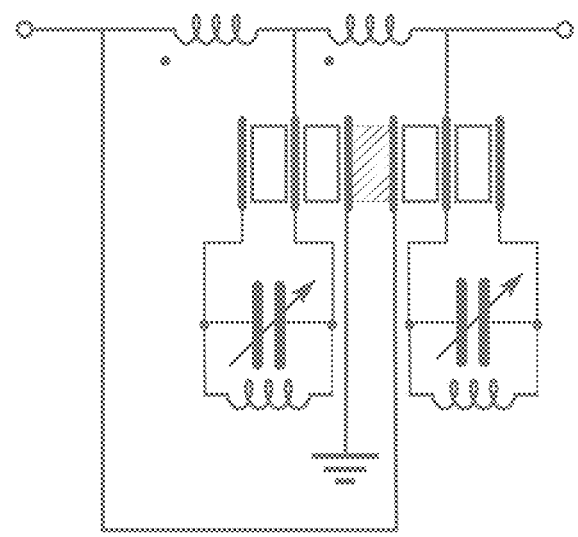
Figure 7M:
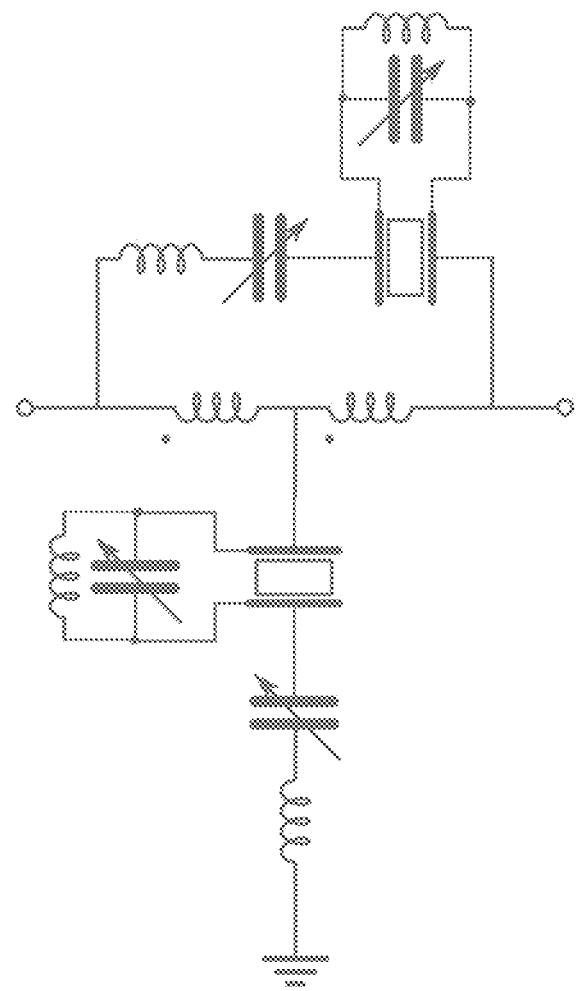
Figure 7N:
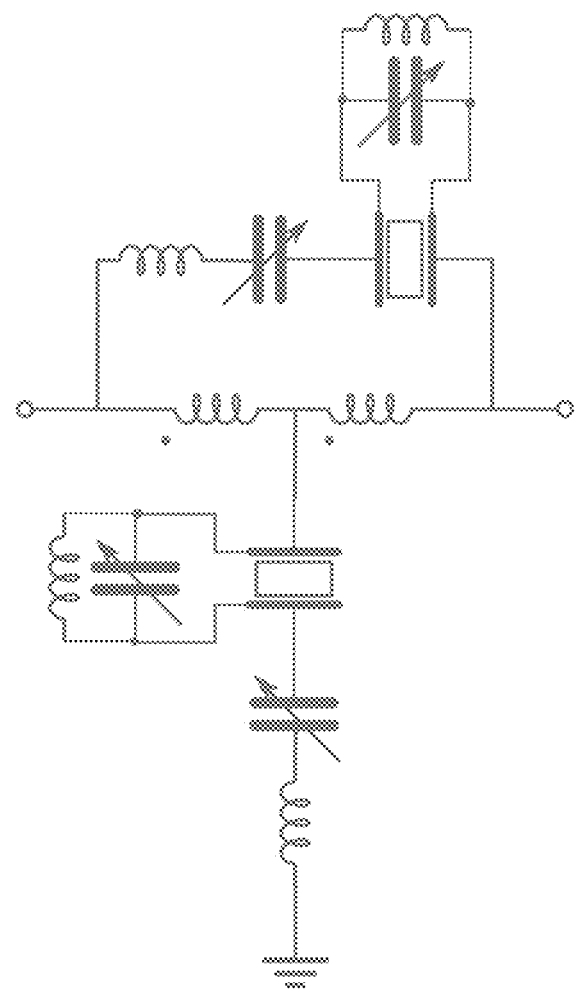
Figure 8A:
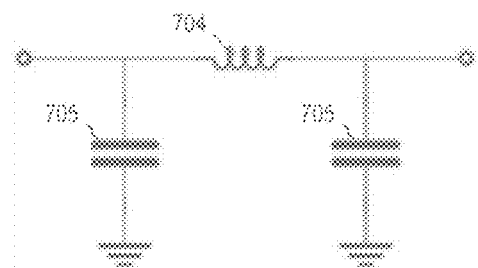
Figure 8B:
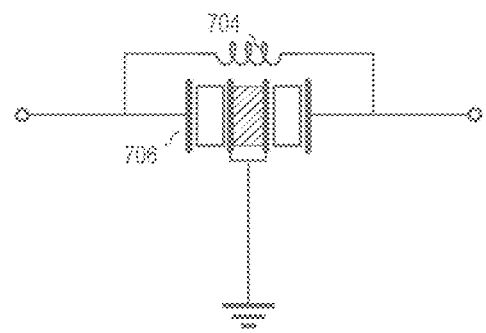
Figure 8C:
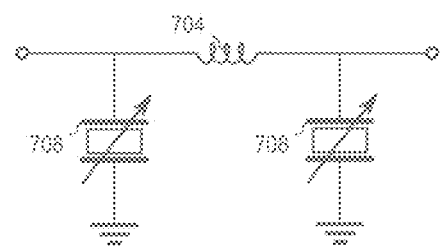
Figure 8D:
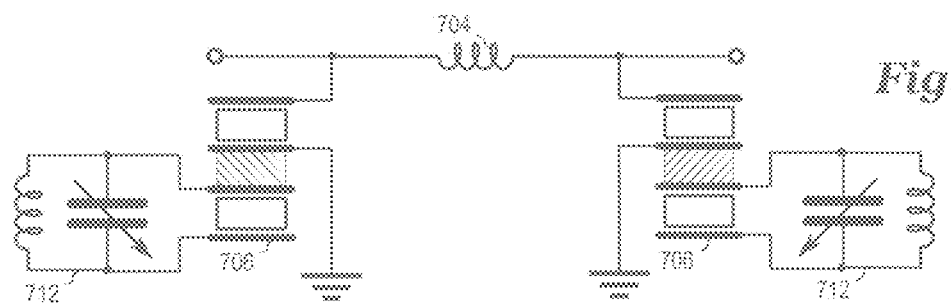
Figure 8E:
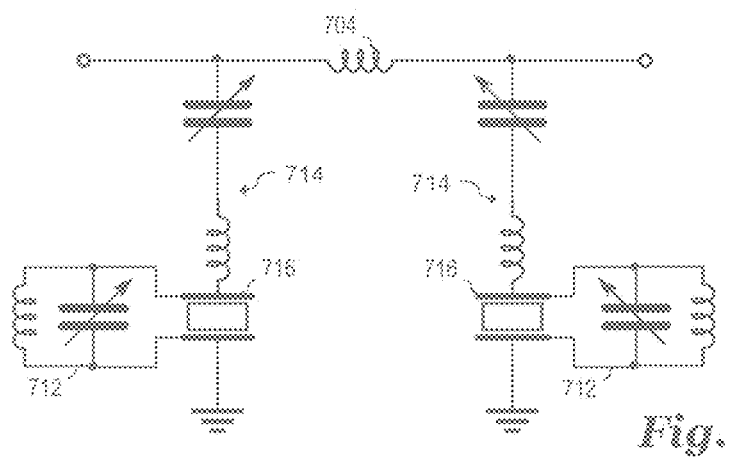

FIGS. 7A-7N illustrate various bridged T all-pass circuits that can be used to implement the various band stop filters utilized in all embodiments described with respect to the embodiment circuits of FIGS. 2A-2D, 3A-3N, 4A-4D. 6A-6G, 15B, 17A-17C, 18A-18D, 19A-19C, 20A-20B, 21A-21B and 22.

FIG. 7A illustrates a bridged T all-pass circuit 700 that includes a "T" structure having capacitors 702 with capacitance values C1 and C2 coupled in series between nodes 102, an inductor 704 having an inductance value of L1 coupled between ports 1 and 2, and an inductor 704 having an inductance L2 coupled to ground. Bridged T all-pass circuit 700 has a flat amplitude response between ports 1 and 2 when the following conditions are met:

$$L1 = \frac{Z_0}{\omega_0} \quad (1)$$

$$L2 = \frac{Z_0}{2\omega_0} \quad (2)$$

$$C1 = C2 = \frac{1}{Z_0 \omega_0}, \quad (3)$$

where $Z_0$ is the characteristic impedance that loads ports 1 and 2 and $\omega_0$ is the radian frequency in which the phase response between ports 1 and 2 reaches 90°. In various embodiments, bridged T all-pass circuit 700 can be configured to have a band stop response when capacitors 702 are each replaced by a 2-port resonators 703 as shown with respect to circuit 710 or are both replaced by a 3-port resonator 705 as shown with respect to circuit 720. Specific examples of such embodiments, as well as embodiments that utilize other LC networks, or combinations of LC networks and resonators are illustrated in FIGS. 7C to 7G. In such embodiments, the out of band response (outside the band stop frequencies) maintains its original all-pass characteristics.

In a further embodiment, a band stop response may be achieved by detuning the values for L1, L2, C1 and/or C2 from their values defined in equations (1), (2) and (3) shown above. Detuning may be used to achieve band stop responses with higher bandwidths.

FIG. 7B illustrates a bridged T all-pass circuit 730 that includes a "T" structure having inductors 704 with inductance values L1 and L2 coupled in series between nodes 102, a capacitor 702 having capacitance value of C1 coupled between ports 1 and 2, and capacitor 702 having a capacitance value of C2 coupled to ground. Bridged T all-pass circuit 730 has a flat amplitude response between ports 1 and 2 when the following conditions are met:

$$L1 = L2 = \frac{Z_0}{\omega_0} \quad (4)$$

$$C1 = \frac{1}{2Z_0 \omega_0} \quad (5)$$

$$C2 = \frac{2}{Z_0 \omega_0}. \quad (6)$$

In various embodiments, bridged T all-pass circuit 730 can be configured to have a band stop response when inductors 704 are each replaced by a 2-port resonators 703 as shown with respect to circuit 740 or are both replaced by a 3-port resonator 705 as shown with respect to circuit 750. Specific examples of such embodiments, as well as embodiments that utilize other LC networks, or combinations of LC networks and resonators are illustrated in FIGS. 7H to 7N. In such embodiments, the out of band response (outside the band stop frequencies) maintains its original all-pass characteristics.

In a further embodiment, a band stop response may be achieved by detuning the values for L1, L2, C1 and/or C2 from their values defined in equations (4), (5) and (6) shown above. Detuning may be used to achieve band stop responses with higher bandwidths.

FIGS. 8A-8E illustrate various Pi Low-Pass based circuits that can be used to implement the various band stop filters utilized in all embodiments described with respect to the embodiment circuits of FIGS. 2A-2D, 3A-3N, 4A-4D. 6A-6G, 15B, 17A-17C, 18A-18D, 19A-19C, 20A-20B, 21A-21B and 22.

Figure 9A:
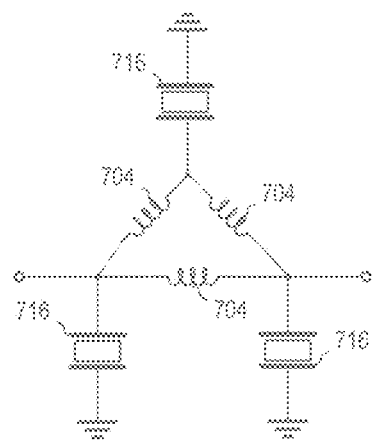
Figure 9B:
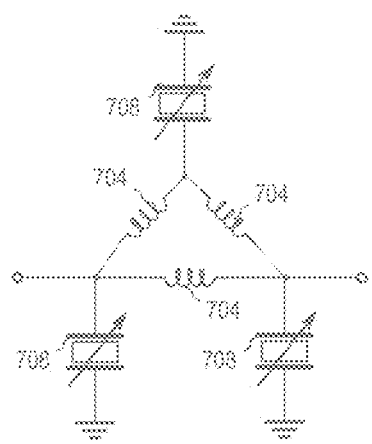
Figure 9C:
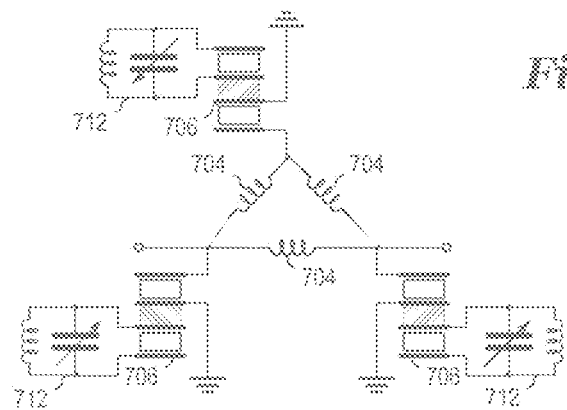
Figure 11A:
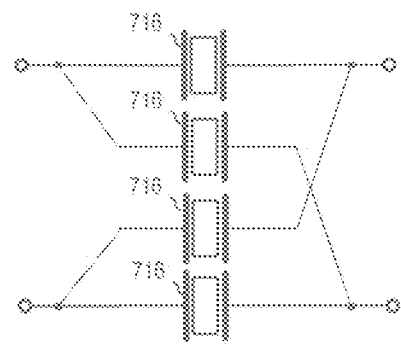
Figure 11B:
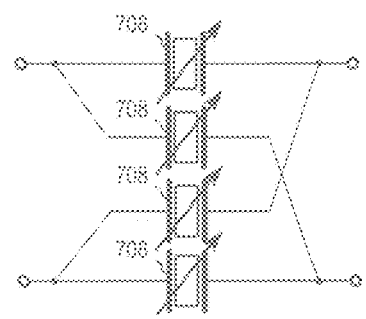
Figure 11C:
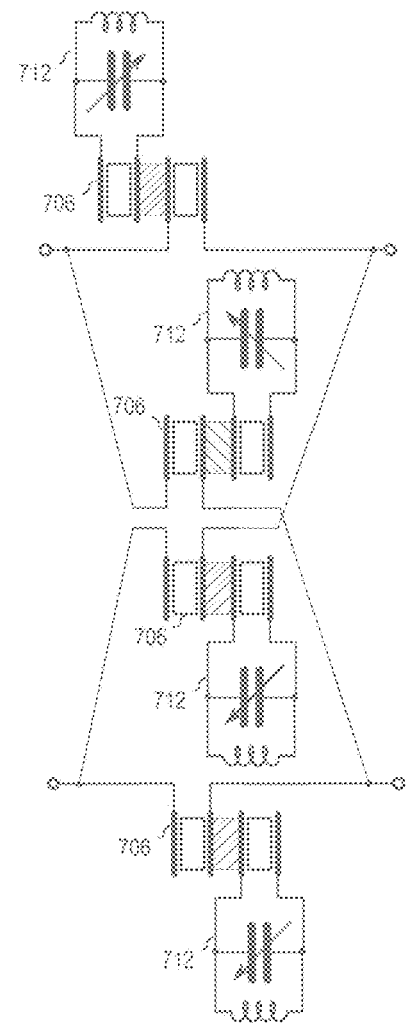
Figure 12A:
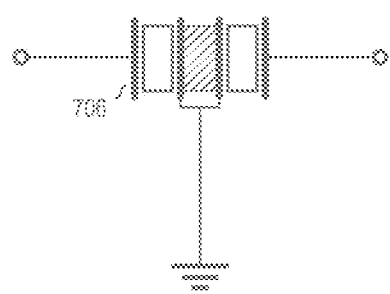
Figure 12B:
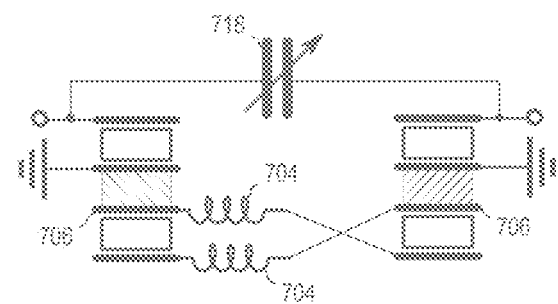
Figure 12C:
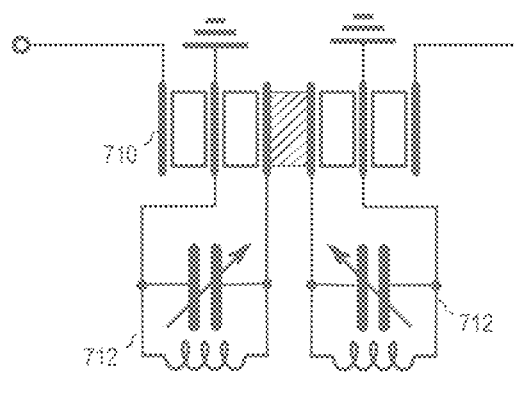
Figure 12D:
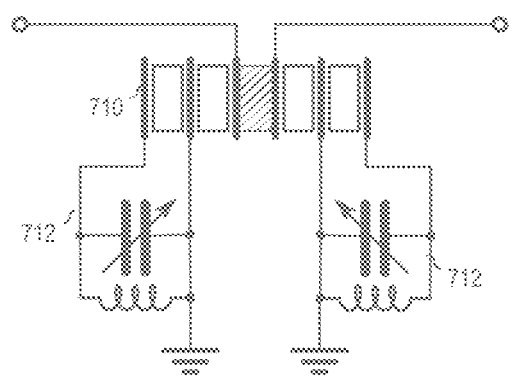
Figure 12E:
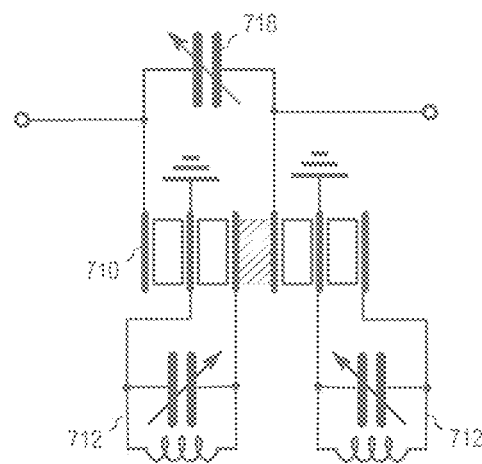
Figure 13A:
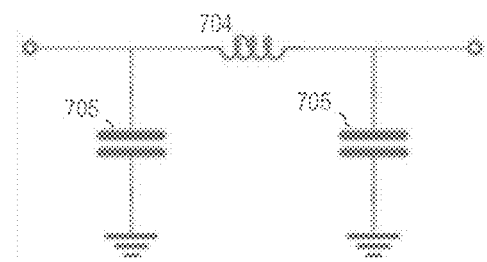
Figure 13B:
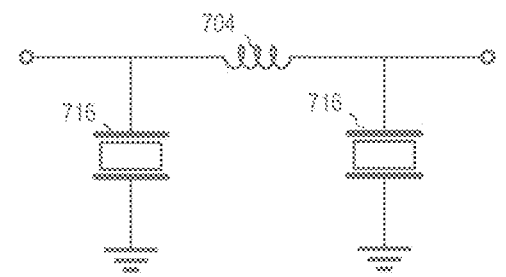
Figure 13C:
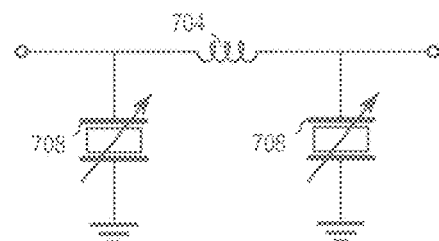
Figure 13D:
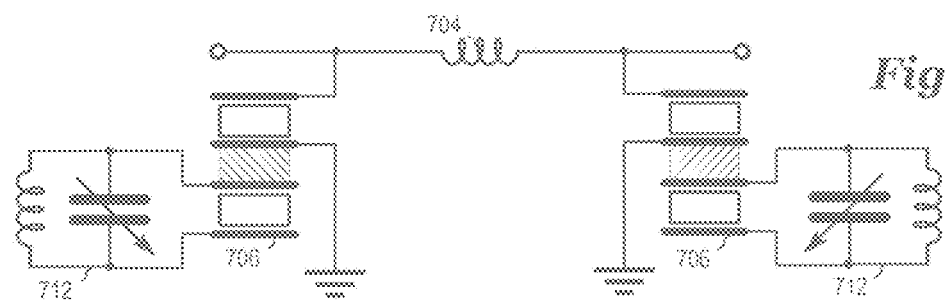
Figure 13E:
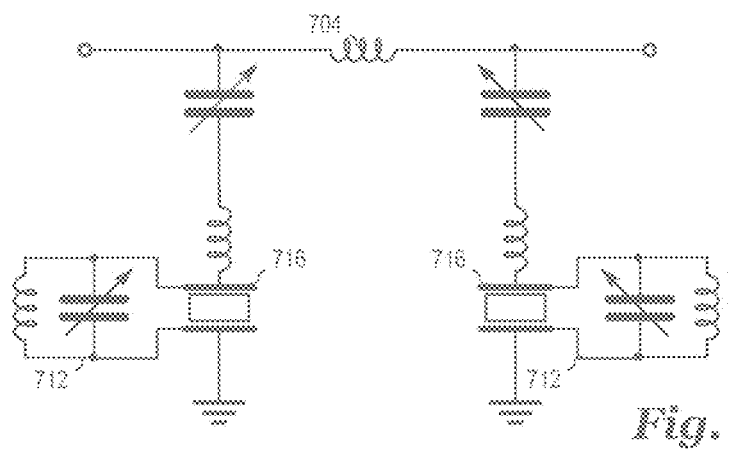

FIGS. 9A-9C illustrate various Triplet based circuits; FIGS. 10A-10G illustrate various ladder based circuits; and FIGS. 11A-11C illustrate various lattice based circuits that can be used to implement the various band stop and band-pass filters utilized in all embodiments described with respect to the circuits of FIGS. 2A-2D, 3A-3N, 4A-4D, 6A-6G, 15A-15B, 17A-17C, 18A-18D, 19A-19C, 20A-20B, 21A-21B, 22, 23, 24A, 25, 26A and 27.

FIGS. 12A-12E illustrate various CRF based circuits; and FIGS. 13A-13E illustrate various Pi Low-Pass based circuits that can be used to implement the various bandpass filters utilized in all embodiments described with respect to the embodiment circuits of FIGS. 2A-2D, 3A-3N, 4A-4D, 6A-6G, 15A, 17A-17C, 21A-21B, 22, 23, 24A, 25, 26A and 27.

As shown, the embodiment filter structures of FIGS. 7A-7F, 8A-8E, 9A-9C, 10A-10D, 11A-11C and 12A-12E and 13A-13E, can be implemented using a variety of LC filter structures, acoustic filter structures, and tunable LC filter/acoustic filter structures.

Figure 14:
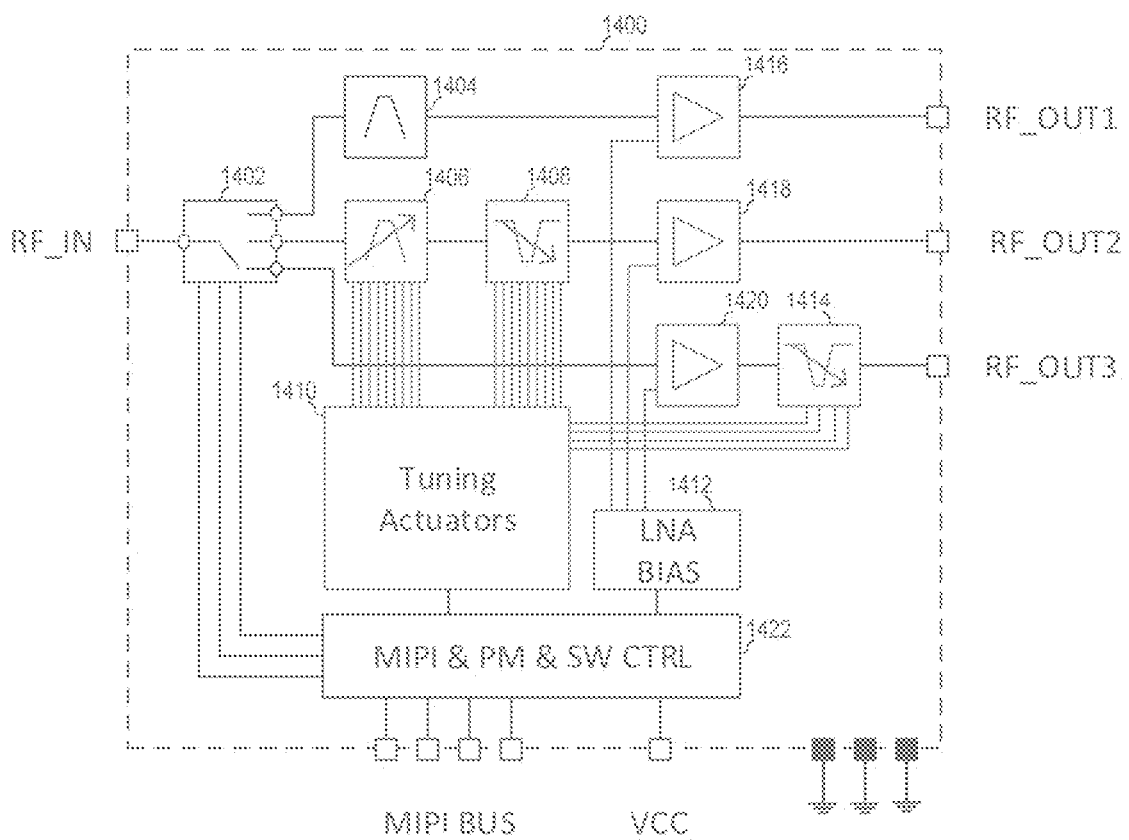
FIG. 14 illustrates a block diagram of an embodiment RF front-end system.

FIG. 14 illustrates a block diagram of an example system 1400 in a package according to an embodiment of the present invention. As shown, system 1400 includes antenna switch 1402 that is coupled to a plurality of RF signal paths having respective outputs RF_OUT1, RF_OUT1 and RF_OUT3. The first RF path includes a fixed bandpass filter 1404 followed by LNA 1416; the second RF path includes tunable bandpass filter 1406 and tunable band stop/notch filter 1408 followed by LNA 1418; and the third RF path includes LNA 1420 followed by tunable band stop/notch filter 1414. These RF signal paths may be implemented using embodiment circuits, methods and physical implementations described herein. In an embodiment, tuning actuators 1410 are used to provide tuning and control signals to tunable bandpass filter 1406 and to tunable band stop/notch filters 1408 and 1414. LNA bias generator 1412 is used to provide bias currents and voltages to LNAs 1416, 1418 and 1420. In some embodiments, antenna switch 1402, tuning actuators 1410 and LNA bias generator 1412 are controllable via a digital bus, such as a MIPI bus, via digital interface/control circuit 1422. Alternatively, other digital interface types may be used. It should be understood that the configuration of system 140000 is just one example of many possible system implementations. In alternative embodiments, a different number of RF signal paths and/or different embodiment filter configurations may be implemented. In various embodiments, system 1404 may be implemented as multiple components on a package substrate, or on a single monolithic semiconductor substrate.

Advantages of embodiments include the ability to implement a flexible and physically compact RF front end that is able to withstand strong interferers, such as high amplitude transmit signals generated by the RF system when operating in an FDD mode. By using a tunable band reject filter in conjunction with a lower selectivity tunable bandpass filter, extra size overhead due to the increased size and number of higher order RF filters can be reduced. In addition, the use of tunable filters allows for the ability to tune the system to a variety of RF channels and the ability to reject interferers in a variety of RF environments without the need for system redesign in some embodiments.

Figure 15A:
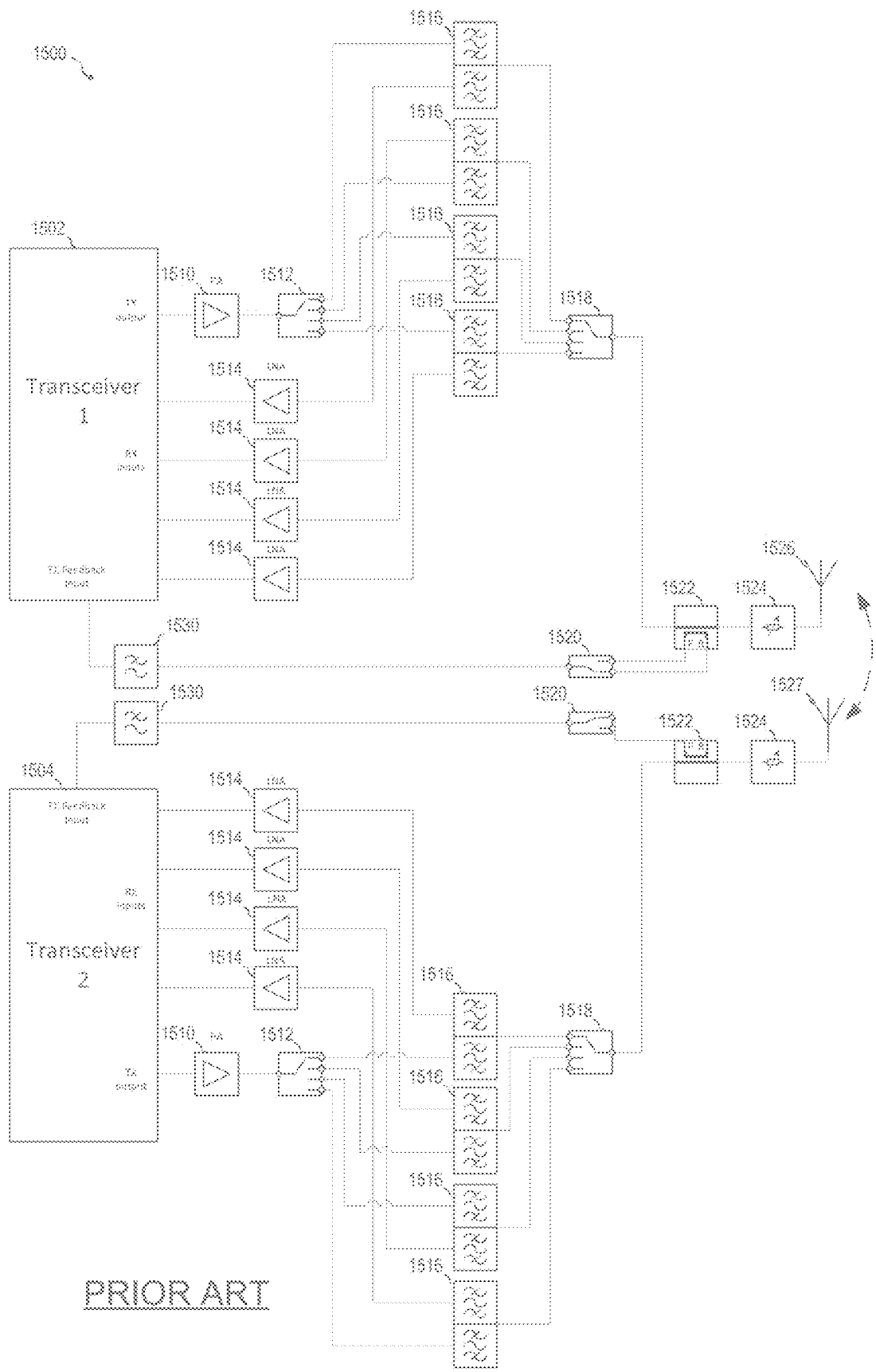
FIGS. 15A and 15B illustrate conventional embodiments of multi-band multi-transceiver front end circuits.
Figure 15B:
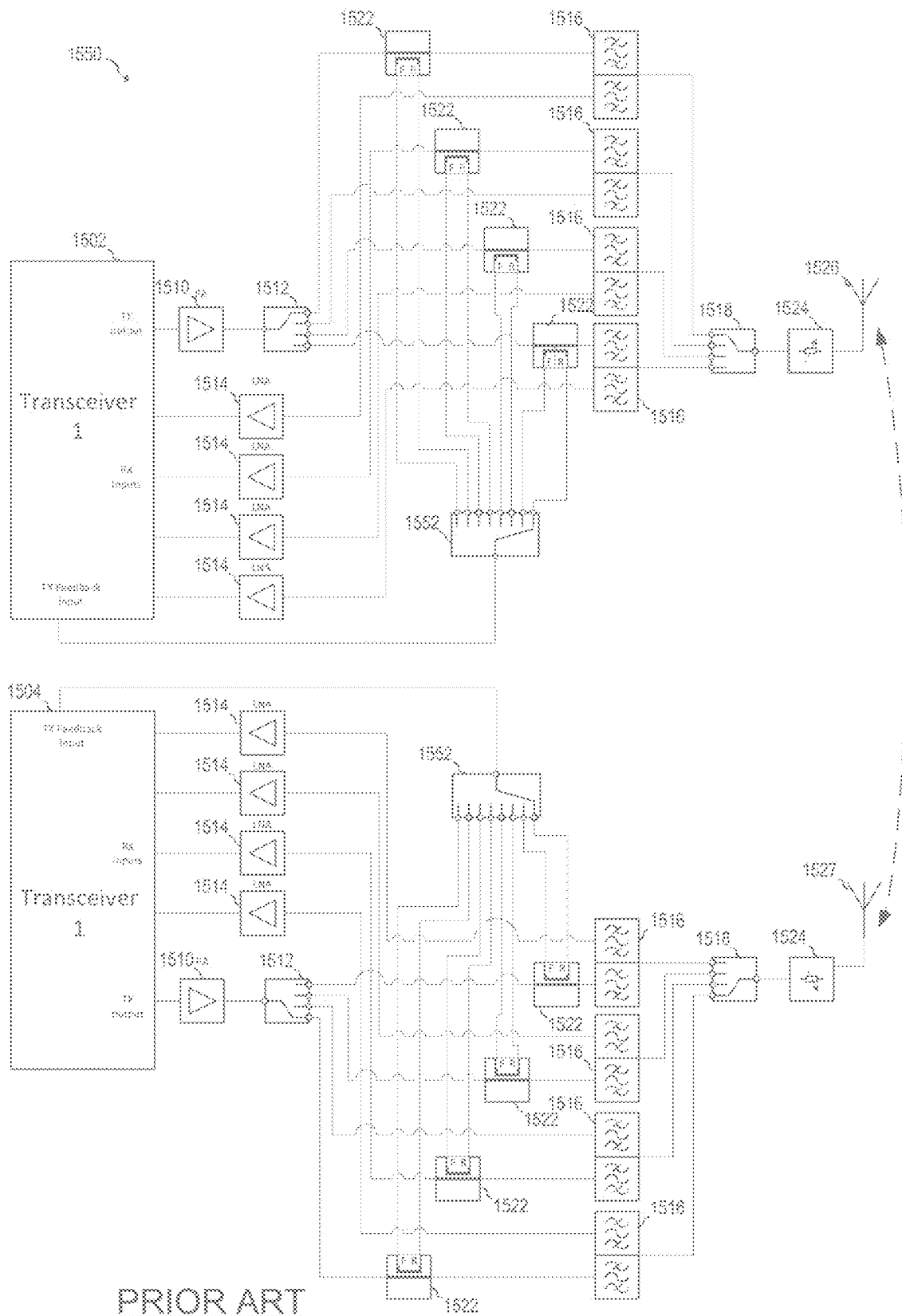

FIGS. 15A and 15B illustrate conventional embodiments of multi-band/channel multi-transceiver front end circuits that might be found, for example, in Cellular Phones, Smart Watches, Wearables, IoT (Internet-of-Things) devices. In such devices, multiple transmitters may operate simultaneously using Uplink Carrier Aggregation (ULCA) or Dual Connectivity. During operation, the amount of power transmitted by each transmitter is controlled in a closed-loop fashion by measuring the power transmitted by the device and adjusting the transmitted power to meet a target using a feedback loop. This feedback loop might be used to measure the quality of the transmitted output signal (for e.g. adaptive digital pre-distortion) or for antenna impedance measurements (for e.g. closed loop antenna tuning). Both techniques may be used to optimize power consumption and improve output signal performance.

However, in systems having more than one active transmitter, interference signals may combine with the transmit signal at the point where a particular transmit signal is to be measured for a particular transmitter. These interference signals may be generated, for example, by other transmitters in the system, and/or may be generated by mixing of various signals present in the system that creates mixing products that fall within the bandwidth of the transmit power measurement circuit. These interferer signals can lead to degradation of the accuracy of the feedback path.

FIG. 15A illustrates a conventional RF front end 1500 that includes two RF transceiver circuits 1502 and 1504. Each transceiver circuit 1502 and 1504 includes a single transmit output and four receiver inputs. The transmit output of each RF transceiver circuit 1502 and 1504 is coupled to a power amplifier 1510 followed by selection switch 1512 and duplexer circuits 1516. Selection switch 1518 selects a duplexer 1516 from among diplexers 1516 to be coupled to antenna 1526 or 1527 via directional coupler 1522 and tunable antenna matching circuit 124. Duplexers 1516 may have different passbands and may be configured to provide channel selectivity in the receive direction and transmit filtering in the transmit direction. LNAs 1514 have respective inputs coupled to corresponding duplexers 1516 and outputs coupled to respective channels of transceiver 1502 or 1504.

During operation, transceiver 1502 and 1504 measure the power, signal quality and/or other parameters of the signal transmitted by PA 1510 by measuring a coupled output of directional coupler 1522. Other measured parameters of the signal transmitted by PA 1510 may include, for example, signal phases and amplitudes used to determine antenna impedances and/or signal quality in adaptive pre-distortion systems. Switch 1520 may be used to select a coupler output that provides coupled incident power and coupled reflected power. Lowpass filter 1530 is used to filter coupled power provided by directional coupler 1522. In some circumstances, the frequency range of interfering signals may be within the passband of lowpass filter 1530. Such circumstances may arise, for example when RF transceivers 1502 and 1504 simultaneously transmit signals and the RF signal produced by one RF transceiver 1502 or 1504 is within the pass band of the lowpass filter 1530 associated with the other RF transceiver 1502 or 1504. Issues may also arise when the fundamental frequency of one RF transceiver 1502 or 1504 is not within the passband of the lowpass filter 1530 of the other RF transceiver 1502 or 1504. For example, when a distortion and/or intermodulation product of one RF transceiver may be within the passband of lowpass filter 1530 of the other RF transceiver. This situation may be exacerbated, for example, in situations where one RF transceiver 1502 or 1504 transmits at a much higher amplitude than the other transceiver 1502 or 1504. In such circumstances, the leaking TX signal and/or distortion products produced in one transmit channel may have a power that is on the same order of the transmit power produced by the other transmit channels at the TX feedback receiver input.

FIG. 15B illustrates a conventional RF front end 1550 that includes RF transceiver circuits 1502 and 1504. RF front end 1550 has a similar structure as RF front end 1500 of FIG. 15A with the exception that the each filtered RF channel has its own directional coupler 1522 associated with it. As shown, a directional coupler 1522 is coupled in series with each duplexer circuit 1516, and the outputs of all duplexer circuits 1516 are selectable via selection switch 1552. In RF front end 155o, the filtering provided by each duplexer 1516 attenuates transmitted signals produced by the other transmitters and provides better transmit signal accuracy over RF system 1500 shown in FIG. 15A. However, RF system 1550 has an increased component count and system complexity. As shown, RF system 1500 has four times as many directional couplers 155 and two additional RF selection switches 1552. Another issue with the architecture shown in FIG. 15B is that having the measurement plane defined by the coupler position "in front of" the duplexers does not include the duplexer insertion loss in (antenna) power measurements and makes other measurements, such as antenna impedance measurements, more complicated to perform.

Figure 16A:
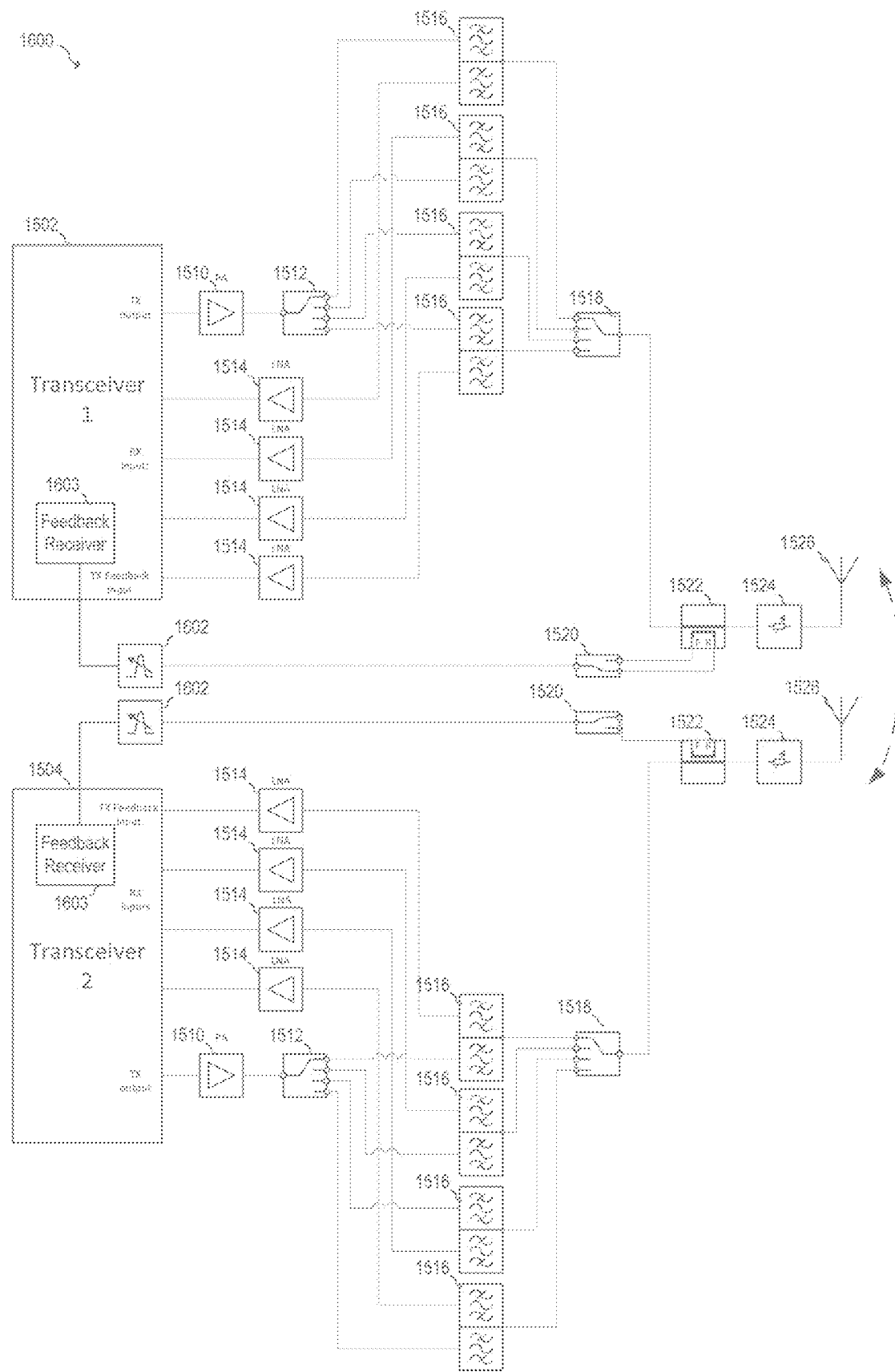
FIGS. 16A and 16B illustrate multi-band multi-transceiver front end circuits according to embodiments of the present invention.

FIG. 16A illustrates an RF system 1600 according to an embodiment of the present invention. The architecture of RF system 1600 is similar to that of RF system 1500 shown in FIG. 15A, with the exception that lowpass filter 1530 coupled to the transmit feedback input of RF transceivers 1502 and 1504 are replaced by tunable bandpass filters 1602. By using tunable bandpass filters 1602, interference signals produced within the system can be more effectively filtered from the transmit signal (e.g. power, signal quality and antenna impedance measurements). In addition, the more accurate transmit power measurements may be made without using a separate directional coupler and associated RF switches for each diplexer 1516 in some embodiments.

During operation, the center frequency of tunable bandpass filters 1602 may be tuned to have a center frequency that corresponds with the center frequency of the transmit signal and/or a passband that includes the transmitted frequency. Feedback receiver 1603 of RF transceiver 1502 or 1504 measures one or more filtered coupled signal parameters (e.g. power, phase, signal quality, error vector magnitude (EVM), linear and non-linear distortion) of the signal output from bandpass filter 1602. This measured power may be used, for example, to determine, adjust or update the power of the transmit signal provided to power amplifier 1610. In embodiments directed to feedback receivers, these measurements may be used to implement antenna impedance measurements or transmit signal quality measurements for adaptive transmit signal predistortion. In some embodiments, each RF transceiver circuit 1502 or 1504 produces the tuning signal for its associated tunable bandpass filter 1602. In some embodiments, the tuning signals for the tunable bandpass filters 1602 are produced by a central controller.

In various embodiments, tunable bandpass filters 1602 are each implemented using tunable bandpass filter structures known in the art or may be implemented using tunable acoustic filter structures disclosed in U.S. Provisional Application Nos. 62/595,898 and 62/641,664, as well as copending U.S. patent application Ser. Nos. 16/210,703, 16/210,732, 16/210,756, 16/210,788 and 16/210,812. In some embodiments, tunable bandpass filter 1602 is a continuously tunable bandpass filter. Tunable bandpass filter 1602 may be implemented using the tunable acoustic filter based bandpass structures illustrated in FIGS. 9A-9C, 10A-10G, 11A-11C, 12A-12E and 13A-13E. In some embodiments, embodiment bandpass filter 1602 may have an order of 3.5 and greater and may contain 5-7 resonators. Alternatively, lower order filters or filters having greater or fewer than 5-7 resonators may be used.

Figure 16B:
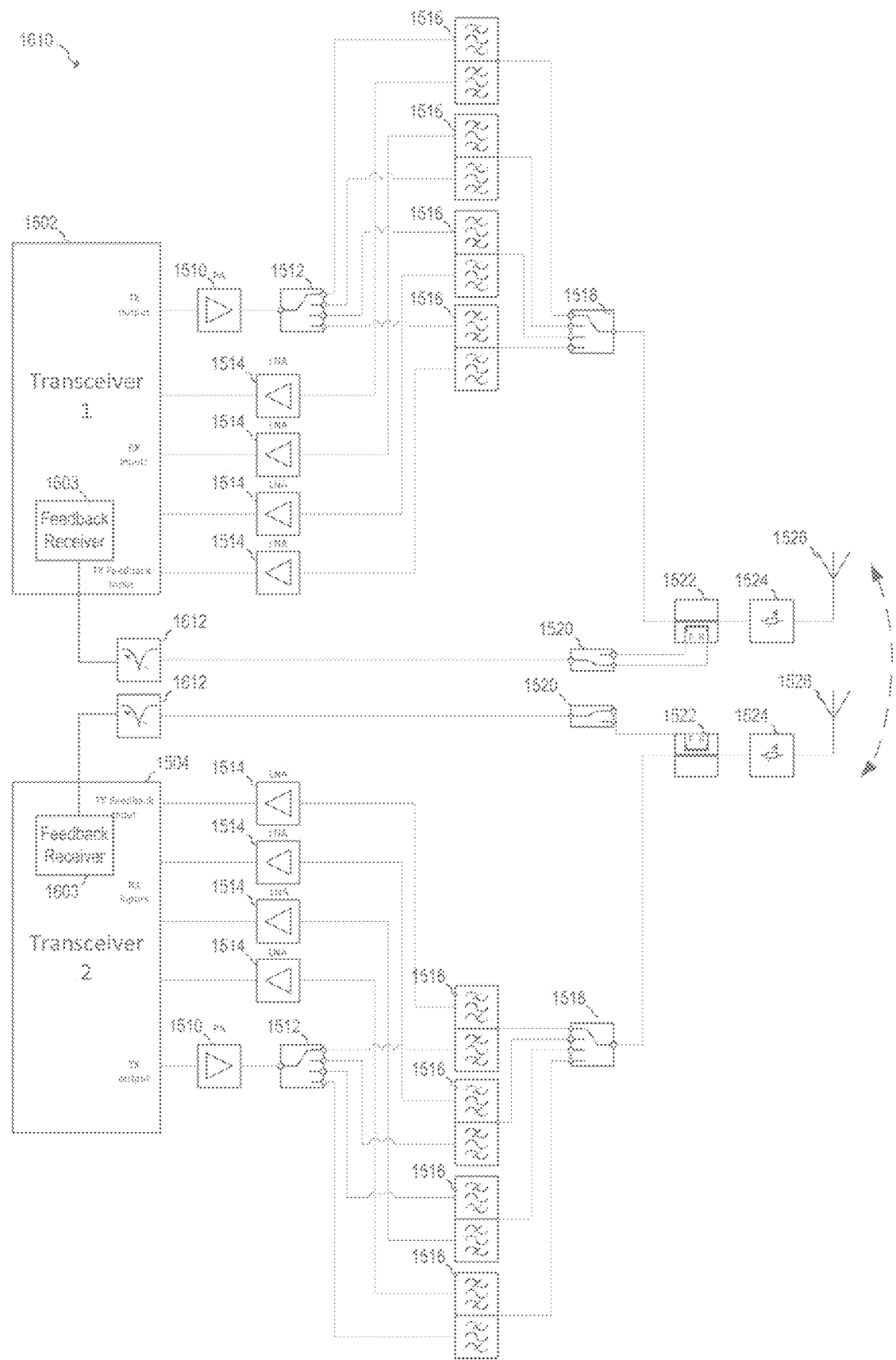

FIG. 16B illustrates an RF system 1600 according to a further embodiment of the present invention. The architecture of RF system 1600 is similar to that of RF system 1500 shown in FIG. 15A, with the exception that lowpass filter 1530 coupled to the transmit feedback input of RF transceivers 1502 and 1504 are replaced by tunable band stop filters 1612. By using tunable band stop filters 1602, interference signals produced within the system can be selectively removed from the transmit signal measurements. In addition, more accurate transmit signal measurements may be made without using a separate directional coupler and associated RF switches for each diplexer 1516. In some embodiments, two or more tunable band stop filters 1612 may be cascaded in order to reject signals at multiple frequencies.

During operation, the center frequency of tunable band stop filters 1602 may be turned to have a center frequency that corresponds with the center frequency of the transmit signal and/or a center frequency that corresponds to a frequency of a known or anticipated interferer. Feedback receiver 1603 of RF transceiver 1502 or 1504 measures the filtered coupled signal parameters (e.g. power, phase, signal quality) output from bandpass filter 1602. This measured power may be used, for example, to determine, adjust or update the power of the transmit signal provided to power amplifier 1610. In some embodiments each RF transceiver circuit 1502 or 1504 produces the tuning signal for its associated tunable band stop filter 1612. In such embodiments each RF transceiver circuit 1502 or 1504 has knowledge of the frequency over which the other RF transceiver circuit 1502 or 1504 is transmitting. In other embodiments, the RF transceiver circuit 1502 produces the tuning signal associated with the band stop filter 1612 associated with RF transceiver circuit 1504 and vice versa. In some embodiments, tuning signals for the tunable band stop filters 1612 are produced by a central controller.

In various embodiments, tunable band stop filters 1612 are each implemented using tunable band stop filter structures known in the art or may be implemented using tunable acoustic filter structures disclosed in U.S. Provisional Application Nos. 62/595,898 and 62/641,664, as well as co-pending U.S. patent application Ser. Nos. 16/210,703, 16/210,732, 16/210,756, 16/210,788 and 16/210,812. In some embodiments, tunable band stop filter 1612 is a continuously tunable band stop filter. Tunable band stop filter 1612 may be implemented using the tunable acoustic filter structures illustrated in FIGS. 7A-7F, 8A-8E, 9A-9C, and 11A-11C. In some embodiments, embodiment bandpass filter 1602 may start with an order of 1 using, for example, two resonators. In one specific example, an order of 3.5 using seven resonators is used. It should be appreciated, however, that any order or number of resonators may be used depending on the particular system being implemented and its specifications.

It should be understood that the embodiments of FIGS. 16A and 16B are just two specific examples of embodiments multi-channel front end circuits. In alternative embodiments of the present invention, greater or fewer than four receive paths may be implemented for the receive channels of RF transceivers 1502 and/or 1504, and greater than one transmit channel may be provided for the transmit channels of RF transceivers 1502 and/or 1504. Moreover different receive and transmit topologies could be used depending on the particular system being implemented and it specifications. Besides power detection, other functions can be performed such as measuring TX linearity of the TX output signal (for adaptation of digital predistortion or envelope tracking) or antenna impedance measurement for antenna tuning (measuring amplitude and phase of forward and reflected signals). For simplicity, transceivers 1502 and 1504 are shown as separate devices. However, they can be integrated into one physical device in an embodiment.

Just as embodiments of the present invention can be applied to the receive path of an RF transceiver, embodiments of the present invention can also be applied in a similar way to the transmit path of an RF transceiver as described herein with respect to FIGS. 17A-C, 18A-D, 19A-C, 20A-B and 21A-B. Such embodiments can be directed, for example, to systems such as cellular phones, smart watches, wearables, and IoT (Internet-of-Things) devices. More specifically, embodiments may be directed to multi-band RF frontend designs for systems including but not limited to FDD systems, systems that utilize uplink carrier aggregation, and dual/multi-connect systems in which multiple transmitters are active at the same time.

The growing complexity of RF frontends due to the growing number of supported bands, modes, and multiple connections results in higher insertion loss in practical systems implementations. This higher insertion loss leads to increased power amplifier current consumption in the transmit path and reduced receiver reference sensitivity. Systems that have multiple transmitters active at the same time, for example to support uplink carrier aggregation, and dual/multi-Connect Systems (Multi-Sim, Multi-RAT, cellular/Wi-Fi) may experience intermodulation between the different transmit signals resulting in difficulty in fulfilling spectral emission and self-interference requirements and that impact receiver performance.

Current FDD (Frequency Division Duplex) solutions may use high isolation duplex filters to provide high isolation between transmit and receive paths at the receive frequency band to minimize the direct desensitization of the receiver by noise produced in the transmitter, and at the transmit frequency band to protect the sensitive receiver from high power transmit signals that may degrade the performance of the receiver due to non-linear effects such as IP2, IP3, and reciprocal mixing. The use of these high isolation duplex filters, however, comes at a cost of duplex filter complexity and insertion loss.

In embodiments of the present invention, one or more reconfigurable (e.g. tunable or switchable) band stop filters in the transmit path of an RF system is used to improve overall system performance with respect to one or more of radio front-end complexity, PCB area, transmit power consumption, transmit spectral emission purity, and receive reference sensitivity. Such improvement is addressed using a variety of techniques as described below.

Advantages of embodiments of the present invention include the ability to support multiple transmit bands, transmit mode and multiple connections with decreased power amplifier current consumption and increased reference sensitivity.

Figure 17A:
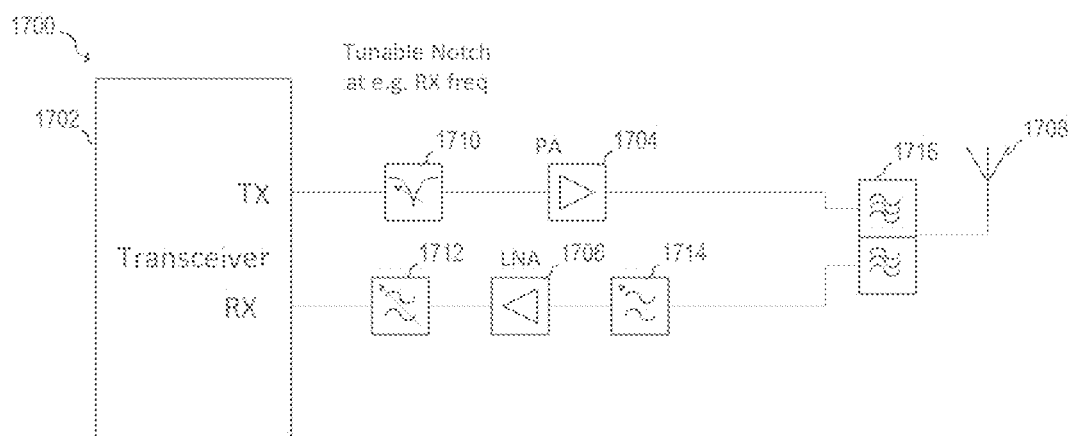
FIGS. 17A-C illustrate block diagram of embodiments RF systems that include a combined receive/transmit antenna and a duplexer, tunable notch filters in the transmit path and tunable filters in the receive path.
Figure 17B:
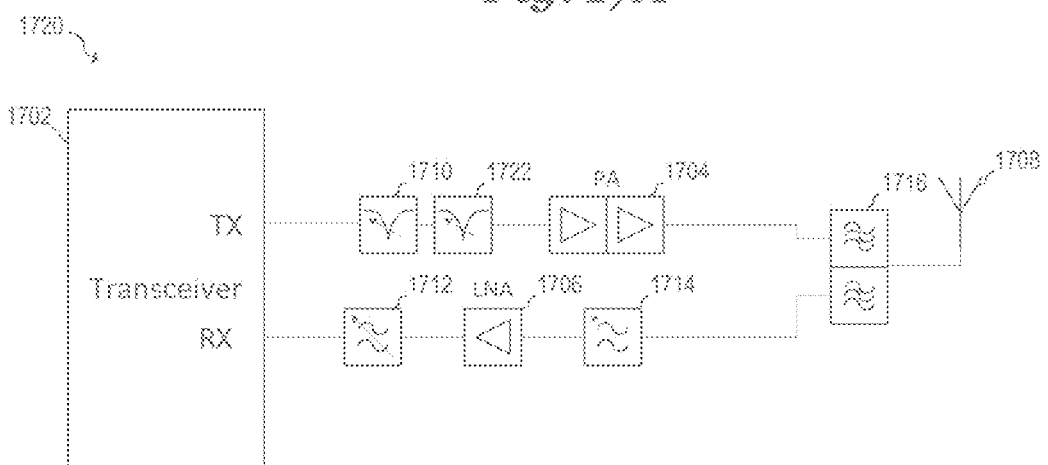
Figure 17C:
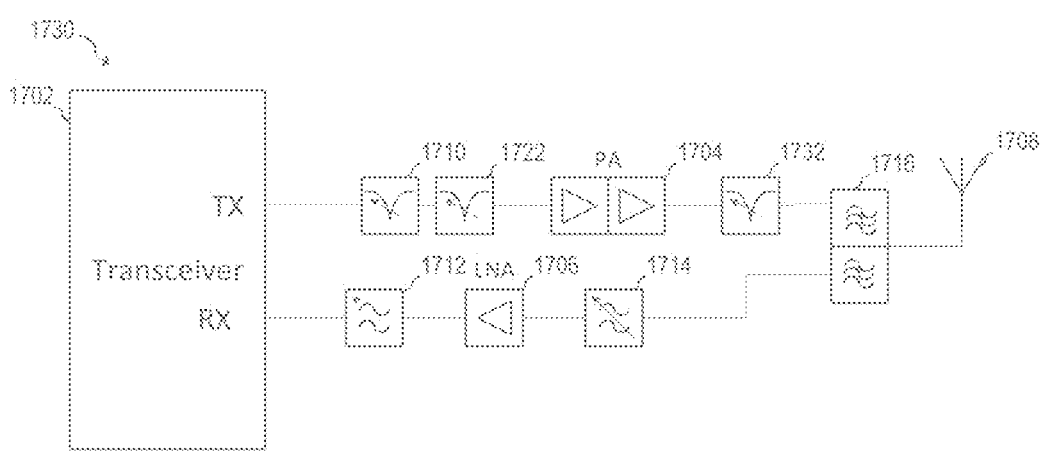

FIGS. 17A-17C illustrate block diagram of embodiment RF systems that include a combined receive/transmit antenna and a duplexer. A requirement of a duplexer is to provide isolation between the TX path and RX in the transmit frequency band as well as in the receive frequency band. The isolation requirements in the receive frequency band of the duplexer are relaxed by using band stop filters in the transmit path in front of and/or after the power amplifier (PA) to attenuate energy within the receive frequency band. In front of the PA a filter can also be placed at the image frequency band of the receive frequency band, which would also be folded to the receive frequency band by non-linear effects in the PA. Optionally, the isolation requirements in the transmit frequency band of the duplexer can be relaxed by using tunable filter (which can be a band stop, bandpass, or other filter) in front of and/or after the low noise amplifier (LNA) in the receive path. In some embodiments, this may result in a relaxation of about 7 dB of isolation requirements from about 45 dB to 38 dB in one example. By relaxing these isolation requirements, a lower order duplexer with lower insertion loss and potentially smaller package size may be used in the system.

FIG. 17A illustrates an embodiment RF system 1700 that includes an RF transceiver 1702 that has a transmit output (TX) and a receive input (RX). The transmit path includes a tunable band stop filter 1710, followed by power amplifier (PA) 1704, duplexer 1716 and antenna 1708. In various embodiments, tunable band stop filter 1710 is tuned to have a notch at the receive frequency. The receive path includes LNA 17o6, tunable filter 1714 coupled to the input of LNA 1706 and tunable filter 1712 coupled to the output of LNA 17o6. These tunable filters 1712 and 1714 may configured to be band stop filters that are tuned to the transmit frequency and/or may be configured to be bandpass filters that are tuned to the receive frequency. The use of filters 1712 and 1714 may be used to further reduce the isolation requirements of duplexer filter 1716. It should be understood that the inclusion of one or both of tunable filters 1712 and 1714 is optional and some embodiment systems omit these filters.

As shown in FIG. 17A, band stop filter 1710 is coupled to the input of power amplifier 1704. By coupling tunable band stop filter 1710 to the input of power amplifier 1704, which is in a lower power domain than the output of power amplifier 1704, the insertion loss of tunable band stop filter 1710 has a negligible effect on the power consumption of the system.

In some embodiments, power amplifier 1704 includes a plurality of power amplifier stages coupled in series. In some embodiments, the plurality of power amplifier stages may have additional filtering between each stage, such as additional band stop filtering. Alternatively, in some embodiments, no additional band stop filtering is provided between each stage of power amplifier 1704.

FIG. 17B illustrates an embodiment RF system 1720 that is similar to RF system 1700 of FIG. 17A, but further includes a second tunable band stop filter 1722 coupled in series with tunable band stop filter 1710 at the input of power amplifier 1704. In an embodiment, tunable band stop filter 1722 is tuned to the receive image frequency. Thus, any energy at the receive image frequency that present at the transmit output of RF transceiver 1702 gets attenuated prior to its being mixed to the receive frequency. In some embodiments, this may further relax the isolation requirements of duplexer 1716.

FIG. 17C illustrates an embodiment RF system 1730 that is similar to RF system 1720 of FIG. 17B, but further includes a third tunable band stop filter 1732 coupled to the output of power amplifier 1704. In various embodiments, tunable band stop filter 1732 is tuned to the receive frequency. In some embodiments, tunable band stop filters 1710 and 1722 at the input to power amplifier 1704 may be omitted.

FIGS. 18A-18D illustrate embodiment RF systems having a combined receive/transmit antenna in which the duplexer is replaced with tunable band stop filters and adjustable phase shifters/matching networks in the transmit path and in the receive path. In various embodiments, a tunable band stop filter in the transmit path is tuned to the receive frequency in order to attenuate transmit noise at the receive frequency, and an adjustable phase shifter/matching network in the transmit path is adjusted to transform the impedance of the adjustable band stop filter at the notched receive frequency so that the impedance approximates an open circuit and does not load the output at the receive frequency. Similarly, a tunable band stop filter in the receive path is tuned to the transmit frequency to attenuate the transmit signal before it hits the receiver, and an adjustable phase shifter/matching network in the receive path is adjusted to transform the impedance of the adjustable band stop filter at the notched transmit frequency so that the impedance approximates an open circuit and does not load the output at the transmit frequency. In some embodiments the impedance transformation performed by the adjustable phase shifter/ matching networks described herein transforms an impedance from a lower impedance to a higher impedance.

Advantages of such embodiments include the ability eliminate a fixed frequency duplexer in an RF system that operates at different frequency bands, such as different LTE bands. This way one tunable transmit/receive path pair can cover multiple bands and replace multiple transmit/receive path pairs with fixed frequency duplexers.

Figure 18A:
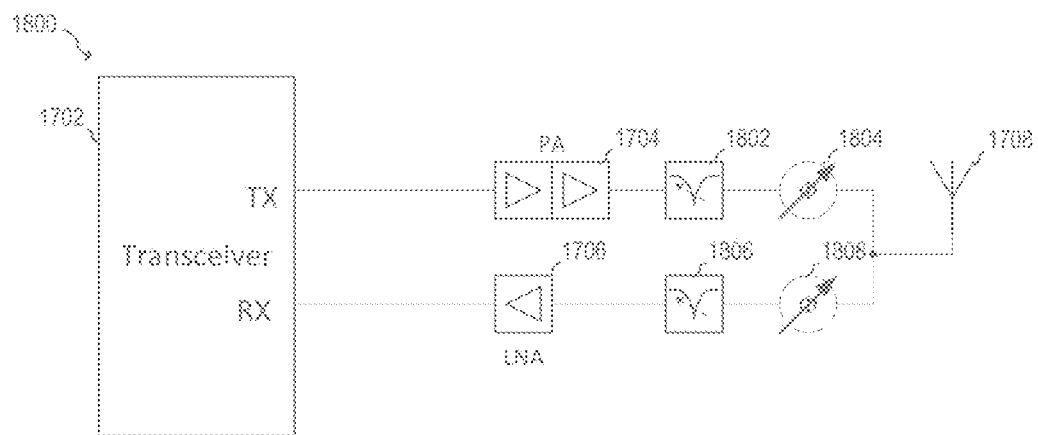
FIGS. 18A-D illustrate embodiment RF systems having a combined receive/transmit antenna, tunable notch filters in the transmit path and in the receive path and adjustable phase shifters/matching networks to combine the transmit path and the receive path.

FIG. 18A illustrates an embodiment RF system 1800 that includes an RF transceiver 1702 having a transmit output (TX) and a receive output (RX). The transmit path includes power amplifier 1704 followed by tunable band stop filter 1802, tunable phase shifter 1804 and antenna 1708. The receive path includes tunable phase shifter 1808 followed tunable band stop filter 1806 and LNA 1706, the output of which is coupled to the receive input of RF transceiver 1702.

In an embodiment, band stop filter 1802 of the transmit path is tuned to the receive frequency in order to attenuate noise generated by the transmit path at the receive frequency and reduce the amount of noise received at the receive frequency. Phase shifter 1804 turned such that the output impedance of tunable band stop filter 1802 at the notch frequency is transformed to an impedance approximating an open circuit at the output of phase shifter 1804. This prevents tunable band stop filter 1802 from loading the output of RF system 1800 at the receive frequency.

Similarly, band stop filter 1806 of the receive path is tuned to the transmit frequency in order to attenuate the transmit signal generated by RF transceiver 1702 and prevent the transmit signal from overloading and/or desensitizing the LNA. Phase shifter 1808 is tuned such that the input impedance of tunable band stop filter 1806 at the notch frequency is transformed to an impedance approximating an open circuit at input of phase shifter 1808 (e.g. the port of phase shifter 1808 coupled to antenna 1708). This prevents tunable band stop filter 1806 from loading the output of RF system 1800 at the transmit frequency.

Figure 18B:
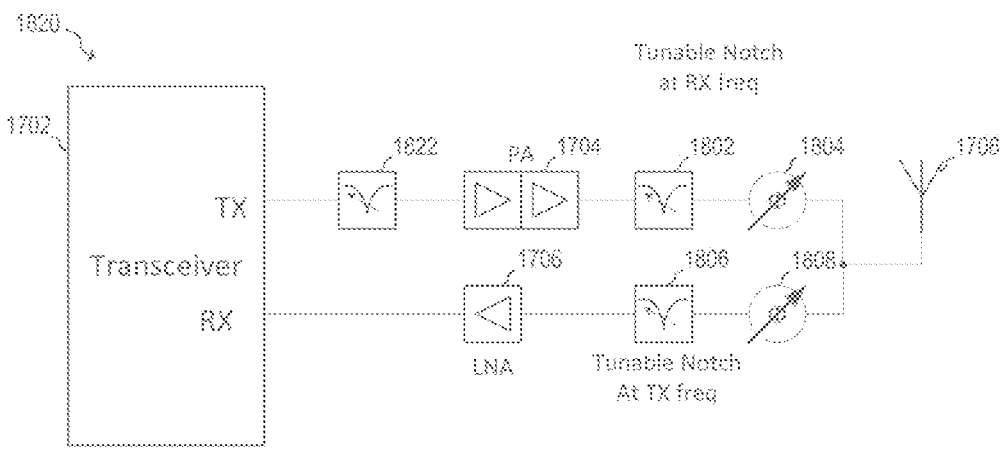

FIG. 18B illustrates an embodiment RF system 1820 that is similar to RF system 1800 of FIG. 18A, but further includes a further tunable band stop filter 1822 coupled between the output of the transmit output of RF transceiver 1702 and the input of power amplifier 1704. In an embodiment, tunable band stop filter 1822 is also tuned to the receive frequency in order to further attenuate energy generated by the transmitter of RF transceiver 1702.

Figure 18C:
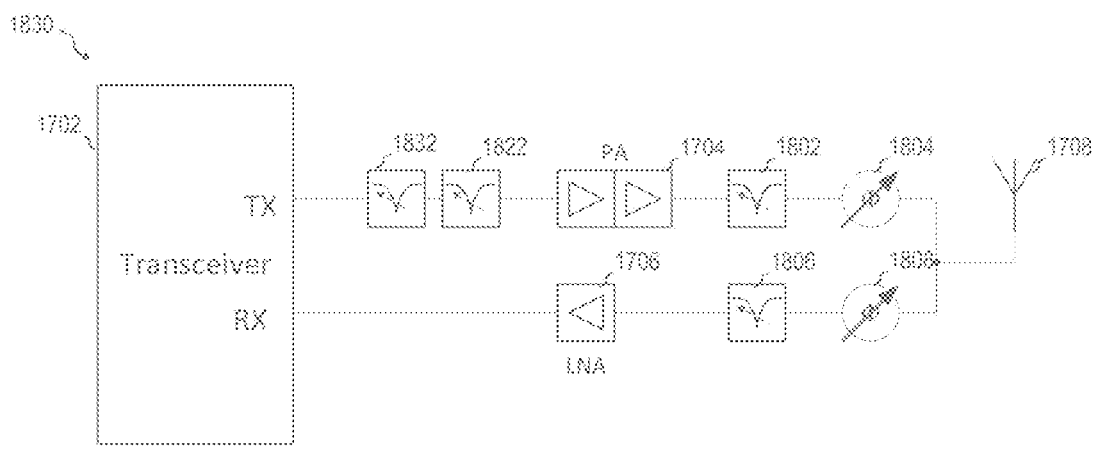

FIG. 18C illustrates an embodiment RF system 1830 that is similar to RF system 1820 of FIG. 18B, but further includes another tunable band stop filter 1832 in addition to tunable band stop filter 1822 coupled between the output of the transmit output of RF transceiver 1702 and the input of power amplifier 1704. In an embodiment, tunable band stop filter 1832 is tuned to the receive image frequency. Thus, any energy at the receive image frequency that present at the transmit output of RF transceiver 1702 get attenuated prior to it being mixed to the receive frequency by nonlinearities in power amplifier 1704.

Figure 18D:
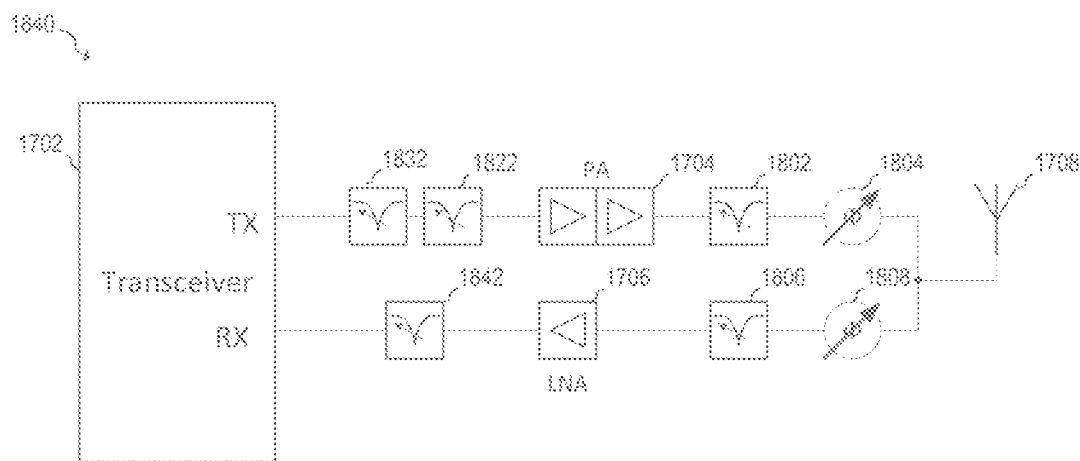

FIG. 18D illustrates an embodiment RF system 1840 that is similar to RF system 1830 of FIG. 18C with the further addition of tunable band stop filter 1842 coupled between the output of LNA 1706 and the receive input of RF transceiver 1702. In an embodiment, tunable band stop filter 1842 is tuned to the transmit frequency to provide further transmit isolation. It should be understood that FIGS. 18A-D are just four example embodiments. Other RF systems and configurations that use band stop filters and phase shifters instead duplex filters may be possible. For example, tunable band stop filter 1842 may also be coupled between the LNA 1706 and the receive input of RF transceiver 1702 in the embodiments of FIGS. 18A and 18B.

Figure 19A:
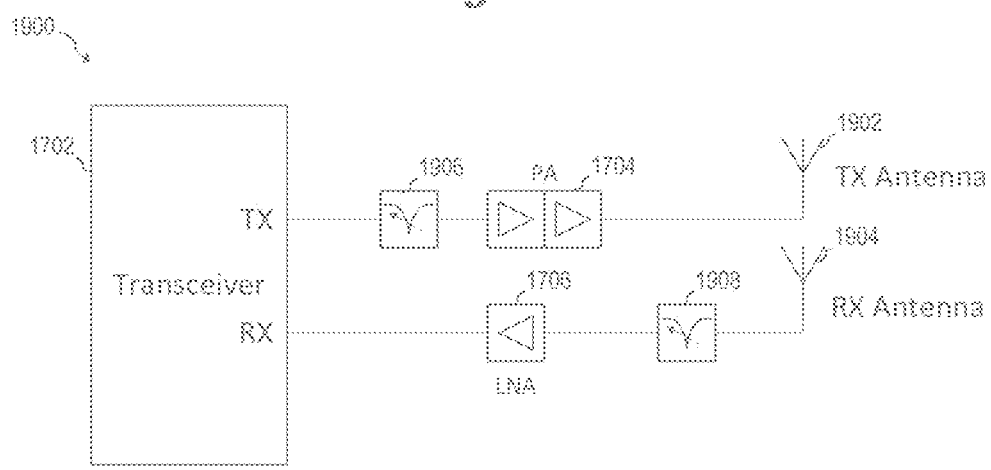
FIGS. 19A-C illustrate embodiment RF systems in which isolation between the transmit path and the receive path is achieved by using separate transmit and receive antennas.
Figure 19B:
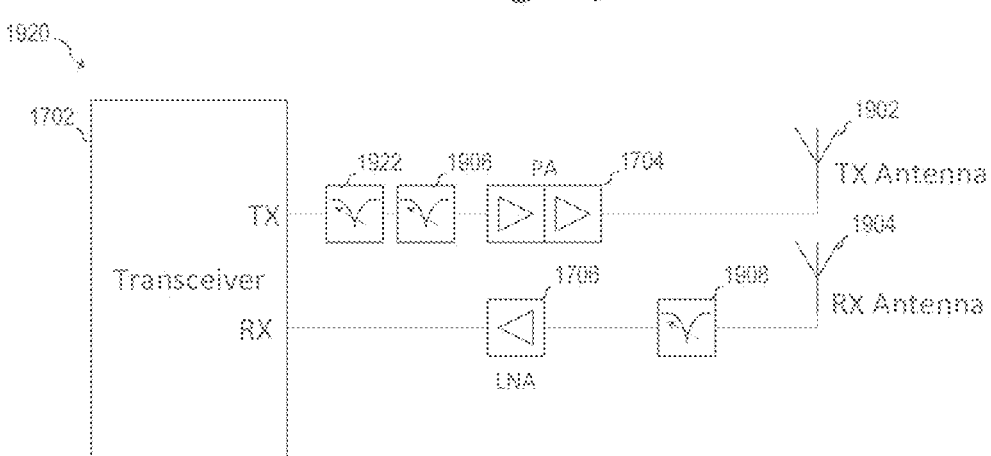
Figure 19C:
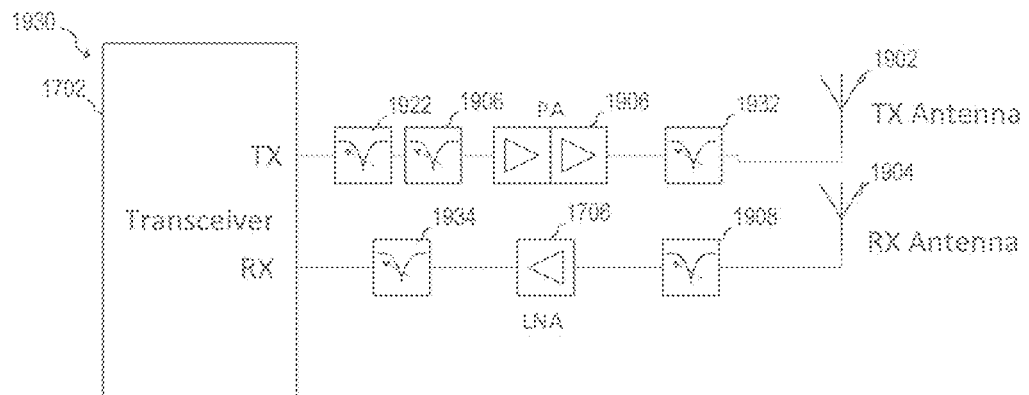

FIGS. 19A-19C illustrate embodiment RF systems in which isolation between the transmit path and the receive path is achieved by using separate transmit and receive antennas instead of using a duplex filter and a single antenna. In addition, tunable band stop filters are used to attenuate frequencies at the receive frequency and/or the receive image frequency in the transmit path and to attenuate the transmit frequency within the receive path.

Advantages of such embodiments include the ability to replace multiple fixed frequency duplexers that would normally be needed for different (e.g. LTE) frequency bands by a single pair of configurable band stop filters in the receive signal path and the transmit signal path.

FIG. 19A illustrates an embodiment RF system 1900 that includes an RF transceiver 1702 having a transmit output (TX) and a receive input (RX). The transmit path includes a tunable band stop filter 1906, followed by power amplifier (PA) 1704 and transmit antenna 1902. The receive path includes LNA 1706, tunable band stop filter 1908 coupled to the input of LNA 1706 and receive antenna 1904. Tunable band stop filter 1906 in the transmit path is tuned to the receive frequency to attenuate noise generated by transmit circuitry of RF transceiver 1702 that would be coupled back to the receive channel of RF transceiver 1702 via antennas 1902 and 1904; and tunable band stop filter 1908 in the receive path is tuned to the transmit frequency to prevent the transmit signal generated by RF transceiver 1702 from overloading and/or desensitizing the input of LNA 1706 and/or the receive circuitry of RF transceiver 1702.

FIG. 19B illustrates an embodiment RF system 1920 that is similar to RF system 1900 of FIG. 19A, but further includes a second tunable band stop filter 1922 coupled in series with tunable band stop filter 1906 at the input of power amplifier 1704. In an embodiment, tunable band stop filter 1922 is tuned to the receive image frequency. Thus, any energy at the receive image frequency that present at the transmit output of RF transceiver 1702 get attenuated prior to its being mixed to the receive frequency.

FIG. 19C illustrates an embodiment RF system 1930 that is similar to RF system 1920 of FIG. 19B, but further includes a fourth tunable band stop filter 1932 coupled to the output of power amplifier 1704, and fifth tunable band stop filter 1934 coupled between the output of LNA 1706 and the receive input of RF transceiver 1702. In various embodiments, band stop filter 1932 is either tuned to the receive frequency to reduce the amount of noise that reaches LNA 1706. In some embodiments, tunable band stop filters 1906 and 1922 at the input to power amplifier 1704 may be omitted.

Figure 20A:
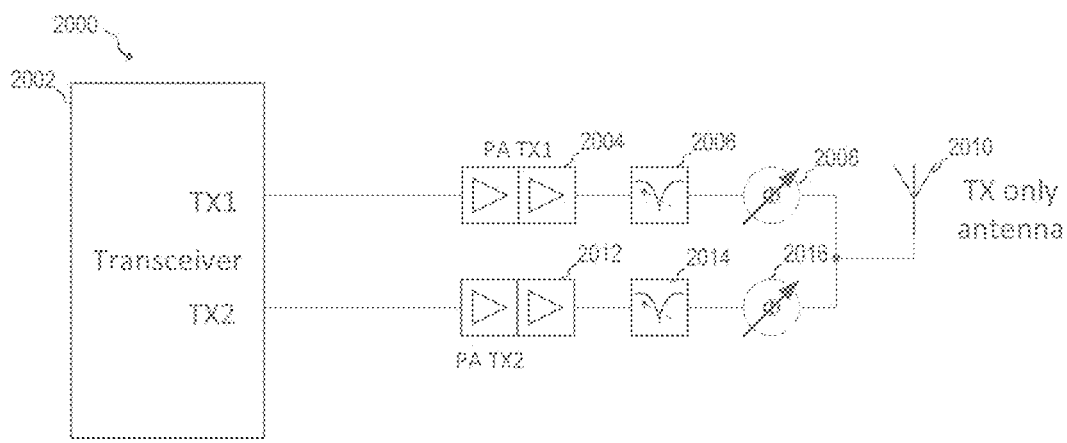
FIG. 20A illustrates embodiment RF systems directed to multi-transmitter systems that have more than one transmitter active at the same time coupled to the same physical antenna.
Figure 20B:
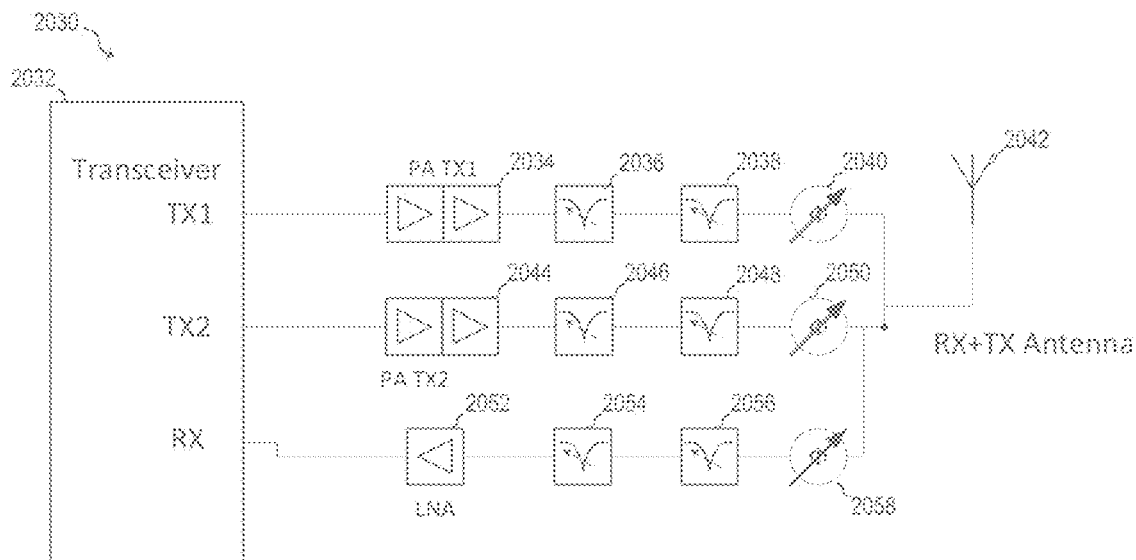
FIG. 20B illustrates embodiment RF systems directed to multi-transmitter systems that have more than one transmitter active at the same time and one (can be more than one) receive Path coupled to the same physical antenna.

FIGS. 20A-20B illustrate embodiment RF systems directed to multi-transmitter systems that have more than one transmitter active at the same time coupled to the same physical antenna. However, instead of having a duplexer isolate the two transmit paths, band stop filters and adjustable phase shifter/matching networks are used to isolate the two transmit signal paths. Advantages of such embodiments include the ability eliminate a fixed frequency duplexer in an RF system that simultaneously transmits in different frequency bands, such as different LTE bands.

FIG. 20A illustrates RF system 2000 that includes an RF transceiver 2002 having two transmit outputs TX1 and TX2. A first transmit path includes a first power amplifier 2004 followed by a tunable band stop filter 2006 and an adjustable phase shifter/matching network 2008, which is coupled to antenna 2010. Similarly, a second transmit path includes a second power amplifier 2012 followed by a tunable band stop filter 2014 and an adjustable phase shifter/matching network 2016, which is also coupled antenna 2010. The notch frequency of tunable band stop filter 2006 of the first transmit path is tuned to the transmit frequency of the second signal path, while the notch frequency of tunable band stop filter 2014 of the second transmit path is tuned to the transmit frequency of the first signal path. By notching out the transmit frequency of the other transmit signal path, the intermodulation distortion between the two transmit frequencies and overloading of the output of the two power amplifiers 2004 and 2012 is reduced and/or avoided.

Adjustable phase shifter/matching network 2008 transforms the output impedance of adjustable band stop filter 2006 at its notch frequency to an impedance approximating an open circuit at the interface to antenna 2010 in order to avoid loading the output. Similarly, adjustable phase shifter/matching network 2016 transforms the output impedance of adjustable band stop filter 2014 at its notch frequency to an impedance approximating an open circuit at the interface to antenna 2010 in order to avoid loading the output.

The concept of RF system 2000 shown in FIG. 20A can also be extended to incorporate more channels, or even the addition of a receive channel in addition to the two transmit channels. For example, as shown in FIG. 20B, RF system 2030 includes an RF transceiver 2032 that includes two transmit outputs TX1 and TX2, as well as a receive input RX. The first transmit path coupled to the first transmit output TX1 includes power amplifier 2034, followed by two adjustable band stop filters 2036 and 2038, which are followed by adjustable phase shifter/matching network 2040 coupled to shared antenna 2042. Similarly, the second transmit path coupled to the second transmit output TX2 includes power amplifier 2044, followed by two adjustable band stop filters 2046 and 2048, which are followed by adjustable phase shifter/matching network 2050 coupled to the shared antenna 2042. A receive path includes adjustable matching network 2058 coupled to shared antenna 2042, tunable band stop filters 2054 and 2056 and LNA 2052 having an output coupled to the receive input RX of RF transceiver 2032.

Tunable band stop filters 2036 and 2038 of the first transmit path are tuned to provide a notch at the transmit frequency of the second transmit path and a notch at the receive frequency of the receive path. Adjustable phase shifter/matching network 2040 is configured to transform the impedances at the notch frequencies of adjustable band stop filters 2036 and 2038 to an output impedance approximating an open circuit to avoid loading the output at these notch frequencies.

Similarly, tunable band stop filters 2046 and 2048 of the first transmit path are tuned to provide a notch at the transmit frequency of the first transmit path and a notch at the receive frequency of the receive path. Adjustable phase shifter/matching network 2050 is configured to transform the impedances at the notch frequencies of adjustable band stop filters 2046 and 2048 to an output impedance approximating an open circuit to avoid loading the output at these notch frequencies.

Lastly, tunable band stop filters 2054 and 2056 of the receive path are tuned to provide a notch at the transmit frequency of the first transmit path and a notch at the transmit frequency of the second transmit path. Adjustable phase shifter/matching network 2058 is configured to transform the impedances at the notch frequencies of adjustable band stop filters 2054 and 2056 to an output impedance approximating an open circuit to avoid loading the output at these notch frequencies. In some embodiments, adjustable phase shifters matching networks 2040, 2050 and 2058 each include two adjustable phase shifter/matching networks coupled in series that are each configured to provide an impedance transformation for a single notch frequency.

By having band stop filters in each signal path that notch out sensitive frequencies of the remaining signal paths, interference between signal paths is attenuated and/or significantly reduced. It should be understood that the embodiments of FIG. 20A and FIG. 20B can be extended to any number of transmit and/or receive signal paths.

Figure 21A:
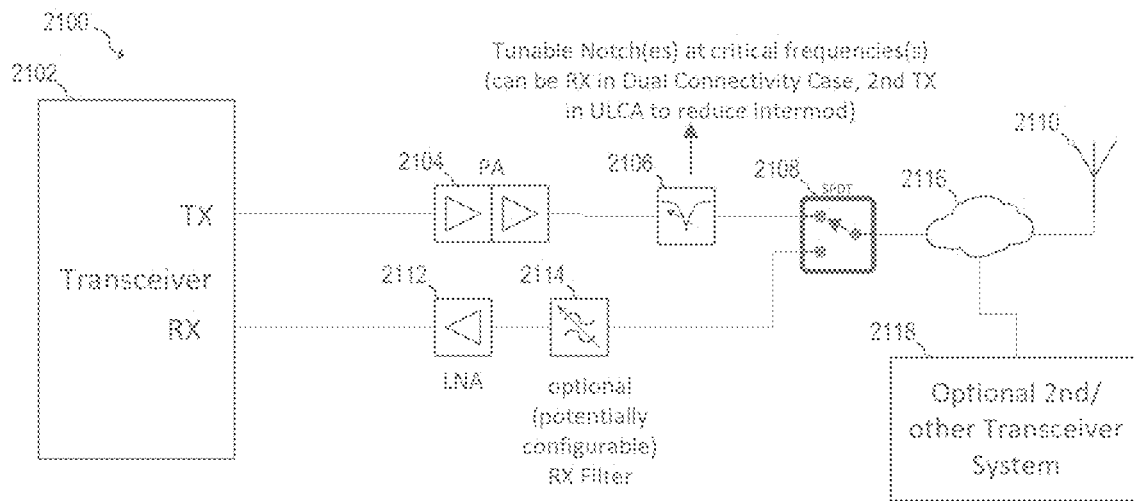
FIGS. 21A-B illustrate embodiment RF systems directed to time division duplex (TDD) systems.

Embodiments of the present invention can also be extended to time division duplex (TDD) systems as is illustrated in 21A and 21B. In various embodiments, band stop filters are used to notch out critical frequencies used by other transceiver systems that share a same antenna or have antennas that are in close proximity to the embodiment TDD system. As shown in FIG. 21A, RF system 2100 includes an RF transceiver 2102 having a transmit output TX and a receive input RF. A transmit path includes a power amplifier 2104 having an input coupled to the transmit output TX of RF transceiver 2102, tunable band stop filter 2106 coupled to the output of power amplifier 2104 and a transmission switch 2108. A receive signal path includes an LNA 2112 having an input coupled to transmission switch 2108 and an output coupled to the receive input of RF transceiver 2102. An optional tunable filter 2114 may be coupled between transmission switch 2108 and LNA 2112.

During operation, transmission switch 2108 selectively couples one of the receive path or transmit path to antenna 2110 depending on whether RF transceiver 2102 is transmitting or receiving. For example, when RF transceiver 2102 is transmitting, the transmit path is coupled to antenna 2110 via transmission switch 2108. On the other hand, when RF transceiver 2102 is receiving, the receive path is coupled to antenna 2110 via transmission switch 2108. An optional second transceiver system 2118 is also coupled to antenna 2110 and may be transmitting and/or receiving at the same time as RF transceiver 2102. In some embodiments, optional second transceiver system 2118 may include more than one transceiver and/or more than one receive and/or transmit paths. The interface 2116 between optional second transceiver system 2118 and the rest of the system is depicted as a cloud, and may be implemented as a direct connection to transmission switch 2108 and antenna 2110 or may be implemented using other coupling circuits known in the art.

In various embodiments, tunable band stop filter 2106 coupled to the output of power amplifier in the transmission path may be tuned to a critical frequency of RF system 2100. For example, in a dual connectivity system, the frequency of tunable band stop filter 2106 may be tuned to a receive frequency of the optional second transceiver system 02118. In an uplink carrier aggregation (ULCA) system, the frequency of tunable band stop filter 2106 may be tuned to a transmit frequency of optional second transceiver system 2118. In addition, optional receive filter 2114 may also be tuned and/or configured to reject frequencies generated by optional second transceiver system. In further embodiments, tunable band stop filter 2106 may be implemented using a plurality of tunable band stop filters that are each tuned to a different critical frequency of RF system 2100. Similarly, optional receive filter 2114 may be configured to reject different critical frequencies of RF system 2100. While FIG. 20A illustrates a system having two transmit signal paths, it should be understood that in some embodiments, RF system 2000 may include more than two transmit signals paths.

Figure 21B:
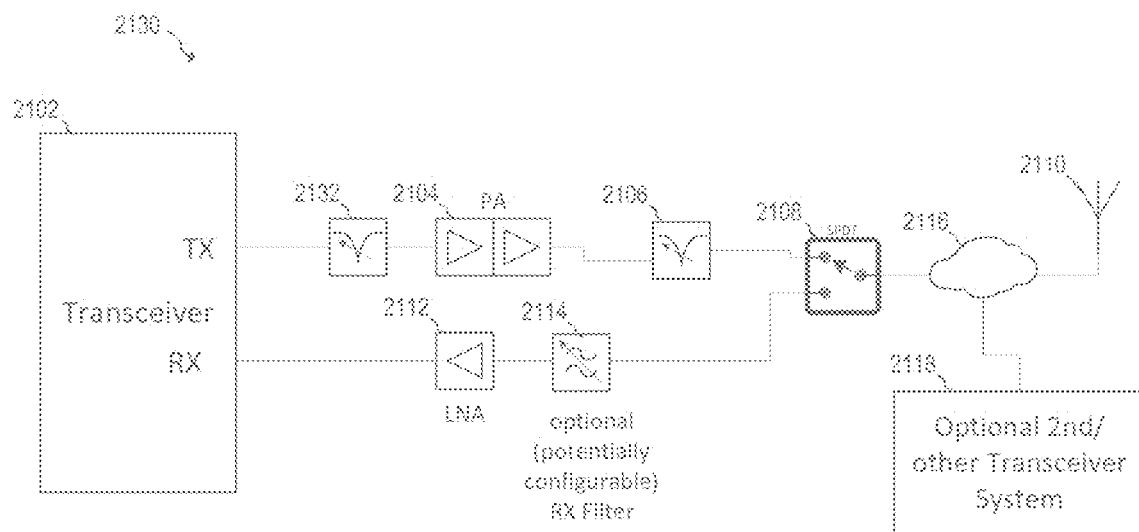

FIG. 21B illustrates RF system 2130 that is similar to RF system 2100 of FIG. 21A, but further includes an additional band stop filter 2132 coupled between the transmit output TX of RF transceiver 2102 and the input of power amplifier 2104. In various embodiments, band stop filter 2132 may be configured to reject one or more critical frequencies received and/or generated within RF system 2130, including frequencies received and generated by optional second transceiver system 2118. In some embodiments, tunable band stop filter 2106 coupled to the output of power amplifier 2104 may be omitted to save power. While FIG. 20B illustrates a system having two transmit signal paths and one receive signal path, it should be understood that in some embodiments, RF system 2130 may include more than two transmit signals paths and/or may include more than one receive signal paths.

In various embodiments, the tunable filters, including tunable band stop filter, tunable bandpass filters and tunable phase shifter/matching networks depicted in FIGS. 17A-C, 18A-D, 19A-C, 20A-B and 21A-B can be implemented using tunable filter structures known in the art.

In various embodiments, the tunable band stop filters depicted in FIGS. 17A-C, 18A-D, 19A-C, 20A-B and 21A-B may be implemented using tunable band stop filter structures known in the art or may be implemented using tunable acoustic filter structures disclosed herein. For example, the acoustic filter structures shown in FIGS. 7A-7N, 8A-8E, 9A-9C, and 11A-11C may be used. In some embodiments, these band stop filters may be implemented using continuously tunable circuits. Tunable bandpass filter may be implemented using circuits known in the art, continuously tunable circuits, and/or tunable acoustic filter based bandpass structures illustrated in FIGS. 9A-9C, 10A-10G, 11A-11C, 12A-12E and 13A-13E.

The various adjustable phase shifter/matching network circuits depicted in FIGS. 18A-D and 20A-B may be implemented using adjustable phase shifter/matching network circuits known in the art such phase shifting circuit based on varactors and switched capacitors. The depicted adjustable phase shifter/matching network circuits may also be implemented using tunable bridged T all-pass circuits depicted in FIGS. 7A-7N above.

Advantages of the embodiments depicted in FIGS. 17A-C, 18A-D, 19A-C, 20A-B and 21A-B include reduced transmit path power consumption, increased transmit spectral emission purity, improved receive path noise figure to increase reference sensitivity, reduction in complexity due to a reduced number of filter components (and reduced filter order), reduction in system and PCB size due to the reduced number of components, and reduced system cost due to reduced component count, reduced system complexity and reduced PCB size.

Figure 22:
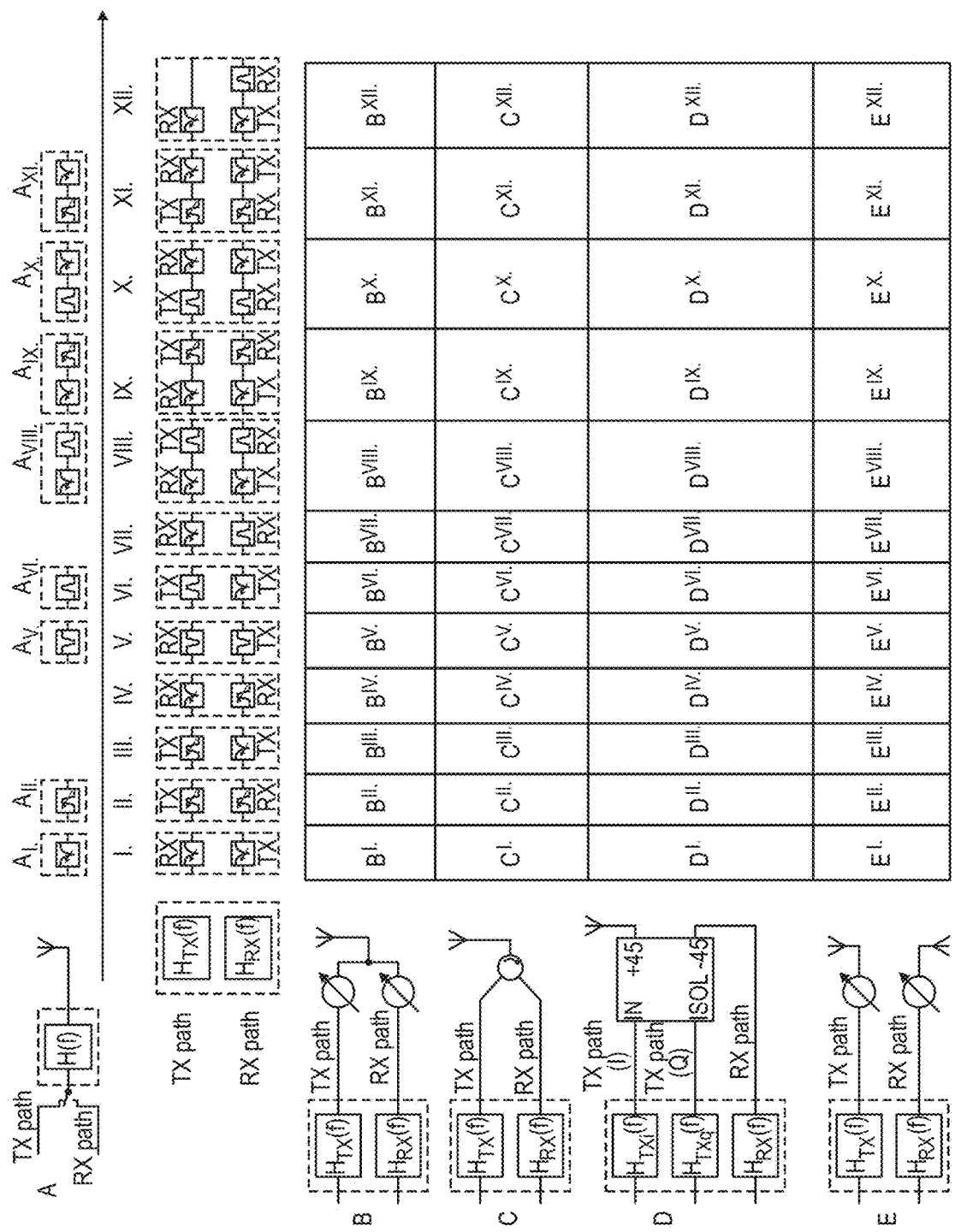
FIG. 22 illustrates a table depicting embodiments transmit/receive path/combining structures and corresponding transmit/receive path filter configurations.

As shown, for example, in FIGS. 18A-D, 20A-B and 21A-B above, tunable filters at the output of a transmit path and/or at the input of a receive path of an RF system can be used to replace multiple transmit, receive and/or duplex filters. This concept can be generalized and extended to multiple systems, implementations and architectures as shown in FIG. 22, which illustrates a table depicting transmit/receive path/combining structures A, B, C, D and E on the left hand side of the table, and transmit/receive path filter configurations I, II, III, IV, V, VI, VII, VIII, IX, X, XI and XII on the top side of the table. In embodiments of the present invention, the transmit/receive path/combining structures A, B, C, D and E can be combined with transmit/receive path filter configurations I, II, III, IV, V, VI, VII, VIII, IX, X, XI and XII to form various embodiment transmit/receive path implementations. Each of transmit/receive path/combining structures A, B, C, D and E includes a receive path and a transmit path that can be coupled to the respective transmit path output and receive path input terminals of an RF transceiver such as those depicted in the Figures above.

Transmit/receive path/combining structure A depicts a structure that includes a transmit path (TX path), and receive path (RX path), a transmit/receive switch, an RF filter H(f) and an antenna. Transmit/receive path/combining structure A may be used, for example, in a TDD system in which the transmit/receive switch couples the transmit path (TX path) to the antenna during signal transmission, and coupled the receive path (RF path) to the antenna during signal reception. The filter structures depicted under the headings $A_I$, $A_{II}$, $A_V$, $A_{VI}$, $A_{VII}$, $A_{IX}$, $A_X$, and $A_X$ represent different configurations that may be used to implement RF filter H(f). For example, filter H(f) may be implemented using filter configuration $A_I$ representing a tunable band stop filter, which may be used to suppress signals at a transmit frequency of another transmitter in the system to provide lower noise in the receive path. Filter configuration $A_{II}$ represents a tunable bandpass filter that may be tuned to the transmit frequency and/or the receive frequency in order to suppress out of band interferers. Filter configuration $A_V$ represents a fixed band-reject filter that may be used to reject fixed frequency interferers, and filter configuration $A_{VI}$ represents a fixed band pass filter that may be set to a have a center frequency that includes both the transmit and receive frequencies.

Filter configuration $A_{VIII}$ represents a tunable band stop filter followed by a fixed bandpass filter and filter configuration $A_X$ represents a fixed bandpass filter followed by a tunable band stop filter. In these configurations, the tunable band stop filter may be used to highly suppress other transmit frequencies generated by other transmitters in the RF system, and the fixed bandpass filter may be used to attenuate noise and interference outside of the passband of the band pass filter in cases where the frequencies of the transmit and receive path are close to each other or are identical.

Filter configuration $A_{IX}$ representing a tunable band stop filter followed a tunable bandpass filter and filter configuration $A_{XI}$ representing a tunable bandpass filter followed by a tunable band stop filter may be used to highly suppress other transmit frequencies generated by other transmitters in the RF system, as well as to attenuate noise and interference outside of the passband of the band pass filter.

In various embodiments, transmit/receive path/combining structures B, C, D and E along with filter configurations I, II, III, IV, V, VI, VII, VIII, IX, X, XI and XII may be used to implement the receive and transmit path in an FDD system that does not require the use of a duplexer or fixed RF filter banks. These combinations are designated in the table by letter (A, B, C, D and E) and Roman numeral (I, II, III, IV, V, VI, VII, VIII, IX, X, XI and XII). For example, the implementation of transmit/receive path/combining structures C with filter configuration VII is designated as $C_{VII}$, and the implementation of transmit/receive path/combining structures E with filter configuration I is designated as $E_I$, etc.

Transmit/receive path/combining structure B includes a transmit path having a filter $H_{TX}(f)$ followed by an adjustable phase shifter/matching network coupled to a shared antenna, and a receive path having a filter $H_{RX}(f)$ followed by another adjustable phase shifter/matching network coupled to a shared antenna. Each adjustable phase shifter/matching network may be used to transform the stop band impedance of a filter in one signal path to an impedance approximating an open circuit to the other signal path. For example, the adjustable phase shifter/matching network of the transmit path can transform the stop band impedance of filter $H_{TX}(f)$ to an impedance approximating an open circuit at the receive frequency of the receive path to avoid loading the input of the receive path and attenuating the receive signal. Similarly, the adjustable phase shifter/matching network of the receive path can transform the stop band impedance of filter $H_{RX}(f)$ to an impedance approximating an open circuit at the transmit frequency of the transmit path to avoid loading the transmit path. Transmit filter $H_{TX}(f)$ and receive filter $H_{RX}(f)$ can be implemented using one of filter configurations I, II, III, W, V, VI, VII, VIII, IX, X, XI and XII as will be explained below. The combination of transmit filter $H_{TX}(f)$ and receive filter $H_{RX}(f)$ transfer functions and adjustable phase shifter/matching networks provides isolation between the transmit path and receive paths.

In some embodiments, the output of the adjustable phase shifter/matching network in the transmit signal path coupled to the antenna can be considered to be a transmit antenna port, and the input of the adjustable phase shifter/matching network in the receive signal path coupled to the antenna can be considered to be a receive antenna port. In this case, both the transmit antenna port and the receive antenna port is coupled together.

Transmit/receive path/combining structure C includes a transmit path having a filter $H_{TX}(f)$ and a receive path having a filter $H_{RX}(f)$. The transmit path and receive path are coupled to an antenna using an RF circulator. In an embodiment, the circulator provides low insertion loss for signals propagating from the transmit path to the antenna, and from the antenna to the receive path, but isolates signals propagating from the transmit path to the receive path, and from the receive path to the antenna. The circulator may be implemented, for example, using circulator structures known in the art, for example, structures disclosed in the following references H. Obiya, T. Wada, H. Hayafuji, T. Ogami, M. Tani, M. Koshino, M. Kawashima and N. Nakajima, "A New Tunable RF Front-End Circuit for Advanced 4G Handsets", 2014 IEEE MIT-S Int. Microwave Symp. Digest, session WEP-54, June 2014; T. Ogami, M. Tani, K. Ikada, H. Kando, T. Wada, H. Obiya, M. Koshino, M. Kawashima and N. Nakajima, "A New Tunable Filter Using Love Wave Resonators for Reconfigurable RF", 2014 IEEE MIT-S Int. Microwave Symp. Digest, session TU3A-2, June 2014; and T. Wada, R. Nakajima, H. Obiya, T. Ogami, M. Koshino, M. Kawashima and N. Nakajima, "A Miniaturized Broadband Lumped Element Circulator for Reconfigurable Front-end System", 2014 IEEE MIT-S Int. Microwave Symp. Digest, session WEP-28, June 2014, which references are incorporated by reference. In some embodiments, the circulator may be turned and/or matched to the receive and transmit frequencies used by the respective receive and transmit paths. Transmit filter $H_{TX}(f)$ and receive filter $H_{RX}(f)$ can be implemented using one of filter configurations I, II, III, IV, V, VI, VII, VIII, IX, X, XI and XII as will be explained below.

Transmit/receive path/combining structure D includes a transmit path having an in-phase transmit path (TX path (I)) including in-phase transmit filter $H_{TXi}(f)$, a quadrature transmit path (TX path (Q)) including quadrature transmit filter $H_{TXi}(f)$, and a receive path (RX path) including receive filter $H_{RX}(f)$. Coupling between the antenna and the receive path, input-phase transmit path and quadrature transmit path is achieved via four port quadrature combiner, which can be implemented, for example using quadrature combiner structures and/or quadrature hybrid structures known in the art, such as a Fisher hybrid. As shown, the in-phase transmit path is coupled to the input port of the quadrature combiner, the quadrature transmit path is coupled to the isolated port of the quadrature combiner, the receive path is coupled to the −45° port of the quadrature combiner and the antenna is coupled to the +45° port of the quadrature combiner. During operation, the RF transceiver (not shown) generates an in-phase transmit signal and a quadrature transmit signal at are 90° out of phase with each other. In some embodiments, the in-phase transmit signal and a quadrature transmit signal may be generated using a quadrature splitter/combiner circuit, such as a polyphase filter. Accordingly, combining structure D forms a four port hybrid filter arrangement that allows for good coupling from the transmit paths to the antenna and from the antenna to the receive path, but provides isolation from the transmit paths to the receive paths. Transmit filters $H_{TXi}(f)$ and $H_{TXq}(f)$ and receive filter $H_{RX}(f)$ can be implemented using one of filter configurations I, II, III, IV, V, VI, VII, VIII, IX, X, XI and XII as will be explained below.

Transmit/receive path/combining structure E includes a transmit path having a filter $H_{TX}(f)$ followed by an adjustable phase shifter/matching network coupled to a transmit antenna, and a receive path having a filter $H_{RX}(f)$ followed by another adjustable phase shifter/matching network coupled to a separate receive antenna. Each adjustable phase shifter/matching network may be used to transform the stop band impedance of a filter in one signal path to an impedance approximating an open circuit (or other impedance) to its respective antenna. Providing this higher impedance to potentially interfering signals further reduces the amount of interfering signal energy coupled to the respective signal path. Both adjustable phase shifters are tuned to provide maximum isolation between both antennas in some embodiments. Transmit filter $H_{TX}(f)$ and receive filter $H_{RX}(f)$ can be implemented using one of filter configurations I, II, III, IV, V, VI, VII, VIII, IX, X, XI and XII as will be explained below.

In some embodiments, the output of the adjustable phase shifter/matching network in the transmit signal path coupled to the antenna can be considered to be a transmit antenna port, and the input of the adjustable phase shifter/matching network in the receive signal path coupled to the antenna can be considered to be a receive antenna port. In this case, unlike transmit/receive path/combining structure E discussed above, the respective receive and transmit antenna ports are coupled to separate antennas.

As mentioned above each filter $H_{TX}(f)$ and receive filter $H_{RX}(f)$ can be implemented using one of filter configurations I, II, III, IV, V, VI, VII, VIII, IX, X, XI and XII depicted in FIG. 22. Filter configuration I implements transmit filter $H_{TX}(f)$ in the transmit path as a tunable band stop filter that is tuned to the receive frequency in order to suppress transmit noise at the receive frequency, and implements receive filter $H_{RX}(f)$ in the receive path as a tunable band stop filter that is tuned to the transmit frequency in order to suppress the transmit signal during FDD operation.

Filter configuration II implements transmit filter $H_{TX}(f)$ in the transmit path as a tunable bandpass filter that is tuned to the transmit frequency in order to suppress transmit noise and transmit spurious emissions, and implements receive filter $H_{RX}(f)$ in the receive path as a tunable bandpass filter that is tuned to the receive frequency in order to suppress one or more transmit signals and/or out-of-of band interferers.

Filter configuration III implements transmit filter $H_{TX}(f)$ in the transmit path as a tunable bandpass filter that is tuned to the transmit frequency in order to suppress transmit noise and transmit spurious emissions, and implements receive filter $H_{RX}(f)$ in the receive path as a tunable band stop filter that is tuned to the transmit frequency in order to suppress the transmit signal during FDD operation.

Filter configuration IV implements transmit filter $H_{TX}(f)$ in the transmit path as a tunable band stop filter that is tuned to the receive frequency in order to suppress transmit noise at the receive frequency, and implements receive filter $H_{RX}(f)$ in the receive path as a tunable bandpass filter that is tuned to the receive frequency in order to suppress one or more transmit signals and/or out-of-of band interferers.

Filter configuration V implements transmit filter $H_{TX}(f)$ in the transmit path as a fixed band stop filter that is tuned to the receive frequency in order to suppress transmit noise at the receive frequency, and implements receive filter $H_{RX}(f)$ in the receive path as a fixed band stop filter that is tuned to the transmit frequency in order to suppress the transmit signal during FDD operation.

Filter configuration VI implements transmit filter $H_{TX}(f)$ in the transmit path as a fixed bandpass filter that is tuned to the transmit frequency in order to suppress transmit noise and transmit spurious emissions, and implements receive filter $H_{RX}(f)$ in the receive path as a tunable band stop filter that is tuned to the transmit frequency in order to suppress the transmit signal during FDD operation.

Filter configuration VII implements transmit filter $H_{TX}(f)$ in the transmit path as a tunable band stop filter that is tuned to the receive frequency in order to suppress transmit noise at the receive frequency, and implements receive filter $H_{RX}(f)$ in the receive path as a fixed bandpass filter that is tuned to the receive frequency in order to suppress one or more transmit signals and/or out-of-of band interferers.

Filter configuration VIII implements transmit filter $H_{TX}(f)$ in the transmit path as a tunable band stop filter followed by a fixed frequency bandpass filter. The tunable band stop filter is tuned to the receive frequency in order to suppress transmit noise at the receive frequency, and the fixed frequency bandpass filter to provide wideband attenuation. Receive filter $H_{RX}(f)$ in the receive path is implemented as a tunable band stop filter followed by a fixed bandpass filter. The tunable band stop filter is tuned to the transmit frequency in order to suppress the transmit signal during FDD operation, and the fixed bandpass filter provides wideband attenuation.

Filter configuration IX implements transmit filter $H_{TX}(f)$ in the transmit path as a tunable band stop filter followed by a tunable bandpass filter. The tunable band stop filter is tuned to the receive frequency in order to suppress transmit noise at the receive frequency, and the tunable bandpass filter is tuned to the transmit frequency. Receive filter $H_{RX}(f)$ in the receive path is implemented as a tunable band stop filter followed by a tunable bandpass filter. The tunable band stop filter is tuned to the transmit frequency in order to suppress the transmit signal during FDD operation, and the tunable bandpass filter is tuned to the receive frequency.

Filter configuration X has the same elements as filter configuration VIII, with the exception that the position of the bandpass and band stop filters are swapped, thereby placing the tunable band stop filters closer to the antenna port. Having the tunable band stop filters closer to the antenna port may be useful, for example, when used to implement the filters of transmit/receive path/combining structure B in some embodiments because it allows for a short signal path between the band stop filter and the adjustable phase shifter/matching network that is used to modify the impedance of the tunable band stop filter. The choice of which filter to place closest to the antenna, however, depends of the impedance of the particular filter being implemented as well as the details and specification of the system being implemented. Thus, in some cases, it may be advantageous to implement transmit/receive path/combining structure B using filter configuration VIII instead.

Filter configuration XI has the same elements as filter configuration IX, with the exception that the position of the bandpass and band stop filters are swapped, thereby placing the tunable band stop filters closer to the antenna port. As mentioned above with respect to filter configuration X, having the tunable band stop filters closer to the antenna port may be useful, for example, when used to implement the filters of transmit/receive path/combining structure B in some cases, because the different the impedance might allow a better implementation of the phase shifters (e.g., smaller size, better insertion loss, and higher bandwidth). The choice of which filter to place closest to the antenna, however, depends of the impedance of the particular filter being implemented as well as the details and specification of the system being implemented. Thus, in some cases, it may be advantageous to implement transmit/receive path/combining structure B using filter configuration IX instead.

Filter configuration XII has a similar structure as filter configuration VIII, with the exception that fixed bandpass filter in the transmit path is removed. This configuration may be suitable for systems in which the filter requirements in the transmit path are less stringent that the filter requirements in the receive path. This particular filter configuration is advantageous in the sense that it provides filtering at a low cost with low insertion loss in the transmit path.

It should be understood that the RF systems represented by the various embodiments depicted in FIG. 22 are just a subset of many possible embodiment RF system topologies. In alternative embodiments of the present invention, additional filters may be added to the transmit and receive paths and/or additional filter combinations and permutations may possible.

Figure 23:
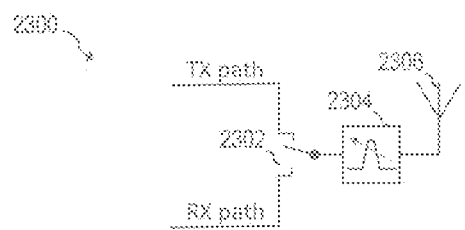
FIG. 23 illustrates an embodiment TDD RF system.

FIGS. 23, 24A-D, 25, 26A-B and 27 illustrates specific examples of embodiment systems summarized in the table of FIG. 22. For example, FIG. 23 illustrates a TDD system 2300 that corresponds to transmit/receive path/combining structure A using filter configuration II ($A_{II}$). As shown, the TDD system 2300 depicted in FIG. 23 includes a transmit path (TX path), a receive path (RX path), a transmit/receive switch 2302, a tunable bandpass filter 2304 and an antenna 2306. In such an embodiments, the tunable bandpass filter 2304 is shared between the transmit path and the receive path. During operation, the transmit/receive switch 2302 selectively couples the active channel to the antenna. For example, when the transmit signal path is active, the transmit/receive switch 2302 couples the transmit signal path to the antenna 2306, and when the receive path is active, the transmit/receive switch 2302 couples the receive signal path to the antenna 2306.

Figure 24A:
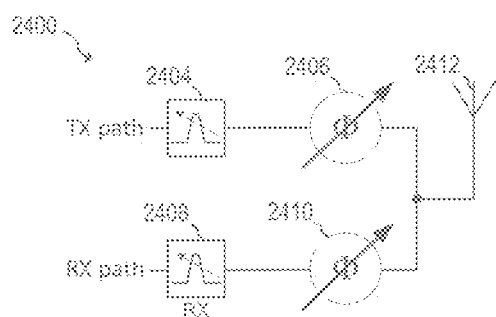
FIG. 24A illustrates an embodiment RF system utilizing tunable bandpass filters and adjustable phase shifters/matching networks.

FIG. 24A illustrates an RF system 2400 that corresponds to transmit/receive path/combining structure B using filter configuration II ($B_{II}$). As shown, the transmit path (TX path) includes a tunable bandpass filter 2404 followed by adjustable phase shifter/matching network 2406 and antenna 2412. Similarly, the receive path (RX path) includes a tunable bandpass filter 2408 followed by adjustable phase shifter/matching network 2410 and antenna 2412. In various embodiments, adjustable phase shifter/matching networks 2406 and 2410 transform the stop band impedance of its respective tunable bandpass filter to an impedance that approximates an open circuit at an active frequency of the adjacent RF signal path as is described below.

Figure 24B:
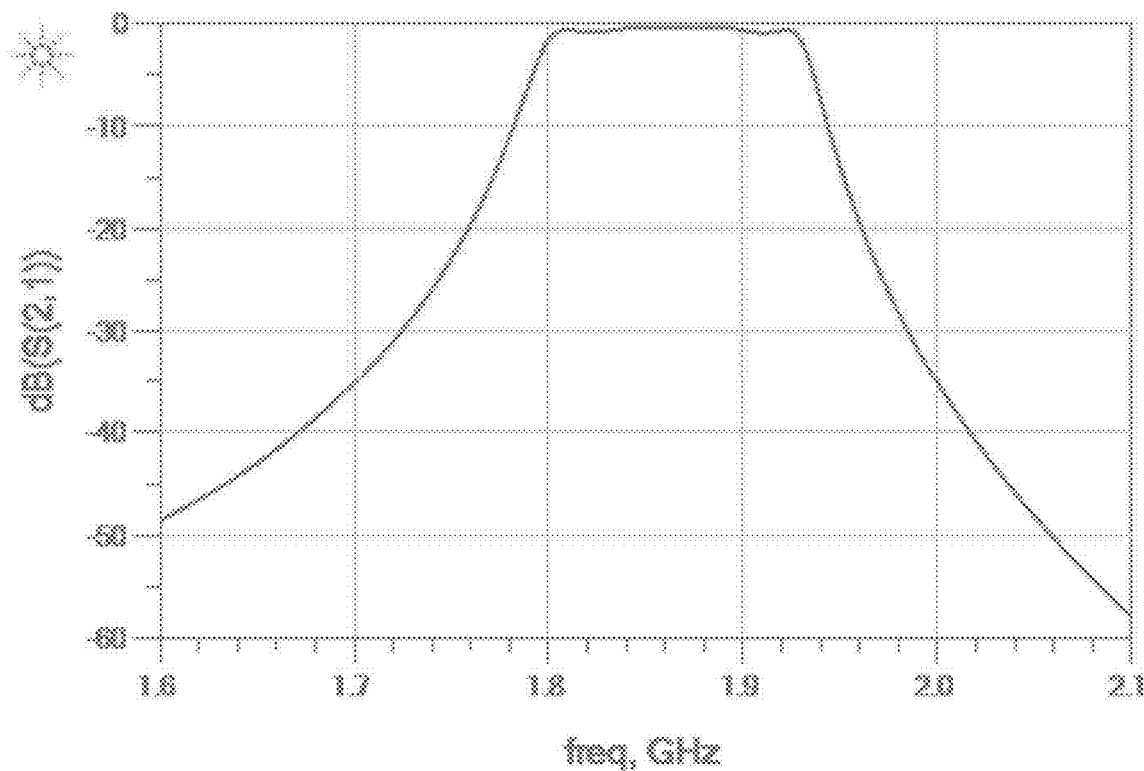
FIGS. 24B-D illustrate graphs showing the selectivity and return loss of the RF system of FIG. 24A.

FIG. 24B illustrates a graph of the insertion loss of tunable bandpass filter 2404 in the receive path of RF system 2400 depicted in FIG. 24A. As shown, tunable bandpass filter 2404 has a passband of between about 1.80 GHz and about 1.94 GHz, which corresponds to a receive band.

Figure 24C:
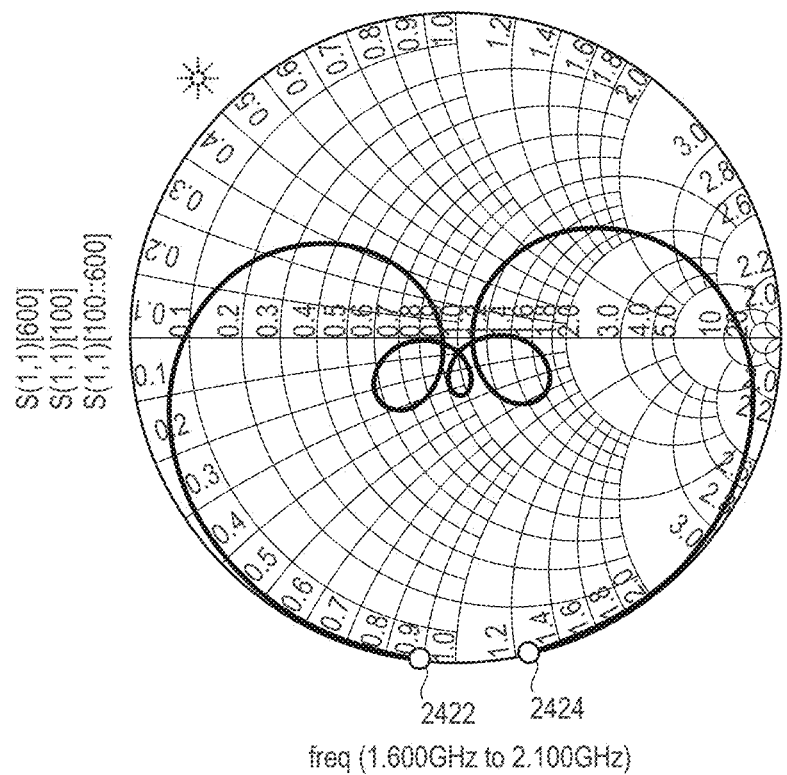
Figure 24D:
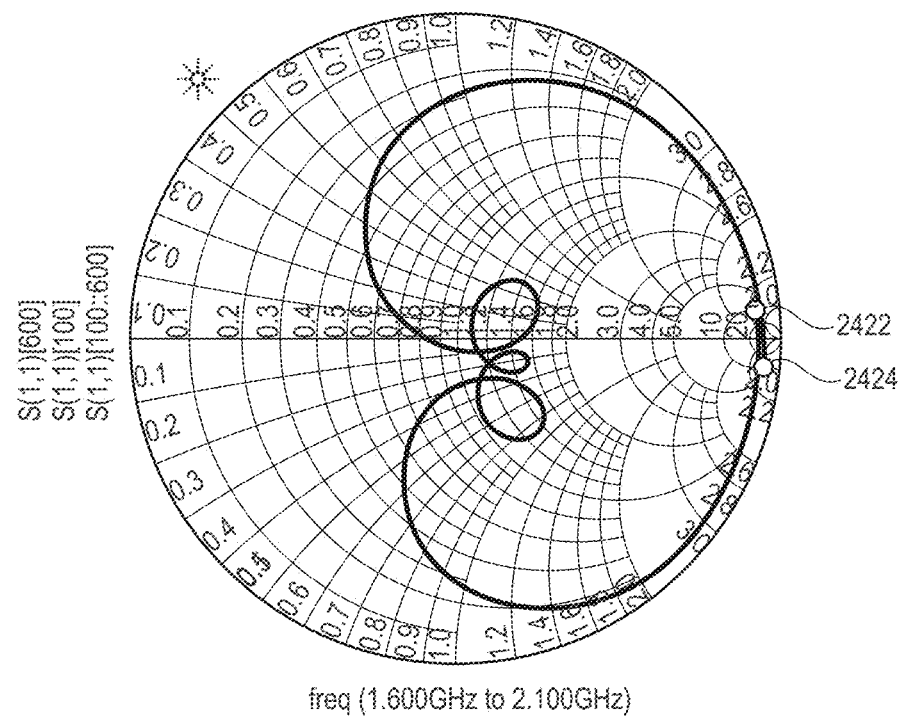

In one embodiment, the transmit path is configured to provide a transmitted signal at about 2.10 GHz that corresponds to the stop band of tunable bandpass filter 2404 in the receive path, tunable bandpass filter 2404 in the transmit path is configured to have a center frequency of about 2.10 GHz, and adjustable phase shifter/matching network 2410 is configured to rotate the input impedance of tunable transmit filter 2408 to an impedance approximating an open circuit at the 2.10 GHz transmit frequency as is illustrated in the Smith charts shown in FIGS. 24C and 24D.

The Smith chart of FIG. 24C illustrates the input impedance (s11) of tunable bandpass filter 2404 between 1.60 GHz at point 2422 and 2.10 GHz at point 2424. As shown, the input impedance of at 2.10 GHz at point 2424 is capacitive. The Smith chart of FIG. 24D illustrates the input impedance (s11) of tunable bandpass filter 2404 coupled in series with adjustable phase shifter/matching network 2410 between 1.60 GHz at point 2422 and 2.10 GHz at point 2424. As shown, adjustable phase shifter/matching network 2410 transforms the input impedance of at 2.10 GHz at point 2424 from being capacitive to approximating an open circuit. Thus, tunable bandpass filter 2404 in the receive path can be configured not to load the transmit channel at the transmit frequency of 2.10 GHz. It should be appreciated that the performance graphs shown in FIGS. 24B-D represent the performance of just one example embodiment, and different embodiments may perform differently.

Figure 25:
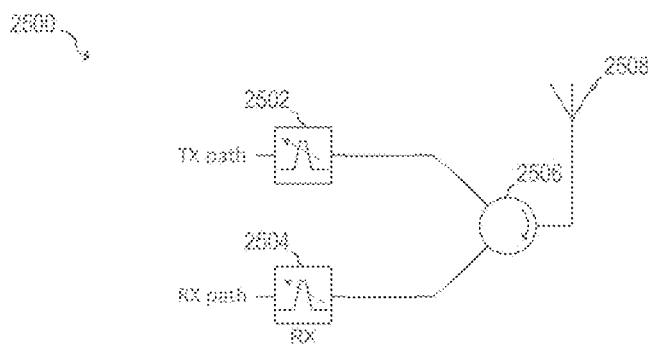
FIG. 25 illustrates an embodiment RF system utilizing tunable bandpass filters and a circulator.

FIG. 25 illustrates an RF system 2400 that corresponds to transmit/receive path/combining structure C using filter configuration II ($C_{II}$). As shown, the transmit path (TX path) includes a tunable bandpass filter 2502 followed by three-port circulator 2506 and antenna 2508. Similarly, the receive path (RX path) includes a tunable bandpass filter 2504 followed by three-port circulator 25o6 and antenna 2508.

Figure 26A:
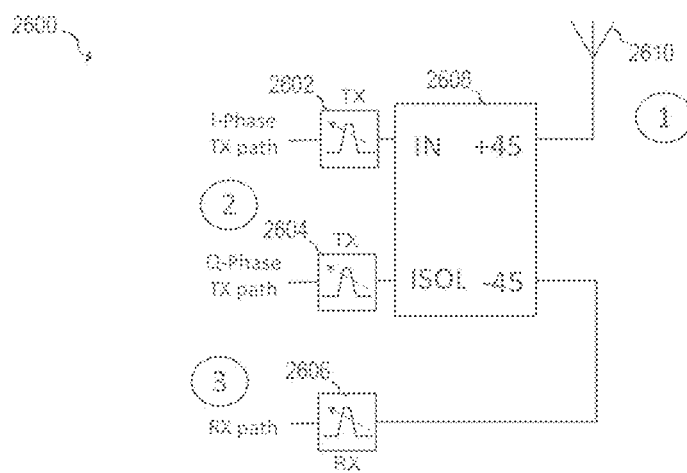
FIG. 26A illustrates an embodiment RF system utilizing tunable bandpass filters and a quadrature combiner.

FIG. 26A illustrates an RF system 2500 that corresponds to transmit/receive path/combining structure D using filter configuration II ($D_{II}$). As shown, RF system 2500 includes an in-phase transmit path (I-Phase TX path) including tunable bandpass filter 2602, a quadrature transmit path (Q-Phase TX path) including tunable bandpass filter 2604, and a receive path (RX path) including tunable bandpass filter 2606. Coupling between the antenna 2610 and the receive path, input-phase transmit path and quadrature transmit path is achieved via quadrature combiner 2608. As shown, the in-phase transmit path is coupled to the input port of the quadrature combiner, the quadrature transmit path is coupled to the isolated port of the quadrature combiner, the receive path is coupled to the −45° port of the quadrature combiner and the antenna is coupled to the +45° port of the quadrature combiner. During operation the RF transceiver (not shown) generates an in-phase transmit signal and a quadrature transmit signal at are 90° out of phase with each other, or an in-phase and quadrature signal are generated using a quadrature splitter/combiner circuit.

Figure 26B:
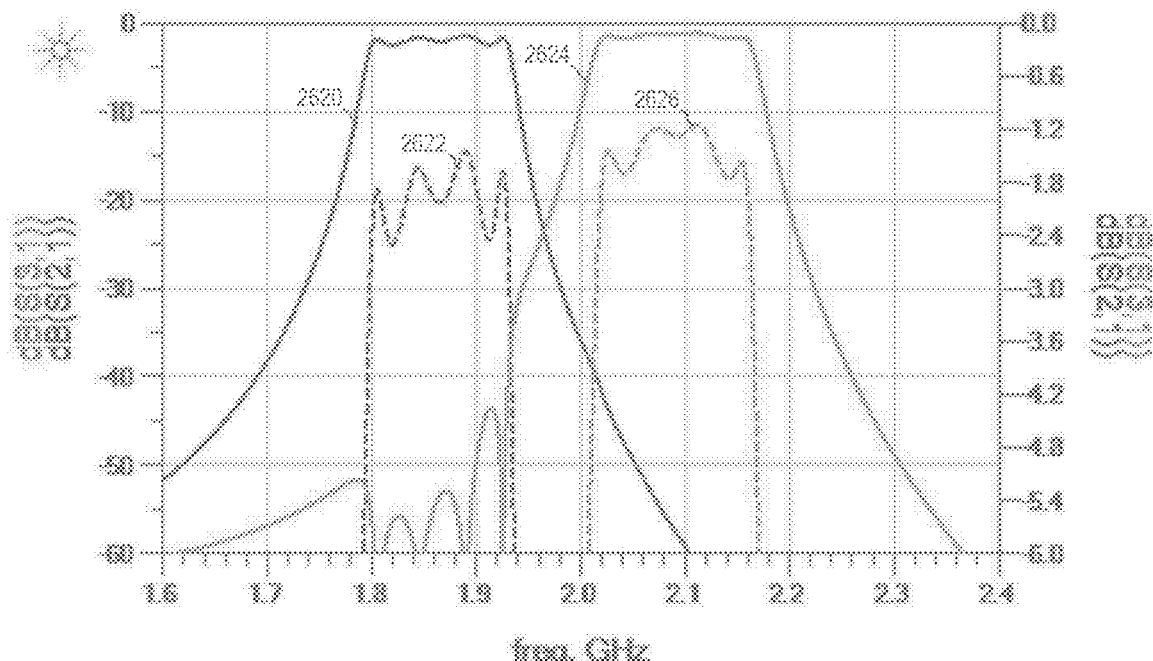
FIG. 26B illustrates graphs showing the selectivity and insertion loss of the RF system of FIG. 26A.

FIG. 26B illustrates a plot of selectivity and insertion loss of between ports 2 and 1, and between ports 3 and 1 of RF system 2600 shown in FIG. 26A. Trace 2620 represents the selectivity between ports 2 and 1 (transmit path); trace 2622 represents the insertion loss between ports 2 and 1 (transmit path); trace 2624 represents the selectivity between ports 3 and 1 (receive path); and trace 2626 represents the insertion loss between ports 3 and 1 (receive path).

As can be seen in FIG. 26B, the receive path whose selectivity is represented by trace 2620 has a passband between about 1.8 GHz and about 1.92 GHz, while the transmit path whose selectivity is represented by trace 2624 has a passband between about 2.2 GHz and about 2.18 GHz. It should be appreciated that the performance graphs shown in FIG. 26D represents the performance of just one example embodiment and different embodiments may perform differently.

Figure 27:
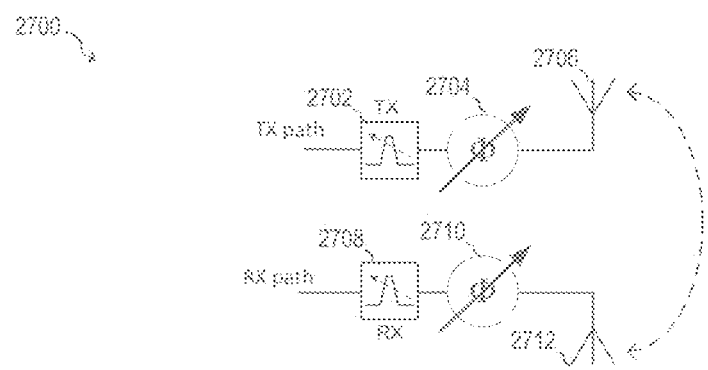
FIG. 27 illustrates an embodiment RF system utilizing tunable bandpass filters, adjustable phase shifters/matching networks; and separate transmit and receive antennas.

FIG. 27 illustrates an RF system 2700 that corresponds to transmit/receive path/combining structure E using filter configuration II ($E_{II}$). As shown, the transmit path (TX path) includes a tunable bandpass filter 2702 followed by adjustable phase shifter/matching network 2704 and transmit antenna 27*o*6. Similarly, the receive path (RX path) includes a tunable bandpass filter 2708 followed by adjustable phase shifter/matching network 2710 and separate receive antenna 2712. In various embodiments, adjustable phase shifter/matching networks 2704 and 2710 transform the stop band impedance of its respective tunable bandpass filter to an impedance that approximates an open circuit at an active frequency of the adjacent RF signal path.

In various embodiments, the tunable band stop filters depicted in FIGS. 17A-C, 18A-D, 19A-C, 20A-B and 21A-B may be implemented using tunable band stop filter structures known in the art or may be implemented using tunable acoustic filter structures disclosed herein. For example, the acoustic filter structures shown in FIGS. 7A-7F, 8A-8E, 9A-9C, and 11A-11C may be used. In some embodiments, these band stop filters may be implemented using continuously tunable circuits. Tunable bandpass filter may be implemented using circuits known in the art, continuously tunable circuits, and/or tunable acoustic filter based bandpass structures illustrated in FIGS. 9A-9C, 10A-10G, 11A-11C, 12A-12E and 13A-13E.

The various adjustable phase shifter/matching network circuits depicted in FIGS. 18A-D and 20A-B may be implemented using adjustable phase shifter/matching network circuits known in the art such phase shifting circuit based on varactors and switched capacitors. The depicted adjustable phase shifter/matching network circuits may also be implemented using tunable bridged T all-pass circuits depicted in FIGS. 7A-7F above.

Example embodiments of the present invention are summarized here. Other embodiments can also be understood from the entirety of the specification and the claims filed herein.

Example 1

A method of operating an RF system includes generating a first RF signal having a first frequency using a first transmitter in a first RF signal path; filtering the generated first RF signal using an RF filter of a first selectable filter bank to form a first filtered transmitted signal; producing a first coupled signal and a first transmitted signal from the first filtered transmitted signal using a directional coupler; transmitting the first transmitted signal; transmitting a second RF signal having a second frequency using a second transmitter in a second RF signal path, where the second RF signal path is coupled to the first RF signal path, and the second frequency is different from the first frequency; bandpass filtering, using a first tunable bandpass filter, the first coupled signal to form a first tunable bandpass filtered signal; and measuring a parameter of the first tunable bandpass filtered signal.

Example 2

The method of example 1, further including adjusting center frequency of the first tunable bandpass filter, where the first coupled signal is within a passband of the first tunable bandpass filter.

Example 3

The method of example 2, where the adjusting the center frequency of the first tunable bandpass filter includes adjusting the center frequency of the first tunable bandpass filter to the first frequency.

Example 4

The method of one of examples 1 to 3, where the first selectable filter bank includes a first RF selection switch having a first port coupled to the first transmitter, a plurality of diplexers/duplexers having first ports coupled to the first RF selection switch, and a second RF selection switch coupled to second ports of the plurality of diplexers/duplexers.

Example 5

The method of one of examples 1 to 4, where: transmitting the first RF signal includes transmitting the first RF signal over a first antenna; and transmitting the second RF signal includes transmitting the first RF signal over a second antenna.

Example 6

The method of one of examples 1 to 5, where measuring the parameter of the first tunable bandpass filtered signal includes measuring at least one of a power, phase, or signal quality of the first tunable bandpass filtered signal.

Example 7

An RF system including: a first RF transceiver circuit including a first RF transmitter configured to produce a first RF signal at a first frequency; a second RF transceiver circuit including a second RF transmitter configured to produce a second RF signal at a second frequency different from the first frequency, a first selectable filter bank having a first port coupled to an output of the first RF transmitter; a directional coupler having a first port coupled to a second port of the first selectable filter bank; a tunable bandpass filter having an input coupled to a coupled port of the directional coupler, where the tunable bandpass filter includes a passband that passes the first frequency and a stopband that rejects the second frequency; and a feedback receiver having an output coupled to an output of the tunable bandpass filter, the feedback receiver being configured to measure a parameter of a signal at the output of the tunable bandpass filter.

Example 8

The RF system of example 7, where the first selectable filter bank includes a first RF selection switch having a first port coupled to the first RF transmitter, a plurality of diplexers/duplexers having first ports coupled to the first RF selection switch, and a second RF selection switch coupled to second ports of the plurality of diplexers/duplexers.

Example 9

The RF system of example 8, further including a plurality of low noise amplifiers (LNAs) having inputs coupled to corresponding third ports of the plurality of diplexers/duplexers and outputs coupled to corresponding receivers of the first RF transceiver circuit.

Example 10

The RF system of one of examples 7 to 9, further including: a first antenna coupled to a second port of the directional coupler; and a second antenna coupled to an output of the second RF transmitter.

Example 11

The RF system of one of examples 7 to 10, where the tunable bandpass filter includes a tunable acoustic filter.

Example 12

The RF system of one of examples 7 to 11, where the tunable bandpass filter includes an order of at least 3.5.

Example 13

The RF system of one of examples 7 to 12, where the tunable bandpass filter includes between five and seven resonators.

Example 14

A method of operating an RF system including: generating a first RF signal having a first frequency using a first transmitter in a first RF signal path; filtering the generated first RF signal using an RF filter of a first selectable filter bank to form a first filtered transmitted signal; producing a first coupled signal and a first transmitted signal from the first filtered transmitted signal using a directional coupler; transmitting the first transmitted signal; transmitting a second RF signal having a second frequency using a second transmitter in a second RF signal path, where the second RF signal path is coupled to the first RF signal path, and the second frequency is different from the first frequency; band stop filtering, using a first tunable band stop filter, the first coupled signal to form a first tunable band stop filtered signal; and measuring a parameter of the first tunable band stop filtered signal.

Example 15

The method of example 14, further including adjusting center frequency of the first tunable band stop filter.

Example 16

The method of example 15, where adjusting the center frequency of the first tunable band stop filter includes adjusting the center frequency of the first tunable band stop filter to the second frequency.

Example 17

The method of example 15, where adjusting the center frequency of the first tunable band stop filter includes adjusting the center frequency of the first tunable band stop filter to a frequency of a distortion product generated by the second transmitter.

Example 18

The method of one of examples 14 to 17, where the first selectable filter bank includes a first RF selection switch having a first port coupled to the first transmitter, a plurality of diplexers having first ports coupled to the first RF selection switch, and a second RF selection switch coupled to second ports of the plurality of diplexers.

Example 19

The method of one of examples 14 to 18, where: transmitting the first RF signal includes transmitting the first RF signal over a first antenna; and transmitting the second RF signal includes transmitting the first RF signal over a second antenna.

Example 20

An RF system including: a first RF transceiver circuit including a first RF transmitter configured to produce a first RF signal at a first frequency; a second RF transceiver circuit including a second RF transmitter configured to produce a second RF signal at a second frequency different from the first frequency; a first selectable filter bank having a first port coupled to an output of the first RF transmitter; a directional coupler having a first port coupled to a second port of the first selectable filter bank; a tunable band stop filter having an input coupled to a coupled port of the directional coupler, where the tunable band stop filter includes a stopband that rejects the second frequency; and a feedback receiver having an output coupled to an output of the tunable band stop filter, the feedback receiver being configured to measure a parameter of a signal at the output of the tunable bandpass filter.

Example 21

The RF system of example 20, where the first selectable filter bank includes a first RF selection switch having a first port coupled to the first RF transmitter, a plurality of diplexers having first ports coupled to the first RF selection switch, and a second RF selection switch coupled to second ports of the plurality of diplexers.

Example 22

The RF system of example 21, further including a plurality of low noise amplifiers (LNAs) having inputs coupled to corresponding third ports of the plurality of diplexers and outputs coupled to corresponding receivers of the first RF transceiver circuit.

Example 23

The RF system of one of examples 20 to 22, further including: a first antenna coupled to a second port of the directional coupler; and a second antenna coupled to an output of the second RF transmitter.

Example 24

The RF system of one of examples 20 to 23, where the tunable band stop filter includes a tunable acoustic filter.

Example 25

The RF system of one of examples 20 to 24, where the tunable band stop filter includes two or three resonators.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of operating an RF system, the method comprising:
    generating a first RF signal having a first frequency using a first transmitter in a first RF signal path;
    filtering the generated first RF signal using an RF filter of a first selectable filter bank to form a first filtered transmitted signal, wherein the first selectable filter bank comprises an adjustable center frequency bandpass filter configured to receive a wideband RF signal, and the adjustable center frequency bandpass filter has an order of three or lower;
    receiving a filtered wideband RF signal via an amplifier having an input coupled to an output of the adjustable center frequency bandpass filter, and a band stop filter having an input coupled to an output of the amplifier;
    producing a first coupled signal and a first transmitted signal from the first filtered transmitted signal using a directional coupler;
    transmitting the first transmitted signal;
    transmitting a second RF signal having a second frequency using a second transmitter in a second RF signal path, wherein the second RF signal path is coupled to the first RF signal path, and the second frequency is different from the first frequency;
    bandpass filtering, using a first tunable bandpass filter, the first coupled signal to form a first tunable bandpass filtered signal, wherein the first tunable bandpass filter comprises a tunable acoustic filter, and the tunable acoustic filter comprises a tunable capacitor coupled to an acoustic resonator; and
    measuring a parameter of the first tunable bandpass filtered signal.

2. The method of claim 1, further comprising adjusting center frequency of the first tunable bandpass filter, wherein the first coupled signal is within a passband of the first tunable bandpass filter.

3. The method of claim 2, wherein the adjusting the center frequency of the first tunable bandpass filter comprises adjusting the center frequency of the first tunable bandpass filter to the first frequency.

4. The method of claim 1, wherein:
    transmitting the first RF signal comprises transmitting the first RF signal over a first antenna; and
    transmitting the second RF signal comprises transmitting the first RF signal over a second antenna.

5. The method of claim 1, wherein measuring the parameter of the first tunable bandpass filtered signal comprises measuring at least one of a power, phase, or signal quality of the first tunable bandpass filtered signal.

6. An RF system comprising:
    a first RF transceiver circuit comprising a first RF transmitter configured to produce a first RF signal at a first frequency;
    a second RF transceiver circuit comprising a second RF transmitter configured to produce a second RF signal at a second frequency different from the first frequency;
    a first selectable filter bank having a first port coupled to an output of the first RF transmitter, wherein the first selectable filter bank comprises an adjustable center frequency bandpass filter configured to receive a wideband RF signal, and the adjustable center frequency bandpass filter has an order of three or lower;
    an amplifier having an input coupled to an output of the adjustable center frequency bandpass filter;
    a band stop filter having an input coupled to an output of the amplifier;
    a directional coupler having a first port coupled to a second port of the first selectable filter bank;
    a tunable bandpass filter having an input coupled to a coupled port of the directional coupler, wherein the tunable bandpass filter comprises a passband that passes the first frequency and a stopband that rejects the second frequency; and
    a feedback receiver having an output coupled to an output of the tunable bandpass filter, the feedback receiver being configured to measure a parameter of a signal at the output of the tunable bandpass filter, wherein the tunable bandpass filter comprises a tunable acoustic filter, and the tunable acoustic filter comprises a tunable capacitors coupled to an acoustic resonator.

7. The RF system of claim 6, further comprising:
    a first antenna coupled to a second port of the directional coupler; and
    a second antenna coupled to an output of the second RF transmitter.

8. The RF system of claim 6, wherein the tunable bandpass filter comprises an order of at least 3.5.

9. The RF system of claim 6, wherein the tunable bandpass filter comprises between five and seven resonators.

10. A method of operating an RF system, the method comprising:
    generating a first RF signal having a first frequency using a first transmitter in a first RF signal path;
    filtering the generated first RF signal using an RF filter of a first selectable filter bank to form a first filtered transmitted signal, wherein the first selectable filter bank comprises an adjustable center frequency bandpass filter configured to receive a wideband RF signal, and the adjustable center frequency bandpass filter has an order of three or lower;
receiving a filtered wideband RF signal via an amplifier having an input coupled to an output of the adjustable center frequency bandpass filter, and a band stop filter having an input coupled to an output of the amplifier;
producing a first coupled signal and a first transmitted signal from the first filtered transmitted signal using a directional coupler;
transmitting the first transmitted signal;
transmitting a second RF signal having a second frequency using a second transmitter in a second RF signal path, wherein the second RF signal path is coupled to the first RF signal path, and the second frequency is different from the first frequency;
band stop filtering, using a first tunable band stop filter, the first coupled signal to form a first tunable band stop filtered signal, wherein the first tunable band stop filter comprises a tunable capacitor coupled to an acoustic resonator; and
measuring a parameter of the first tunable band stop filtered signal.

11. The method of claim 10, further comprising adjusting center frequency of the first tunable band stop filter.

12. The method of claim 11, wherein adjusting the center frequency of the first tunable band stop filter comprises adjusting the center frequency of the first tunable band stop filter to the second frequency.

13. The method of claim 11, wherein adjusting the center frequency of the first tunable band stop filter comprises adjusting the center frequency of the first tunable band stop filter to a frequency of a distortion product generated by the second transmitter.

14. The method of claim 10, wherein the first selectable filter bank comprises a first RF selection switch having a first port coupled to the first transmitter, a plurality of diplexers having first ports coupled to the first RF selection switch, and a second RF selection switch coupled to second ports of the plurality of diplexers.

15. The method of claim 10, wherein:
transmitting the first RF signal comprises transmitting the first RF signal over a first antenna; and
transmitting the second RF signal comprises transmitting the first RF signal over a second antenna.

16. An RF system comprising:
a first RF transceiver circuit comprising a first RF transmitter configured to produce a first RF signal at a first frequency;
a second RF transceiver circuit comprising a second RF transmitter configured to produce a second RF signal at a second frequency different from the first frequency;
a first selectable filter bank having a first port coupled to an output of the first RF transmitter wherein the first selectable filter bank comprises an adjustable center frequency bandpass filter configured to receive a wideband RF signal, and the adjustable center frequency bandpass filter has an order of three or lower;
an amplifier having an input coupled to an output of the adjustable center frequency bandpass filter;
a band stop filter having an input coupled to an output of the amplifier;
a directional coupler having a first port coupled to a second port of the first selectable filter bank;
a tunable band stop filter having an input coupled to a coupled port of the directional coupler, wherein the tunable band stop filter comprises a stopband that rejects the second frequency, wherein the tunable band stop filter comprises a tunable capacitor coupled to an acoustic resonator; and
a feedback receiver having an output coupled to an output of the tunable band stop filter, the feedback receiver being configured to measure a parameter of a signal at the output of the tunable band stop filter.

17. The RF system of claim 16, wherein the first selectable filter bank comprises a first RF selection switch having a first port coupled to the first RF transmitter, a plurality of diplexers having first ports coupled to the first RF selection switch, and a second RF selection switch coupled to second ports of the plurality of diplexers.

18. The RF system of claim 17, further comprising a plurality of low noise amplifiers (LNAs) having inputs coupled to corresponding third ports of the plurality of diplexers and outputs coupled to corresponding receivers of the first RF transceiver circuit.

19. The RF system of claim 16, further comprising:
a first antenna coupled to a second port of the directional coupler; and
a second antenna coupled to an output of the second RF transmitter.

20. The RF system of claim 16, wherein the tunable band stop filter comprises a tunable acoustic filter.

21. The RF system of claim 16, wherein the tunable band stop filter comprises two or three resonators.

22. The method of claim 10, wherein the first tunable band stop filter comprises a tunable acoustic filter.

* * * * *